(12) United States Patent
Makara et al.

(10) Patent No.: US 11,310,401 B2
(45) Date of Patent: Apr. 19, 2022

(54) IMAGE CAPTURE APPARATUS, MODULE, AND CONTROL METHOD THEREOF

(71) Applicant: CANON KABUSHIKI KAISHA, Tokyo (JP)

(72) Inventors: Hironobu Makara, Yokosuka (JP); Tadanori Saito, Tokyo (JP); Kazuaki Maruhashi, Kawasaki (JP); Takamichi Kosugi, Fuchu (JP); Takutomi Ogawa, Tokyo (JP); Tsubasa Nakatani, Tokyo (JP); Naohiro Arai, Kawasaki (JP); Manabu Abe, Tokyo (JP); Takeshi Hamada, Kawasaki (JP); Manami Gunji, Kawasaki (JP); Yuya Nagata, Hachioji (JP); Yuta Nakamura, Tokyo (JP); Hiroshi Yano, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 2 days.

(21) Appl. No.: 16/794,392

(22) Filed: Feb. 19, 2020

(65) Prior Publication Data
US 2020/0288048 A1   Sep. 10, 2020

(30) Foreign Application Priority Data
Mar. 4, 2019   (JP) .............................. JP2019-038763

(51) Int. Cl.
*H04N 5/225* (2006.01)
*H05K 7/20* (2006.01)

(52) U.S. Cl.
CPC ..... *H04N 5/22521* (2018.08); *H05K 7/20209* (2013.01)

(58) Field of Classification Search
None
See application file for complete search history.

(56) References Cited

U.S. PATENT DOCUMENTS

| 10,488,901 | B1* | 11/2019 | Locke ............... H05K 7/20136 |
| 10,809,486 | B2* | 10/2020 | Hosoe ............... H04N 5/22521 |
| 10,951,794 | B2* | 3/2021 | Colin .................. H04N 5/2258 |
| 2010/0165188 | A1* | 7/2010 | Jannard ............... H04N 5/2251 348/375 |
| 2014/0270687 | A1* | 9/2014 | Jannard ................. H04N 5/772 386/224 |
| 2015/0223767 | A1* | 8/2015 | Sehnert .................... A61B 6/06 378/42 |

(Continued)

FOREIGN PATENT DOCUMENTS

| JP | 2010-056995 A | 3/2010 |
| JP | 2012-168446 A | 9/2012 |

*Primary Examiner* — James M Hannett
(74) *Attorney, Agent, or Firm* — Venable LLP

(57) ABSTRACT

An image capture apparatus to which a module having a predetermined function can be attached, the apparatus comprises a connecting unit configured to attach the module, a heat transfer unit configured to exchange heat with the module, a communication unit configured to communicate with the module, and a control unit configured to control a heat dissipation state of a system including the image capture apparatus and the module on the basis of information pertaining to heat dissipation performance of the module and position information pertaining to an attachment position of the module, the information having been acquired by the communication unit.

23 Claims, 35 Drawing Sheets

(56) References Cited

U.S. PATENT DOCUMENTS

2015/0288942 A1* 10/2015 Jannard ................. H04N 5/772
                                                    386/224
2016/0008938 A1*  1/2016 Li ......................... H02K 11/25
                                                    318/565
2016/0295096 A1* 10/2016 Lever ...................... H01Q 1/22

* cited by examiner

F I G. 28
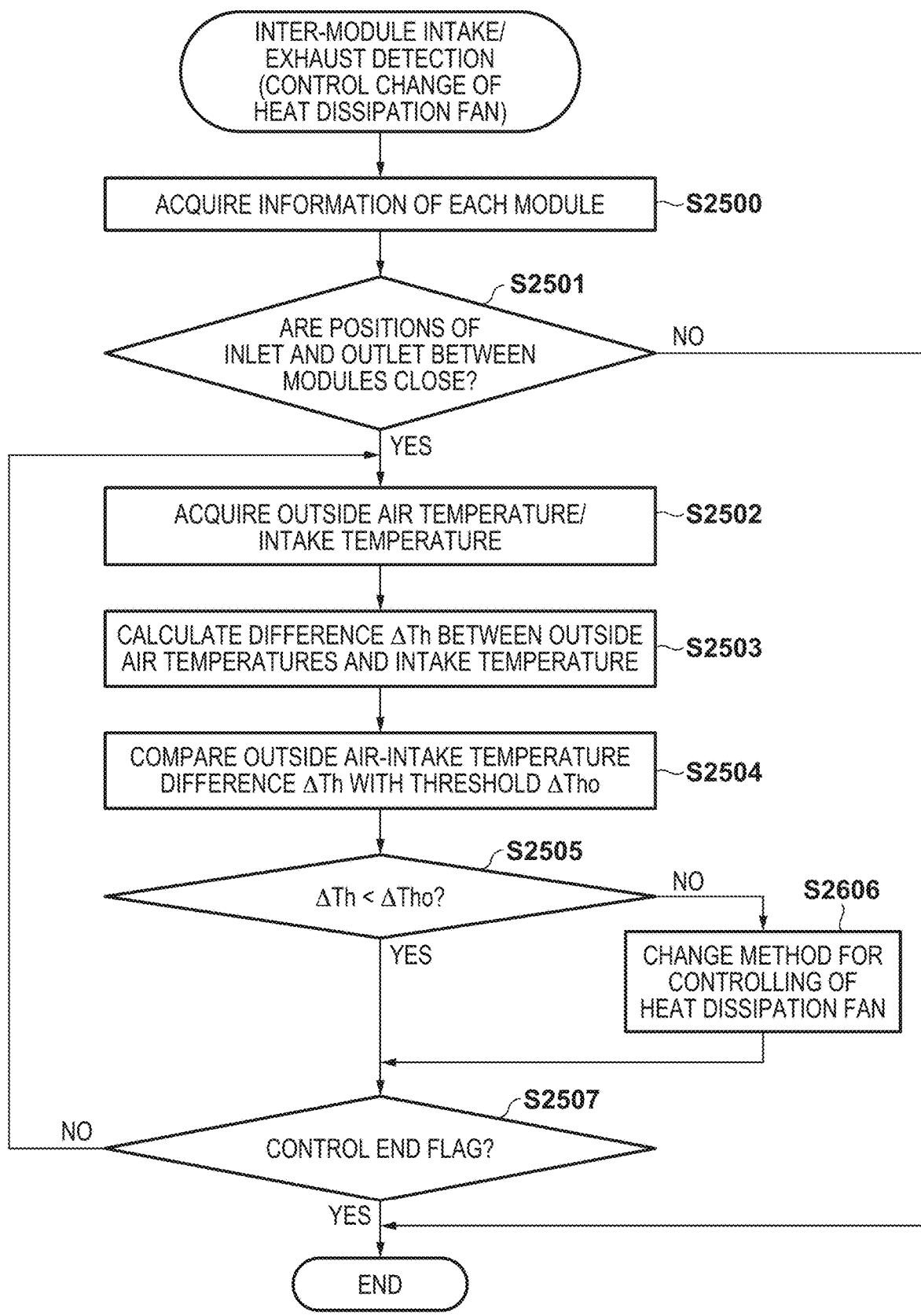

IMAGE CAPTURE APPARATUS, MODULE, AND CONTROL METHOD THEREOF

BACKGROUND OF THE INVENTION

Field of the Invention

The present invention relates to a system in which a module can be connected to an image capture apparatus.

Description of the Related Art

The data rates of images handled by image capture apparatuses such as digital video cameras is increasing dramatically, with the advent of high video resolutions such as 8K, high framerates (HFR) such as 120P and 240P, and compliance with High Dynamic Range (HDR). An increased amount of power is also required for the computational processing, recording, and so on of such data, and heat emission is becoming an issue as power consumption increases.

To respond to the aforementioned issue of heat emission, an image capture apparatus having a built-in heat dissipation structure (e.g., an electric fan, a heat sink, a waste heat duct, or the like) is known. However, as the amount of consumed power increases, the built-in heat dissipation structure requires an increased amount of space to achieve sufficient performance, which makes it difficult to reduce the size of the image capture apparatus. Additionally, a user being able to remove a heat dissipation structure built into an image capture apparatus is typically not taken into consideration.

Accordingly, it has not been possible to remove an unnecessary heat dissipation structure from an image capture apparatus to achieve the optimal state for the conditions even when no special heat dissipation is required, such as when operating in a power saving mode such as one used for low-resolution shooting, when the apparatus is being used in an extremely low-temperature environment, and so on.

Accordingly, Japanese Patent Laid-Open No. 2010-056995 discloses a cooling device for an image sensor which can be removed from a base part of an image capture apparatus. Additionally, Japanese Patent Laid-Open No. 2012-168446 discloses an external device which dissipates heat effectively by being attached to an image capture apparatus and suctioning heated air within the image capture apparatus from an attachment part.

Incidentally, there is a system which makes it possible to connect a desired function module to an image capture apparatus. With such a system, for example, a recorder module which records images, a power source module, a display module which displays images, a module which outputs images to the exterior, and the like can be connected to the camera body to create a system which handles desired image capturing conditions.

In the above-described system, the type, attachment position, and so on of the module varies depending on the use conditions, and thus to optimize the heat dissipation state of the system, it is necessary to take into account the connection position of each module in addition to information pertaining to heat dissipation, such as the amount of heat produced, the heat dissipation capacity, and so on of the camera body and the module.

However, when considering applications in such a system, the aforementioned Japanese Patent Laid-Open No. 2010-056995 and Japanese Patent Laid-Open No. 2012-168446 assume connections between single devices, such as a cooling device or an external device, and do not take into account the relationships of the connection positions between the camera body and the module, between modules, and so on.

SUMMARY OF THE INVENTION

The present invention has been made in consideration of the aforementioned problems, and realizes a system capable of optimizing the heat dissipation state of the system on the basis of information pertaining to the heat dissipation performance of the system and the attachment position of a module.

In order to solve the aforementioned problems, the present invention provides an image capture apparatus to which a module having a predetermined function can be attached, the apparatus comprising: a connecting unit configured to attach the module; a heat transfer unit configured to exchange heat with the module; a communication unit configured to communicate with the module; and a control unit configured to control a heat dissipation state of a system including the image capture apparatus and the module on the basis of information pertaining to heat dissipation performance of the module and position information pertaining to an attachment position of the module, the information having been acquired by the communication unit.

In order to solve the aforementioned problems, the present invention provides a module, having a predetermined function, that can be attached to an image capture apparatus, the module comprising: a connecting unit configured to be attached to the image capture apparatus; a heat transfer unit configured to exchange heat with the image capture apparatus; a communication unit configured to communicate with the image capture apparatus; and a transmitting unit configured to transmit information pertaining to heat dissipation performance of the module and position information pertaining to an attachment position of the module to the image capture apparatus through the communication unit.

In order to solve the aforementioned problems, the present invention provides a method of controlling an image capture apparatus, the apparatus including a connecting unit to which a module having a predetermined function can be attached, a heat transfer unit configured to exchange heat with the module, and a communication unit configured to communicate with the module, the method comprising: controlling a heat dissipation state of a system including the image capture apparatus and the module on the basis of information pertaining to heat dissipation performance of the module and position information pertaining to an attachment position of the module, the information having been acquired by the communication unit.

In order to solve the aforementioned problems, the present invention provides a method of controlling a module, the module having a predetermined function and including a connecting unit that can be attached to an image capture apparatus, a heat transfer unit configured to exchange heat with the image capture apparatus, and a communication unit configured to communicate with the image capture apparatus, the method comprising: transmitting information pertaining to heat dissipation performance of the module and position information pertaining to an attachment position of the module to the image capture apparatus through the communication unit.

In order to solve the aforementioned problems, the present invention provides a non-transitory computer-readable storage medium storing a program that causes a computer to execute a method of controlling an image capture apparatus, the apparatus including a connecting unit to which a module having a predetermined function can be attached, a heat transfer unit configured to exchange heat with the module, and a communication unit configured to communicate with the module, the method comprising: controlling a heat dissipation state of a system including the image capture apparatus and the module on the basis of information pertaining to heat dissipation performance of the module and position information pertaining to an attachment position of the module, the information having been acquired by the communication unit.

In order to solve the aforementioned problems, the present invention provides a non-transitory computer-readable storage medium storing a program that causes a computer to execute a method of controlling a module, the module having a predetermined function and including a connecting unit that can be attached to an image capture apparatus, a heat transfer unit configured to exchange heat with the image capture apparatus, and a communication unit configured to communicate with the image capture apparatus, the method comprising: transmitting information pertaining to heat dissipation performance of the module and position information pertaining to an attachment position of the module to the image capture apparatus through the communication unit.

According to the present invention, the heat dissipation state of a system can be optimized on the basis of information pertaining to the heat dissipation performance of the system and the attachment position of a module.

Further features of the present invention will become apparent from the following description of exemplary embodiments (with reference to the attached drawings).

BRIEF DESCRIPTION OF THE DRAWINGS

FIG. 28 is a flowchart illustrating the inter-module intake/exhaust detection process for the system camera according to the second embodiment.

DESCRIPTION OF THE EMBODIMENTS

Figure 1A:
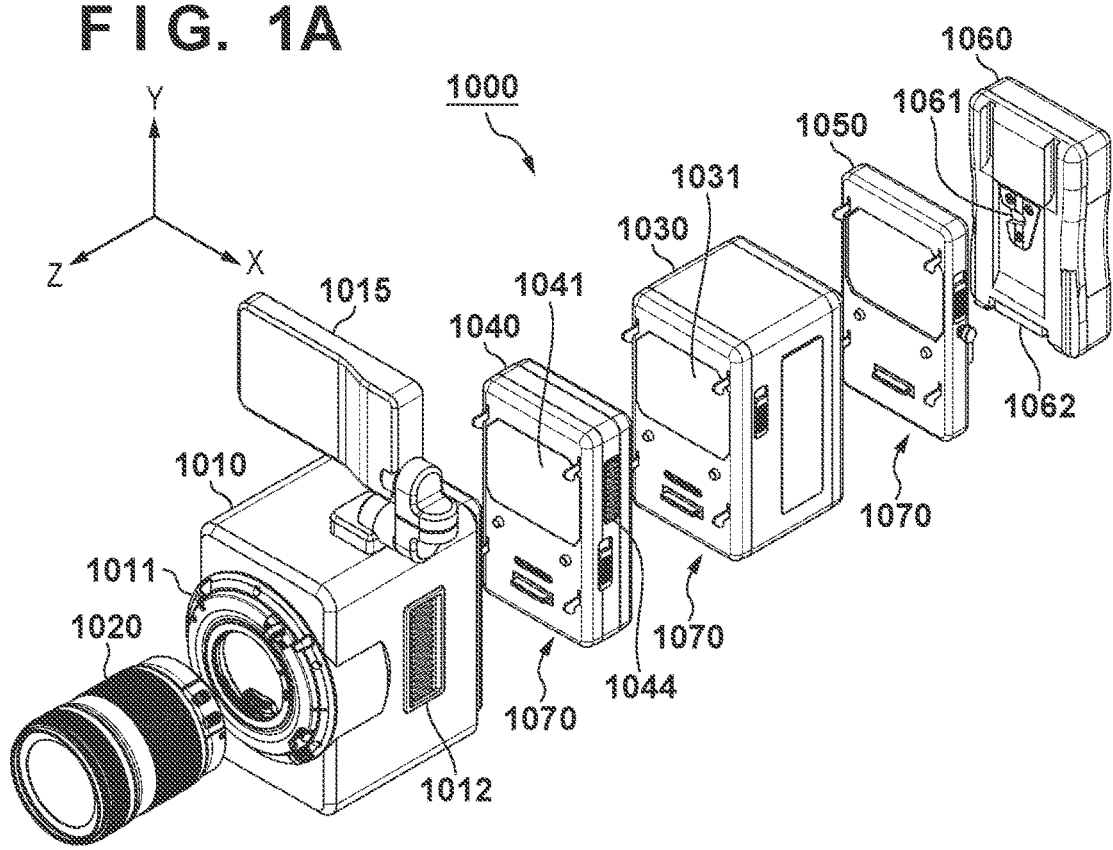
FIG. 1A is an exploded perspective view of a system camera according to a first embodiment, seen from the front (the subject side).

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

A first embodiment will be described hereinafter.
Apparatus Configuration

First, the functions and external appearance of a system camera 1000 according to the first embodiment will be described with reference to FIGS. 1A and 1B.

The present embodiment will describe an example of a system camera to which a function expansion module has been attached to an image capture apparatus capable of shooting still images, moving images, and the like as an example of a system to which a module having a predetermined function is attached to an image capture apparatus. The image capture apparatus may be a digital camera, a digital video camera, a surveillance camera, a medical camera, or the like.

Figure 1B:
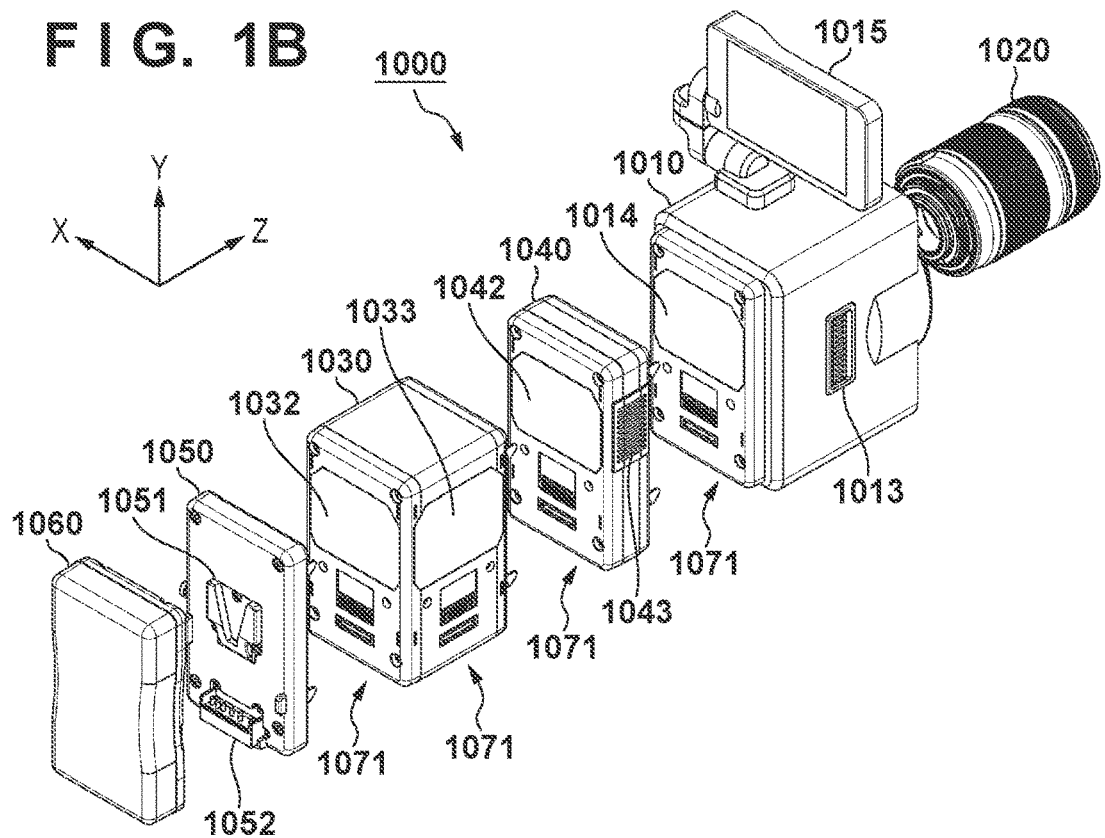
FIG. 1B is an exploded perspective view of the system camera according to the first embodiment, seen from the rear.

FIGS. 1A and 1B are exploded perspective views of the system camera 1000 according to the present embodiment, seen from the front (the subject side) and the rear, respectively.

A three-dimensional coordinate system in the perspective views will be defined hereinafter to simplify the descriptions. In the drawings, the Z axis corresponds to the direction of the optical axis for shooting by the system camera 1000, and the direction of the shot subject is taken as positive (+). In a plane orthogonal to the Z axis, the width direction of the system camera 1000 corresponds to the X axis, the vertical direction corresponds to the Y axis, and in particular, the upward direction on the Y axis is taken as positive. The direction facing the subject from the various modules constituting the system camera 1000 will be called the "front", and the direction opposite therefrom will be called the "rear".

The system camera 1000 according to the present embodiment includes a camera body 1010, a lens unit 1020, a recorder module 1030, a heat dissipation module 1040, a battery holder 1050, and a battery pack (power source module) 1060. Each module can be connected to the camera body 1010 in the Z direction (the front-back direction), and modules can also be connected to each other in the Z direction (the front-back direction), as will be described later.

The camera body 1010 includes a lens mount 1011 on its front for attaching the lens unit 1020, and the lens unit 1020 can be interchanged in accordance with the use conditions, such as the shooting environment. A subject optical image incident through the lens unit 1020 is converted into an electrical signal by a built-in image sensor (not shown) and is subjected to image processing by a signal processing circuit. A recording medium (not shown) is built into the camera body 1010, and image data that has been subjected to the image processing can be stored in a predetermined recording format.

An inlet 1012 and an outlet 1013 for dissipating heat are provided in a side surface of the camera body 1010. As will be described later, a forced cooling device for dissipating heat produced within the camera body 1010 to the exterior is provided, with outside air taken in through the inlet 1012, passed through the forced cooling device, and then exhausted from the outlet 1013. A heat transfer portion 1014 is provided on the rear surface of the camera body 1010. The heat transfer portion 1014 is a thermally-conductive member which transfers heat generated by the camera body 1010 to the module connected to the rear surface thereof.

A common engagement interface (described later) is provided on the rear surface of the camera body 1010. The common engagement interface can connect to another module constituting the system camera 1000. The common engagement interface includes a standardized connection structure for mechanically and electrically connecting modules of the system camera 1000 to each other. The common engagement interface is constituted by a pair of interfaces, namely an engaging-side interface and an engaged-side interface; the engaging side will be called a male interface 1070, and the engaged side will be called a female interface 1071. As their main components, the male side includes a hook portion and the female side includes a slit hole, and terminals for exchanging signals are provided on both the male and female sides. The common engagement interface on the rear surface of the camera body 1010 is the female interface 1071.

A display unit 1015 is provided on the top surface of the camera body 1010. The display unit 1015 is mechanically and electrically connected to the camera body 1010, and is capable of displaying images shot by the camera body 1010, various types of settings and operation menus, and so on.

The recorder module 1030 is a recording device which records image signals shot by the camera body 1010 in a predetermined data format. The recorder module 1030 includes a high-speed signal processing unit and a high-capacity recording medium (not shown), and is used for advanced shooting applications such as 4K and 8K high-resolution images, 120P and 240P (frames per second; fps) high-framerate shooting, and the like. The recorder module 1030 includes the male interface 1070 on its front surface and the female interface 1071 on its rear surface, and the female interface 1071 is also provided on a side surface so that a further module can be added. To transfer heat generated within the recorder module 1030 to other modules, a first heat transfer portion 1031, a second heat transfer portion 1032, and a third heat transfer portion 1033 are provided on the front, rear, and side surfaces of the recorder module 1030, respectively.

The heat dissipation module 1040 is connected in order to improve the heat dissipation capacity when the natural heat dissipation of the system camera 1000 is insufficient, such as when using an operation mode that consumes a large amount of power, when the temperature during shooting is high, and so on. A first heat receiving surface 1041 and a second heat receiving surface 1042 are provided on the front and rear surfaces, respectively, of the heat dissipation module 1040, as members which receive heat from the camera body, other modules, and so on connected to the front and rear surfaces thereof. A forced cooling device for exhausting heat received by the first heat receiving surface 1041 and the second heat receiving surface 1042 to the exterior is provided within the heat dissipation module 1040, as will be described later. An inlet 1043 and an outlet 1044 are provided in side surfaces of the heat dissipation module 1040 for taking outside air into and exhausting air from the forced cooling device. The male interface 1070 and the female interface 1071 are provided on the front and rear surfaces, respectively, of the heat dissipation module 1040.

The battery holder 1050 is an adapter module for engaging the battery pack 1060 with the common engagement interface of the camera body 1010 or the modules 1030 and 1040. The battery holder 1050 includes, on its rear surface, a battery engagement recess 1051 that engages with the battery pack 1060, as well as a power receiving terminal 1052, and includes, on its front surface, the male interface 1070.

The battery pack 1060 is a power source module containing a rechargeable battery cell (not shown). A battery engagement projection 1061 which engages with the battery engagement recess 1051, and a power supply terminal 1062 which connects and supplies power to the power receiving terminal 1052, are provided on the front surface of the battery pack 1060.

Common Engagement Interface

The common engagement interface will be described next.

Figure 2A:
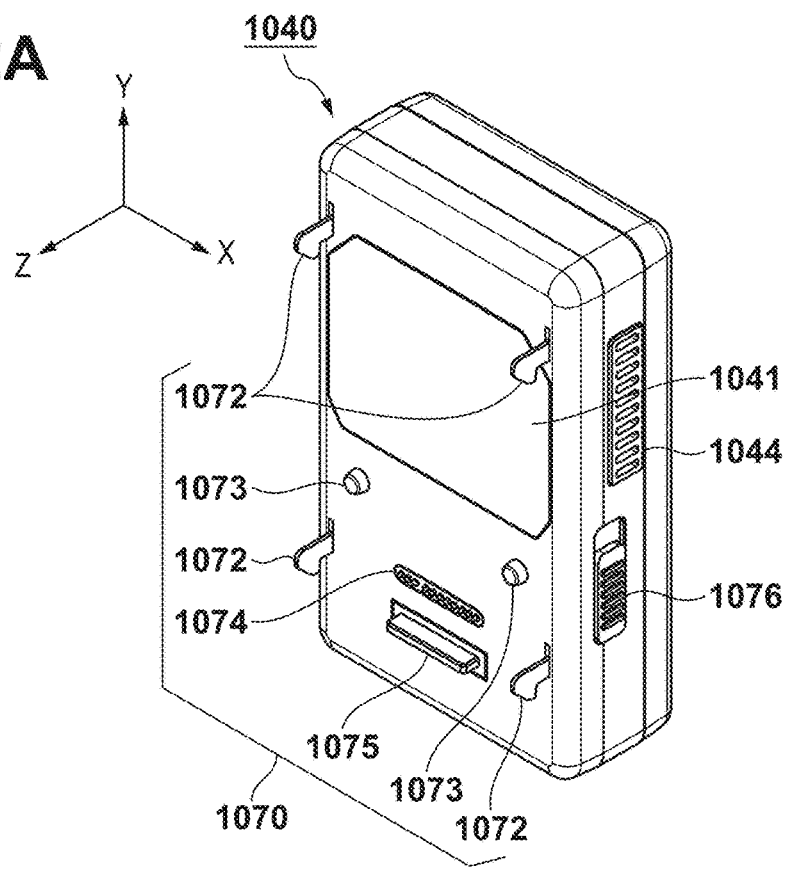
FIG. 2A is a perspective view illustrating a heat dissipation module according to the first embodiment, seen from the front.
Figure 2B:
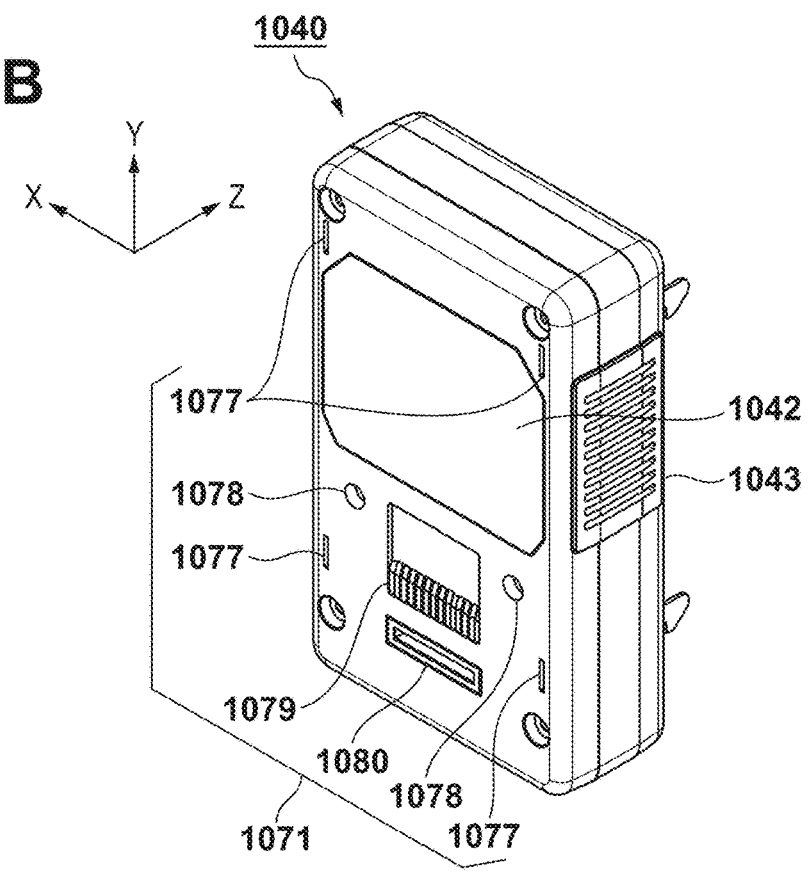
FIG. 2B is a perspective view illustrating a heat dissipation module according to the first embodiment, seen from the rear.

As described earlier, the common engagement interface is provided on the rear surface of the camera body and the front and rear surfaces of each module, and the common engagement interface is capable of transmitting image signals having resolutions of at least 4K, image data having a framerate of 60P or higher, and so on. The following will describe an example of the configuration of the common engagement interface provided in the heat dissipation module 1040 illustrated in FIGS. 2A and 2B. FIGS. 2A and 2B are perspective views of the heat dissipation module 1040, seen from the front and rear, respectively.

The male interface 1070 is provided on the front surface of the heat dissipation module 1040. The male interface 1070 includes hooks 1072 and positioning protrusions 1073, which constitute a mechanical engagement mechanism, as well as a male-side signal terminal 1074 and a male-side power source terminal 1075, which constitute an electrical connection mechanism.

The hooks 1072 are provided in each of the four corners of the module body, extending in the +Z direction, with engagement claws formed extending in the −Y direction. Furthermore, the hooks 1072 are biased in the −Y direction by biasing means such as springs (not shown), which keeps the hooks 1072 in contact with a predetermined contact part. When an operation knob 1076 on a side surface of the heat dissipation module 1040 is operated, the hooks 1072 can be slid in the positive Y axis direction against the biasing force.

The female interface 1071 is provided on the rear surface of the heat dissipation module 1040. The female interface 1071 includes slit holes 1077 and positioning holes 1078, which constitute a mechanical engaged mechanism, as well as a female-side signal terminal 1079 and a female-side power source terminal 1080, which constitute an electrical connected mechanism. The slit holes 1077 are rectangular holes into which the hooks 1072 are inserted, and engaged surfaces (not shown) with which the engagement claws of the hooks 1072 engage are formed on the insides of the slit holes 1077.

When the male interface 1070 and the female interface 1071 are connected to the camera body or another module, the positioning protrusions 1073 fit into the positioning holes 1078 so that the relative position of the heat dissipation module 1040 is fixed with respect to the X and Y directions. Furthermore, the hooks 1072 engage with the slit holes 1077 in a state where predetermined surfaces make contact between the female interface 1071 and the male interface 1070, which fixes the position in the Z direction.

When the male interface 1070 and the female interface 1071 are connected, electrical contacts in the male-side signal terminal 1074 and the female-side signal terminal 1079 contact each other with a predetermined contact pressure, and are electrically connected so that signals can be transmitted and received or power can be supplied. Likewise, when the male interface 1070 and the female interface 1071 are connected, electrical contacts in the male-side power source terminal 1075 and the female-side power source terminal 1080 contact each other with a predetermined contact pressure, and are electrically connected so that signals can be transmitted and received or power can be supplied. When the operation knob 1076 is operated, the hooks 1072 move in the positive Y axis direction away from the engaged surfaces, and the male interface 1070 and the female interface 1071 can be separated in the Z direction as a result.

Note that the common engagement interface is not limited to the configuration illustrated in FIGS. 2A and 2B, and components may be added or removed on the basis of system requirements. For example, a switch, a sensor, or the like may be added to detect the state of the connection between the male interface 1070 and the female interface 1071. Furthermore, rather than electrical signals, the signals may use another medium, as is the case with optical signals; and such signals can be handled by providing a suitable communication terminal corresponding to the signal medium.

Furthermore, the data signal terminals or power source terminals may be partially omitted. For example, although the battery holder 1050 illustrated in FIG. 1 includes the male interface 1070, the male-side signal terminal 1074 may be omitted. The battery holder 1050 is an adapter for converting the engagement interface for the battery pack 1060 into a common interface, and does not handle data signals; as such, the male-side signal terminal 1074 can be omitted. Furthermore, many variations are possible for the shapes and arrangement of the hooks, the structure for positioning, and the structures and arrangements of the data signal terminals or power source terminals.

System Configuration

The configuration of the system camera 1000 will be described next with reference to FIGS. 3 and 4.

Figure 3:
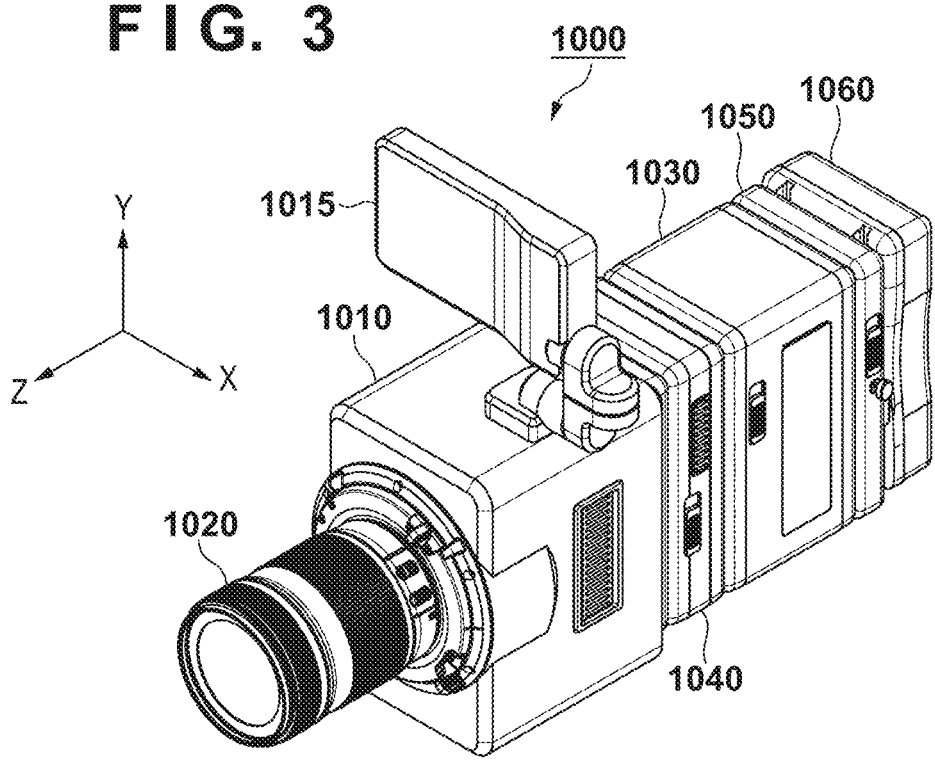
FIG. 3 is a perspective view of the system camera according to the first embodiment, seen from the front.

FIG. 3 is a perspective view of the system camera 1000 of FIG. 1, seen from the front.

The modules constituting the system camera 1000 can be linked in the Z direction as illustrated in FIG. 3. Because the modules can be connected to each other using the common engagement interface, which provides compatibility, the positional relationships between the modules can be switched, modules can be selected, and so on depending on the use conditions, such as the shooting environment and the operation mode.

Although FIG. 3 illustrates an example of a configuration in which image signals shot by the camera body 1010 are recorded in the recorder module 1030, it may be possible, depending on the use conditions, to simply record the image signals in the camera body 1010. In such a case, the recorder module 1030 is unnecessary. As such, the recorder module 1030 can be removed from the system camera 1000 illustrated in FIG. 3 to create a simplified state in which the camera body 1010, the heat dissipation module 1040, and the battery holder 1050 are connected.

There are also cases where the forced cooling device included in the camera body 1010 can dissipate heat sufficiently, such as when the camera body 1010 is shooting at a low resolution and therefore consumes less power. In this case, the heat dissipation capacity of the heat dissipation module 1040 will be excessive for the camera body 1010. Thus moving the heat dissipation module 1040 from the camera body 1010 to the rear surface of the recorder module 1030 makes it possible to apply the heat dissipation capacity of the heat dissipation module 1040 entirely to dissipating heat from the recorder module 1030.

On the other hand, it is also possible to add new modules to the system camera 1000 illustrated in FIG. 3. For example, the system functions can be improved by adding necessary modules as appropriate depending on the use conditions, e.g., when attaching multiple recorder modules 1030 in anticipation of shooting for an extended period of time. Furthermore, other heat dissipation modules 1040 can also be connected to provide the additional modules with better heat dissipation capacity.

As described earlier, the recorder module 1030 includes the female interface 1071 on its side surface, and thus another module can be connected to the side surface even while different modules are connected to the front and rear surfaces. FIG. 4 is a perspective view illustrating a state in which a media module 1150 has been added to the system camera 1000 illustrated in FIG. 3, from the rear.

The media module 1150 is a module that adds extra storage capacity to the recorder module 1030. The recorder module 1030 includes an internal recording medium (not shown), and can record image signals shot by the camera body 1010. Like the other modules, the media module 1150 is provided with the male interface 1070 on one side surface and the female interface 1071 on the opposite side surface. Expanding the capacity by adding the media module 1150 as illustrated in FIG. 4 makes it possible to continue shooting if the storage capacity runs out during shooting. Providing the common engagement interface on the side surface of the module as well in this manner makes it possible to enhance and add functions with ease, without breaking down the integrated system.

A variety of modules aside from those above may be available as modules which can be connected to the common engagement interface. For example, there is an input/output module which converts image signals, control signals, and the like into predetermined transmission formats and outputs or inputs the signals to or from the exterior, a user interface module for enabling user operations, and so on. These modules can also be connected to each other as necessary using the common engagement interface.

Heat Dissipation Path

Heat dissipation paths in the system camera 1000 will be described next with reference to FIG. 5.

Figure 5:
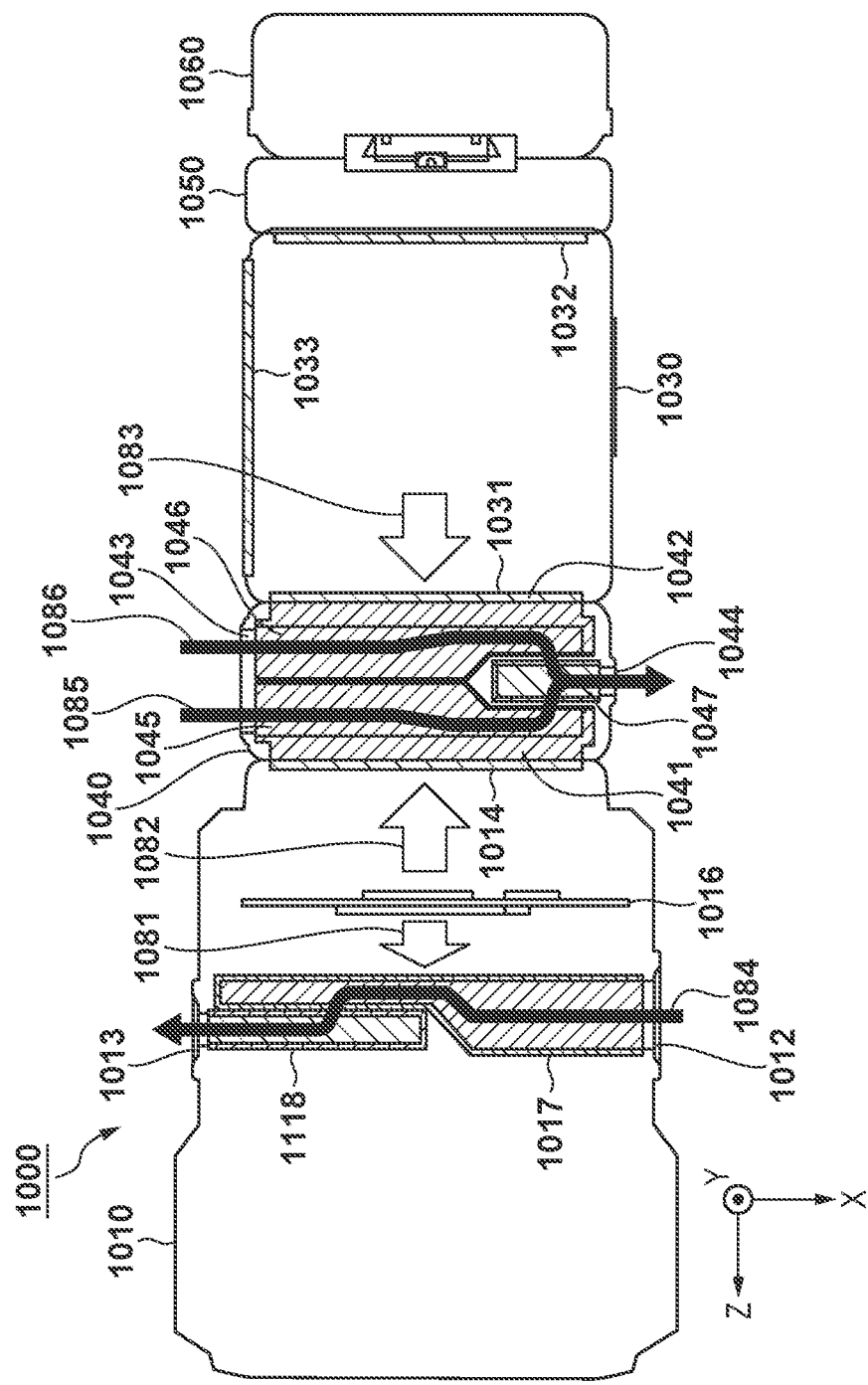
FIG. 5 is an overall cross-sectional view of the system camera according to the first embodiment.

FIG. 5 is an overall cross-sectional view of the system camera 1000 illustrated in FIG. 3. FIG. 5 illustrates a cross-section obtained by sectioning the system camera 1000 along a horizontal plane passing through the shooting optical axis, as seen from the +Y direction, and omits the lens unit 1020.

First, the heat dissipation paths of the camera body 1010 will be described.

A signal processing circuit 1016 is provided within the camera body 1010, and heat generated by the signal processing circuit 1016 is transmitted in the front-back direction of the camera body 1010 through a first heat dissipation path 1081 and a second heat dissipation path 1082.

The heat transmitted by the first heat dissipation path 1081 is diffused to a duct 1017. A heat dissipation fan 1118 is connected next to the duct 1017, and suctions the air from within the duct 1017. When the heat dissipation fan 1118 operates, outside air flows, as an airflow 1084, into the duct 1017 from the inlet 1012 provided in the side surface of the camera body 1010. Fins provided on inner walls of the duct 1017 transfer the heat diffused into the duct 1017 to the airflow 1084. The heated airflow 1084 passes through the heat dissipation fan 1118 and is exhausted to the exterior from the outlet 1013.

The heat transmitted from the second heat dissipation path 1082 is diffused through the heat transfer portion 1014, and is transmitted to the first heat receiving surface 1041 of the heat dissipation module 1040 connected to the rear surface of the camera body 1010. The first heat receiving surface 1041 is formed integrally with a duct 1045 within the heat dissipation module 1040, and the heat transmitted to the first heat receiving surface 1041 is diffused in the duct 1045. The duct 1045 is connected to a heat dissipation fan 1047, and when the heat dissipation fan 1047 operates, outside air is taken into the duct 1045 from the inlet 1043 as an airflow 1085. The heat transmitted to the duct 1045 is transmitted to the airflow 1085 by fins provided in an inner wall of the duct 1045, and is then exhausted to the exterior from the outlet 1044 by the heat dissipation fan 1047.

In this manner, heat generated within the camera body 1010 is dissipated by the forced cooling device built into the camera body 1010 and the forced cooling device of the heat dissipation module 1040 connected using the common engagement interface.

A heat dissipation path in the recorder module 1030 will be described next.

Heat generated within the recorder module 1030 is transmitted to the first heat transfer portion 1031 on the front surface of the recorder module 1030 via a heat dissipation path 1083. The heat dissipation module 1040 is connected to the front surface of the recorder module 1030, and thus the heat from the first heat transfer portion 1031 is transmitted to the second heat receiving surface 1042 on the rear of the heat dissipation module 1040. Note that although the second heat transfer portion 1032 and the third heat transfer portion 1033 are provided on the rear and side surfaces, respectively, of the recorder module 1030, no modules having heat dissipation functionality are connected to the rear and side surfaces, and thus no heat dissipation path is formed in those directions.

The second heat receiving surface 1042 is formed integrally with a duct 1046 within the heat dissipation module 1040, and the heat transmitted to the second heat receiving surface 1042 is diffused in the duct 1046. The duct 1046 is connected to the heat dissipation fan 1047, and when the heat dissipation fan 1047 operates, outside air is taken into the duct 1046 from the inlet 1043 as an airflow 1086. The heat is transmitted to the airflow 1086 by fins provided within the duct 1046, and the heated airflow 1086 is exhausted to the exterior from the outlet 1044 through the heat dissipation fan 1047.

Although the recorder module 1030 does not include a heat dissipation device, heat can be dissipated therefrom using the forced cooling device of the heat dissipation module 1040 by using the common engagement interface to connect the heat dissipation module 1040.

Although the present embodiment describes a configuration in which a single heat dissipation module 1040 is provided between the camera body 1010 and the recorder module 1030, the configuration is not limited thereto, and the heat dissipation capacity may be enhanced by connecting a plurality of heat dissipation modules 1040. Furthermore, the position where the heat dissipation module 1040 is connected may, for example, be between the recorder module 1030 and the battery holder 1050, or the heat dissipation module 1040 may be connected to the common engagement interface on the side surface of the recorder module 1030.

Electrical Configuration

The electrical configuration of the system camera 1000 will be described next with reference to FIG. 6.

Figure 4:
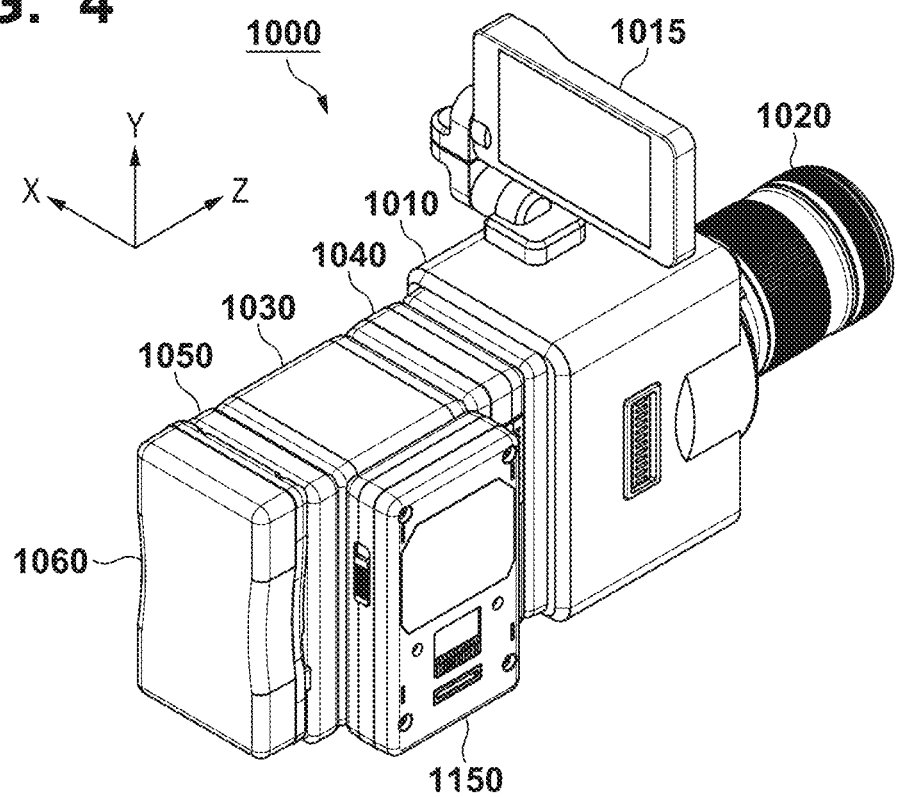
FIG. 4 is a perspective view illustrating a state in which a media module has been added to the system camera of FIG. 3, from the rear.
Figure 6:
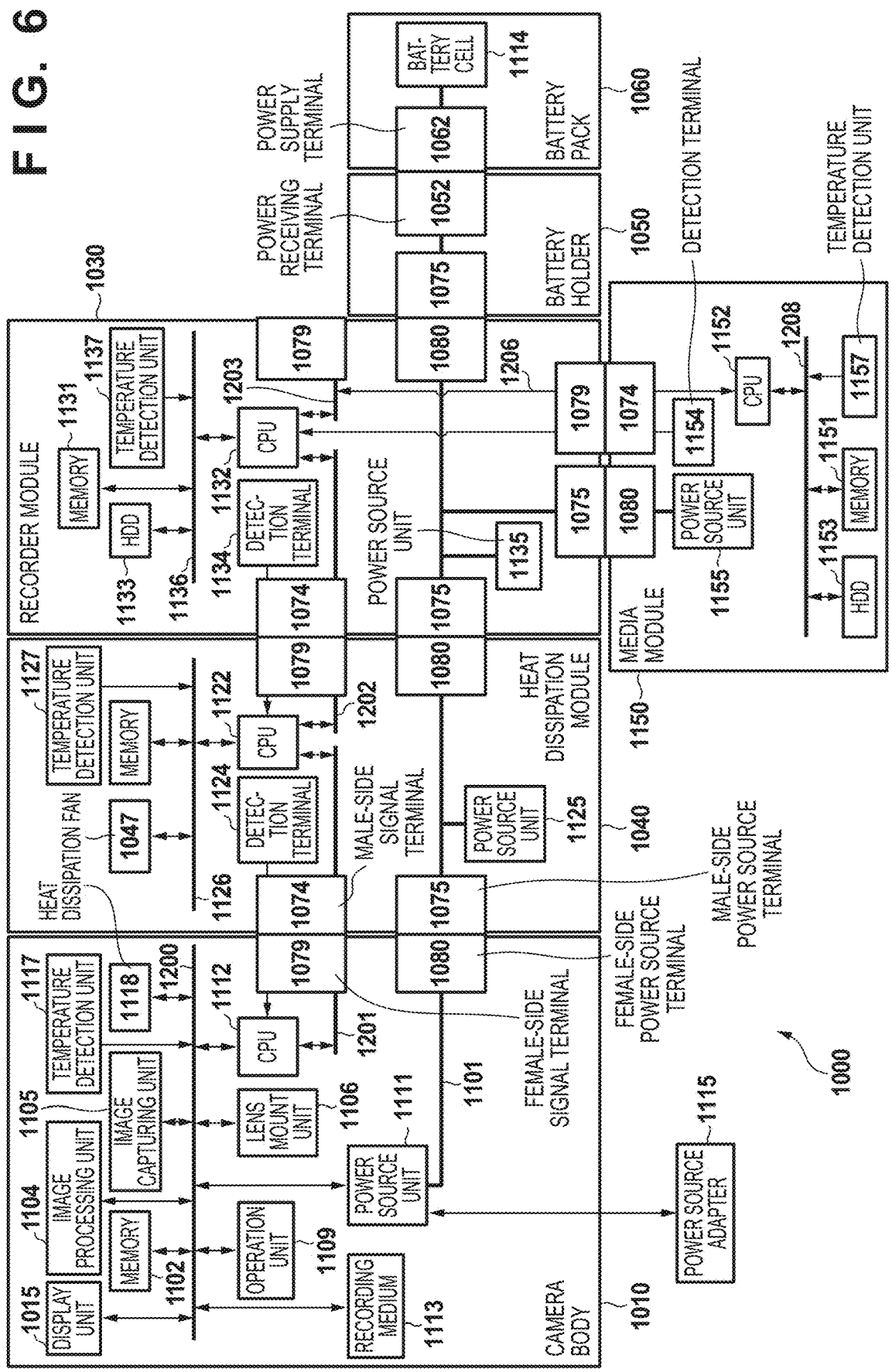
FIG. 6 is a block diagram illustrating the electrical configuration of the system camera according to the first embodiment.

FIG. 6 is a block diagram illustrating the electrical configuration of the system camera 1000 illustrated in FIG. 4.

The electrical configuration of the system camera 1000 will be described below.

In the system camera 1000, memory 1102, an image processing unit 1104, an image capturing unit 1105, a lens mount unit 1106, the display unit 1015, an operation unit 1109, a power source unit 1111, a CPU 1112, a recording medium 1113, a temperature detection unit 1117, and the heat dissipation fan 1118 are connected to an internal bus 1200.

The various units connected to the internal bus 1200 are capable of exchanging data with one another via the internal bus 1200.

The CPU 1112 is built into the camera body 1010 and exchanges information mainly with other modules.

The memory 1102 includes, for example, RAM (volatile memory) and ROM (non-volatile memory), and stores image data and audio data, other data, various types of programs used by the CPU 1112 to operate, and so on.

The CPU 1112 controls the various units of the camera body 1010 in accordance with the programs stored in the memory 1102, for example.

The CPU 1112 and the memory 1102 are provided in the camera body 1010, but the other modules are also provided with a CPU and memory. The recorder module 1030 is provided with a CPU 1132 and memory 1131, the heat dissipation module 1040 is provided with a CPU 1122 and memory 1121, and the media module 1150 is provided with a CPU 1152 and memory 1151.

The CPUs 1122, 1132, and 1152 of the modules 1030, 1040, and 1050 have the same type of computation processing function as the CPU 1112 of the camera body 1010. The memory 1121, 1131, and 1151 of the modules 1030, 1040, and 1050 have the same type of storage capacity as the memory 1102 of the camera body 1010. Information stored in the memory 1121, 1131, and 1151 of the modules 1030, 1040, and 1050 includes various types of data, tables, programs, and the like necessary for the system camera 1000 to control the heat dissipation state.

When each of the modules 1030, 1040, and 1050 is connected to the camera body 1010, the internal buses thereof are electrically connected to each other via the male-side signal terminal 1074 and the female-side signal terminal 1079. The CPU 1112 is capable of exchanging information with the CPUs 1122, 1132, and 1152 of the modules 1030, 1040, and 1050, and in addition to image signals, can exchange information pertaining to the heat dissipation performance (capability) of the system camera 1000 (heat dissipation capacity information), information pertaining to the positions where the modules are attached (connection position information), and so on.

In the present embodiment, the camera body 1010 is capable of exchanging information between the CPU 1112 and the CPU 1122 of the heat dissipation module 1040 via an internal bus 1201. Likewise, the camera body 1010 is capable of exchanging information between the CPU 1122 and the CPU 1132 of the recorder module 1030 via an internal bus 1202 of the heat dissipation module 1040. The CPU 1132 of the recorder module 1030 has a branching bus 1206 that branches an internal bus 1203, and when a module has been added as a branch, the CPU 1132 can exchange information with the CPU of the added module.

A detection terminal 1124 notifies the camera body 1010 that the heat dissipation module 1040 has been connected. By communicating a digital value or an analog value to the CPU 1112 via the male-side signal terminal 1074 and the female-side signal terminal 1079, the detection terminal 1124 can detect that another module has been added to the camera body 1010. The digital value or analog value communicated by the detection terminal 1124 is assumed to be variable depending on the type of the module, and these are stored in association with each other in memory in advance.

A detection terminal 1134 has the same type of functionality as the detection terminal 1124. In the present embodiment, the heat dissipation module 1040 can detect the recorder module 1030 by the CPU 1122 detecting the detection terminal 1134.

Here, a method for acquiring the heat dissipation capacity information, connection position information, and so on of the system camera 1000, the modules, and the like will be described. Although the following will describe a method in which the camera body 1010 acquires the type of each connected module and the connection position information thereof as an example of a method in which the system camera 1000 acquires information, the method is not limited thereto.

As a first detection method, when the heat dissipation module 1040 is connected to the camera body 1010, the module being connected is detected by the CPU 1112 receiving a notification from the detection terminal 1124, and communication with the CPU 1122 via the internal bus 1201 is then started. The CPU 1112 then sets itself as "host" and the CPU 1122 as "device" in the internal bus 1201. The CPU 1112 transmits an order ID 1, indicating an order of connection, to the CPU 1122, and the CPU 1122 recognizes and sets the received order ID 1 as the ID of the heat dissipation module 1040 to which the CPU 1122 itself belongs. Then, the CPU 1122 transmits information pertaining to the type of the heat dissipation module 1040 (module information) and the order ID 1 to the CPU 1112, whereupon the CPU 1112 sets and stores the received module information of the heat dissipation module 1040 and the order ID 1 in the memory 1102.

Likewise, when the recorder module 1030 is connected to the heat dissipation module 1040, the module being connected is detected by the CPU 1122 receiving a notification from the detection terminal 1134, and communication with the CPU 1132 via the internal bus 1202 is then started. The CPU 1122 then sets itself as "host" and the CPU 1132 as "device" in the internal bus 1202. Additionally, on the basis of the order ID 1, which is the ID of the heat dissipation module 1040 to which the CPU 1122 itself belongs, the CPU 1122 generates an order ID 2 and transmits the order ID 2 to the CPU 1132. The CPU 1132 recognizes and sets the received order ID 2 as the ID of the recorder module 1030 to which the CPU 1132 itself belongs. Then, the CPU 1132 transmits the module information of the recorder module 1030 and the order ID 2 to the CPU 1122. The CPU 1122 transmits the received module information and order ID 2 of the recorder module 1030 to the CPU 1112, and the CPU 1112 sets and stores the received module information of the recorder module 1030 and the order ID 2 in the memory 1102.

When another module is connected to the recorder module 1030, the additional module information and order ID are stored in the memory 1102 as a set by carrying out the same type of processing.

As described thus far, by referring to the module information and order ID stored in the memory 1102, the CPU 1112 of the camera body 1010 can detect the order in which the modules are connected.

A method for starting up the CPU of each module in the order in which the modules are connected will be described next as a second detection method.

When the heat dissipation module 1040 is connected to the camera body 1010, the module being connected is detected by the CPU 1112 receiving a notification from the detection terminal 1124, and the CPU 1112 cancels a reset of the CPU 1122 of the heat dissipation module 1040 via the internal bus 1201. The CPU 1122 for which the reset has been cancelled transmits its own module information to the CPU 1112. The CPU 1112 stores the information received from the CPU 1122, and the time of the reception, in the memory 1102.

Likewise, when the recorder module 1030 is connected to the heat dissipation module 1040, the module being connected is detected by the CPU 1122 receiving a notification from the detection terminal 1134, and the CPU 1122 cancels a reset of the CPU 1132 of the recorder module 1030 via the internal bus 1202. The CPU 1132 for which the reset has been cancelled transmits its own module information to the CPU 1122. The CPU 1122 transmits the module information received from the CPU 1132, to the CPU 1112. Having received the module information from the CPU 1132, the CPU 1112 stores the received information, and the time of the reception, in the memory 1102.

As described thus far, the order of the received module information, which is received by the CPU 1112 of the camera body 1010 and stored in the memory 1102, corresponds to the order in which the connected modules are connected. As such, the camera body 1010 can detect the order in which the modules are connected.

A method for recognizing the connected modules, using a method aside from the order IDs, will be described next as a third detection method.

A plurality of modules can be connected to the recorder module 1030. When the media module 1150 is connected to the recorder module 1030, the module being connected is detected by the CPU 1132 of the recorder module 1030 receiving a notification from a detection terminal 1154, and communication with the CPU 1152 of the media module 1150 is started via the branching bus 1206. The CPU 1132 then sets itself as "host" and the CPU 1152 as "device" in the branching bus 1206. The CPU 1152 transmits the module information of the media module 1150 to the CPU 1132 of the recorder module 1030, and the CPU 1132 stores an indication that the connected module is the media module 1150 in the memory 1131.

On the basis of the module information stored in the memory 1131, the CPU 1132 of the recorder module 1030 transmits information pertaining to the functionality and power consumption while in a state where the media module 1150 is added, as well as its own order ID 2, to the CPU 1122 of the heat dissipation module 1040 via the internal bus 1202. The CPU 1122 stores, in the memory 1121, an indication that the module with the order ID 2 has been updated to a module in which the functionality and power consumption of the media module 1150 has been added to the recorder module 1030. The CPU 1122 then transmits the updated information pertaining to the module with the order ID 2 to the CPU 1112 of the camera body 1010 via the internal bus 1201. The CPU 1112 stores, in the memory 1102, an indication that the module with the order ID 2 has been updated to a module in which the functionality and power consumption of the media module 1150 has been added to the recorder module 1030.

As described thus far, even if an order ID has been set for another module, a connected module communicating information that its own functionality has been added to the host makes it possible for the camera body 1010 to detect the order in which the modules are connected.

A method through which the CPU 1112 of the camera body 1010 communicates with the CPU of a given module, and a method for detecting the order of connection, will be described next as a fourth detection method.

In the following, the internal bus 1201, the internal bus 1202, and the internal bus 1203 will be collectively referred to as a single internal bus 1201.

When the heat dissipation module 1040 is connected to the camera body 1010, the CPU 1122 transmits a unique ID stored in the memory 1121 to the CPU 1112 via the internal bus 1201. The CPU 1112 can communicate with the CPU 1122 using this unique ID.

An example of a method for detecting the connection order from a midpoint voltage of resistance voltage division will be described next. First, power is supplied from the power source unit 1111 of the camera body 1010 to the connected heat dissipation module 1040 via a power source line 1101. The heat dissipation module 1040 has two resistors, and the two resistors are connected in series. One terminal of one of the resistors is connected to the power supplied from the power source unit 1111, and the other terminal of that resistor is connected to GND. The CPU 1122 and the female-side signal terminal 1079 of the heat dissipation module 1040 are connected to a point between the two resistors. The CPU 1122 reads a voltage between the resistors (an intermediate voltage) as an analog value. The CPU 1122 can detect the connection order by comparing the analog value which has been read with a table stored in the memory 1121.

Likewise, when the recorder module 1030 is connected to the heat dissipation module 1040, the CPU 1132 transmits a unique ID stored in the memory 1131 to the CPU 1122 via the internal bus 1201. The control that follows thereafter is the same as in the method described above.

As described thus far, the CPU 1112 of the camera body 1010 can communicate with the CPU of each module at a desired timing, even when various types of modules are connected.

Although the present embodiment describes a method in which the camera body 1010 detects the type and connection position of each connected module, the method is not limited thereto, and one of the modules may detect the type, connection position, and so on of the camera or other modules.

The blocks of the system camera 1000 will be described in detail next.

The image processing unit 1104 carries out various types of image processing on image data stored in the recording medium 1113, image data shot by the image capturing unit 1105, and so on, under the control of the CPU 1112. The image processing carried out by the image processing unit 1104 includes A/D conversion processing, D/A conversion processing, image data encoding processing, compression processing, decoding processing, enlargement/reduction processing (resizing), noise reduction processing, color conversion processing, and the like. The image processing unit 1104 may be constituted by a dedicated circuit block for carrying out specific image processing. Depending on the type of the image processing, it is also possible for the CPU 1112 to carry out image processing in accordance with a program, rather than using the image processing unit 1104.

The display unit 1015 includes an LCD panel which displays images, graphical user interface (GUI) screens, and the like under the control of the CPU 1112. The CPU 1112 controls the camera body 1010 to generate display control signals in accordance with programs, generate image signals for display in the display unit 1015, and output the signals to the display unit 1015. The display unit 1015 displays images on the basis of the output image signals. Note that the camera body 1010 may include only an interface for outputting image signals for display in the display unit 1015, and the display unit 1015 may be configured as an external monitor (a television or the like).

The operation unit 1109 is an input device for accepting user operations, including a text information input device such as a keyboard, a pointing device such as a mouse or a touch panel, buttons, dials, joysticks, touch sensors, touch pads, and so on. Note that the touch panel is an input device, overlaid flat on the display unit 1015, in which coordinate information based on a touched position is output.

The recording medium 1113 mainly stores data shot by the camera body 1010. Data in the attached recording medium 1113 is read out, and data is written into the recording medium 1113, under the control of the CPU 1112.

The power source unit 1111 is a power source circuit constituted by a comparator, a load switch, and so on, including a power source input terminal to which a power source adapter 1115 can be attached, and supplies power to the camera body 1010.

The power source unit 1111 also A/D converts a voltage from the mounted power source adapter 1115, and notifies the CPU 1112 of that value.

The power source line 1101 supplies power to the connected modules.

The image capturing unit 1105 is an image sensor such as a CCD, a CMOS, or the like. The lens mount unit 1106 is a unit for connecting with the lens unit 1020, which is constituted by a zoom lens, a focus lens, a shutter, an aperture stop, a rangefinding unit, an A/D converter, and the like. The image capturing unit 1105 can capture still images, moving images, and the like, with the captured data being transmitted to the image processing unit 1104, subjected to various types of processing, and then recorded into the recording medium 1113 as a still image file, a moving image file, or the like.

The heat dissipation fan 1118 is a blade for internal cooling, and cools the camera body 1010 and the modules connected thereto. The heat dissipation fan 1047 has the same function.

An HDD (hard disk drive) 1133 is an auxiliary storage device which stores image data, resource information used when generating image data, and so on. The HDD 1153 has the same function.

The blocks connected to an internal bus 1126 are capable of exchanging data with one another via the internal bus 1126. An internal bus 1136 has the same function.

The temperature detection unit 1117 detects the temperature of predetermined elements and components, ambient and internal temperatures, and so on, and notifies the CPU 1112 of the temperatures via the internal bus 1200. Likewise, a temperature detection unit 1127, a temperature detection unit 1137, and a temperature detection unit 1157 detect temperature information in the same manner as the temperature detection unit 1117 via internal buses, and notify the CPUs 1122, 1132, and 1152 thereof.

A power source unit 1125 distributes power, received over the power source line 1101, to the various modules. A power source unit 1135 and a power source unit 1155 have the same function.

The various units connected to the internal bus 1202 are capable of exchanging data with one another via the internal bus 1202. An internal bus 1208 and an internal bus 1203 have the same function as the internal bus 1202.

A battery cell 1114 is built into the battery pack 1060, is capable of storing a charge, and can supply power to the exterior from the power supply terminal 1062. The power receiving terminal 1052 built into the battery holder 1050 can link with the power supply terminal 1062 and supply power to the modules over the connected power source line 1101.

Heat Dissipation State Control

A process through which the camera body 1010 according to the present embodiment controls the heat dissipation module 1040 will be described next with reference to FIGS. 7 to 9.

The system camera 1000 can acquire heat dissipation performance information, connection position information, and so on from the camera body 1010, the modules, and so on. By using the acquired information to control the heat dissipation module 1040, the CPU 1112 of the camera body 1010 can efficiently dissipate heat from the system in which various modules are connected.

The present embodiment will describe a process through which the CPU 1112 of the camera body 1010 calculates and controls an operation target value of the heat dissipation module 1040 on the basis of the acquired information. The following descriptions assume the configuration of the system camera 1000 illustrated in FIGS. 4 and 6. Note that the processing illustrated in FIGS. 7 and 8 is realized by the CPU 1112 of the camera body 1010 and the CPU 1122 of the heat dissipation module 1040 executing programs stored in the memory 1102 and the memory 1121.

Figure 7:
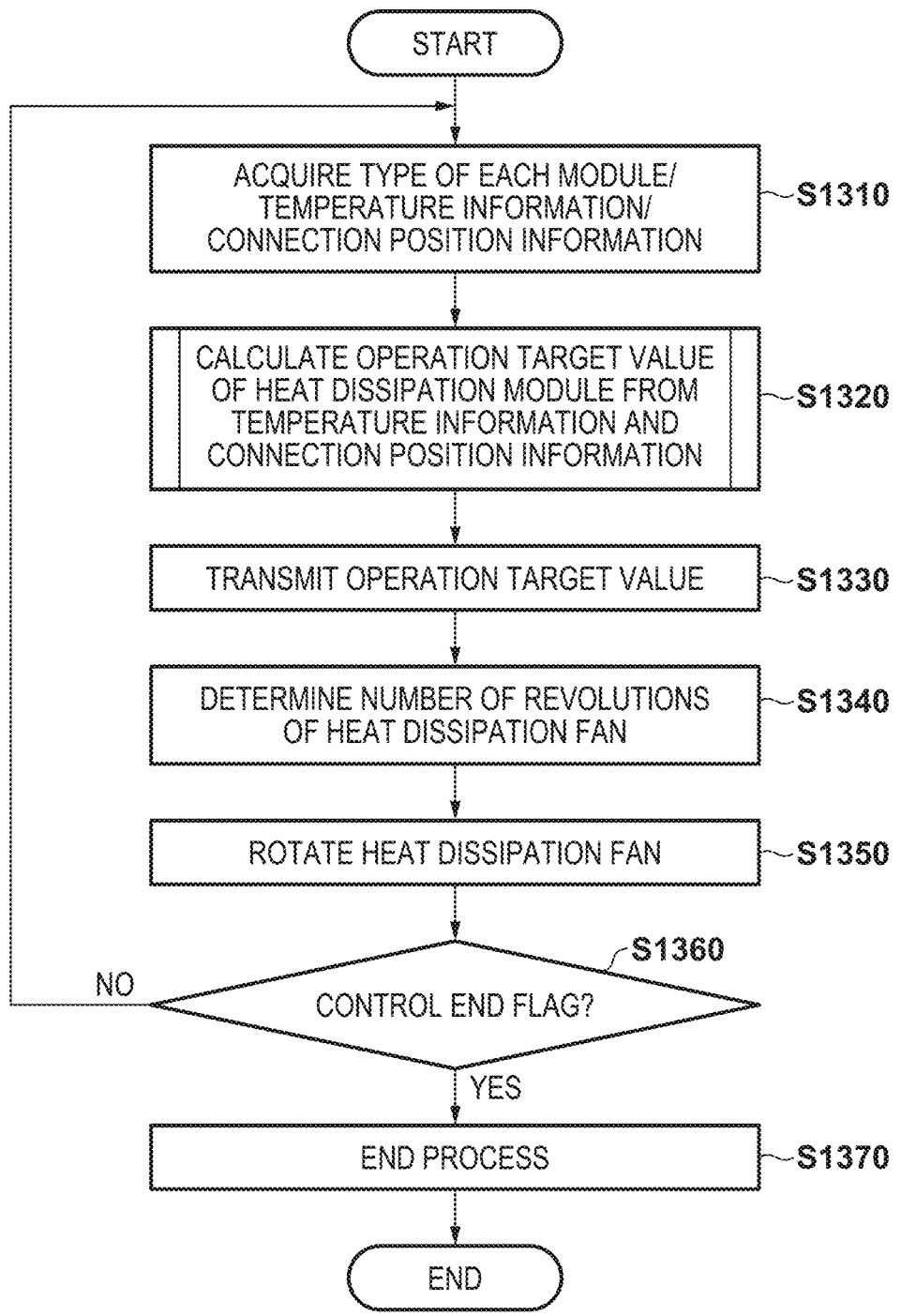
FIG. 7 is a flowchart illustrating a control process of the heat dissipation module according to the first embodiment.

FIG. 7 is a flowchart illustrating a process by which the CPU 1112 of the camera body 1010 controls the heat dissipation module 1040.

In step S1310, the CPU 1112 acquires the type of each connected module, the temperature information, and the connection position information. The module type also includes information pertaining to the heat dissipation performance, an operation guaranteed temperature, and the like.

In step S1320, the CPU 1112 calculates the operation target value of the heat dissipation module 1040 on the basis of the information acquired in step S1310. Here, a method for calculating the operation target value in step S1320 will be described using FIG. 8.

In step S1321, the CPU 1112 calculates a cooling value [W] necessary to cool the heat dissipation module 1040 and the module adjacent to the heat dissipation module 1040. In step S1321, the cooling value of the heat dissipation module 1040 is calculated from the temperature information of the heat dissipation module 1040 and the temperature information of the recorder module 1030.

In step S1322, the CPU 1112 calculates an estimated temperature, indicating to what temperature each module will drop to if the modules are cooled on the basis of the cooling value calculated in step S1321.

Here, consider the connection positions of the modules.

As described earlier, various types of modules can be connected in any desired order in the system camera 1000 by using the common engagement interface. As such, depending on the use conditions and the like, it is also possible that modules lacking heat dissipation devices are connected while adjacent to each other. If modules lacking heat dissipation devices are adjacent to each other, they will exchange heat and generate more heat than expected, and it may therefore not be possible to cool the modules sufficiently with the cooling value obtained as described above. In the present embodiment, the media module 1150 is connected to a side surface of the recorder module 1030, and because neither module includes a heat dissipation device, the modules exchange heat with each other.

To respond to such a situation, in the present embodiment, the cooling value calculated in step S1321 is corrected by predicting a heat transfer amount between the adjacent modules.

In step S1323, the CPU 1112 determines whether or not modules aside from the heat dissipation module are connected while adjacent to each other from the connection position information of the modules; if the modules are adjacent to each other, the process moves to step S1324, and if not, the process moves to step S1325.

In step S1324, the CPU 1112 estimates the heat transfer between the adjacent modules from the state of the estimated temperature, and corrects the estimated temperature. The cooling value is not corrected if modules aside from the heat dissipation module are not connected while adjacent to each other.

In step S1325, on the basis of a result of comparing the operation guaranteed temperature with the estimated temperature for each module, the CPU 1112 sets flag of insufficient heat dissipation, correct heat dissipation or heat dissipation limit in accordance with the heat dissipation state of the module. The insufficient heat dissipation flag is set when the estimated temperature is greater than or equal to the operation guaranteed temperature. When the estimated temperature is lower than the operation guaranteed temperature, the estimated temperature is compared with a predetermined threshold. The predetermined threshold is a value found by first obtaining a difference between the operation guaranteed temperature and a measured temperature through experimentation under worst case conditions for anticipated usage environments, and then providing a certain degree of margin with respect to the operation guaranteed temperature on the basis of the stated difference. As such, as long as the temperature is less than or equal to the operation guaranteed temperature, the module can operate even above that threshold. The correct heat dissipation flag is set when the estimated temperature is lower than the operation guaranteed temperature and the difference between the operation guar- anteed temperature and the estimated temperature is greater than or equal to the threshold. The heat dissipation limit flag is set when the estimated temperature is lower than the operation guaranteed temperature and the difference between the estimated temperature and the operation guaranteed temperature is within the threshold.

In step S1326, the CPU 1112 determines whether or not there is a module for which the insufficient heat dissipation flag is set; if there is such a module, the process moves to step S1327, and if not, the process moves to step S1328.

In step S1327, the CPU 1112 increases the cooling value of the heat dissipation module closest to the module for which the insufficient heat dissipation/heat dissipation limit flag is set to correct that cooling value, and then returns to step S1322. By executing this process, correction is carried out for modules with the heat dissipation limit flag set only if the module also has the insufficient heat dissipation flag set. This correction process is repeated until no more modules have the insufficient heat dissipation flag set, and the cooling value ultimately converged on is then set as the operation target value of the heat dissipation module 1040 (step S1328).

Figure 8:
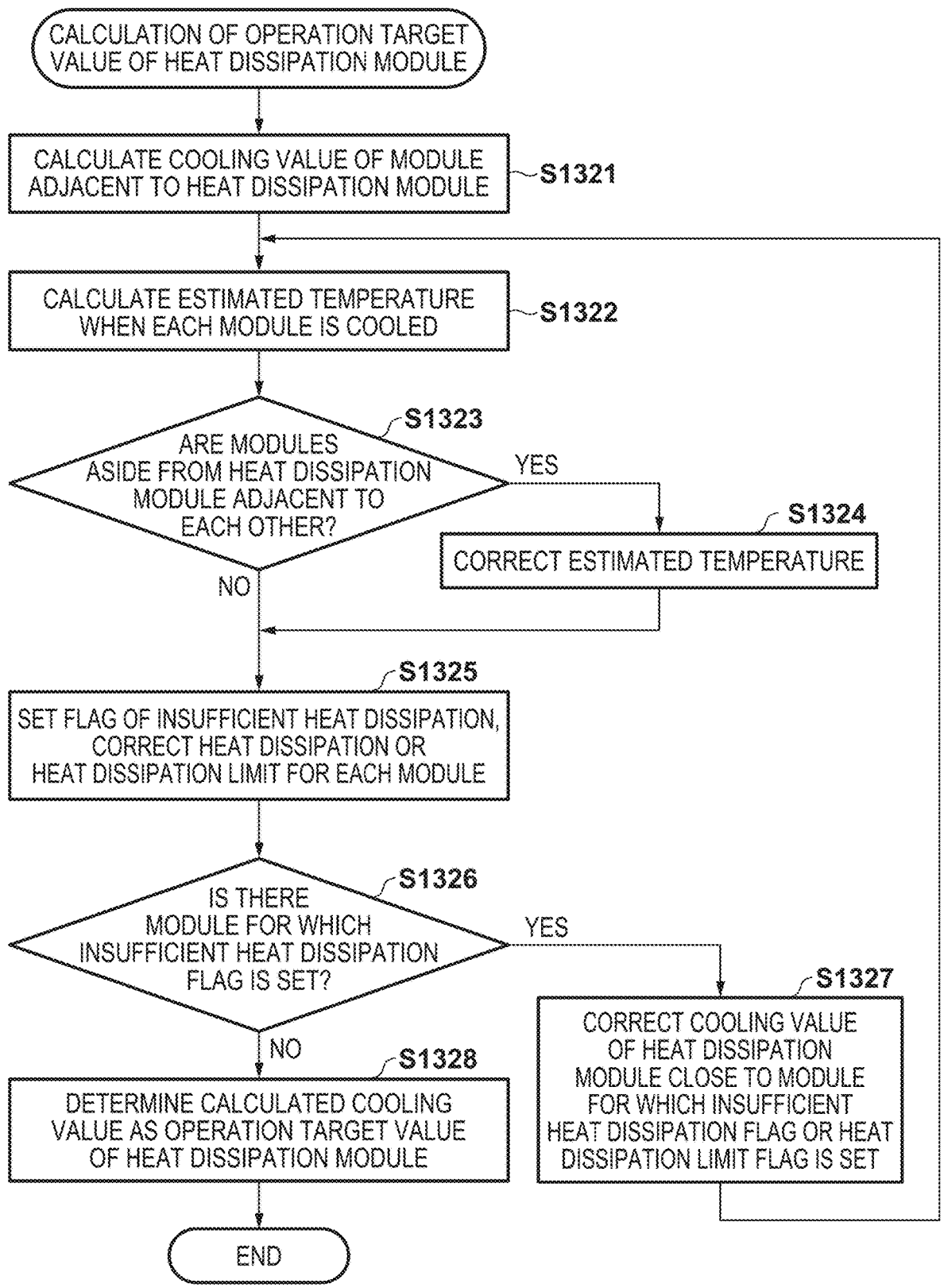
FIG. 8 is a flowchart illustrating a process for calculating an operation target value of the heat dissipation module illustrated in FIG. 7.

After the operation target value of the heat dissipation module 1040 has been set, the subroutine of FIG. 8 ends, and the process returns to the main routine illustrated in FIG. 7 (step S1320).

In step S1330, the CPU 1112 transmits the operation target value of the heat dissipation module 1040 calculated in step S1320 to the CPU 1122 of the heat dissipation module 1040.

In step S1340, the CPU 1122 of the heat dissipation module 1040 determines the number of revolutions of the heat dissipation fan 1047 built into the heat dissipation module 1040 on the basis of the operation target value received in step S1530.

Figure 9:
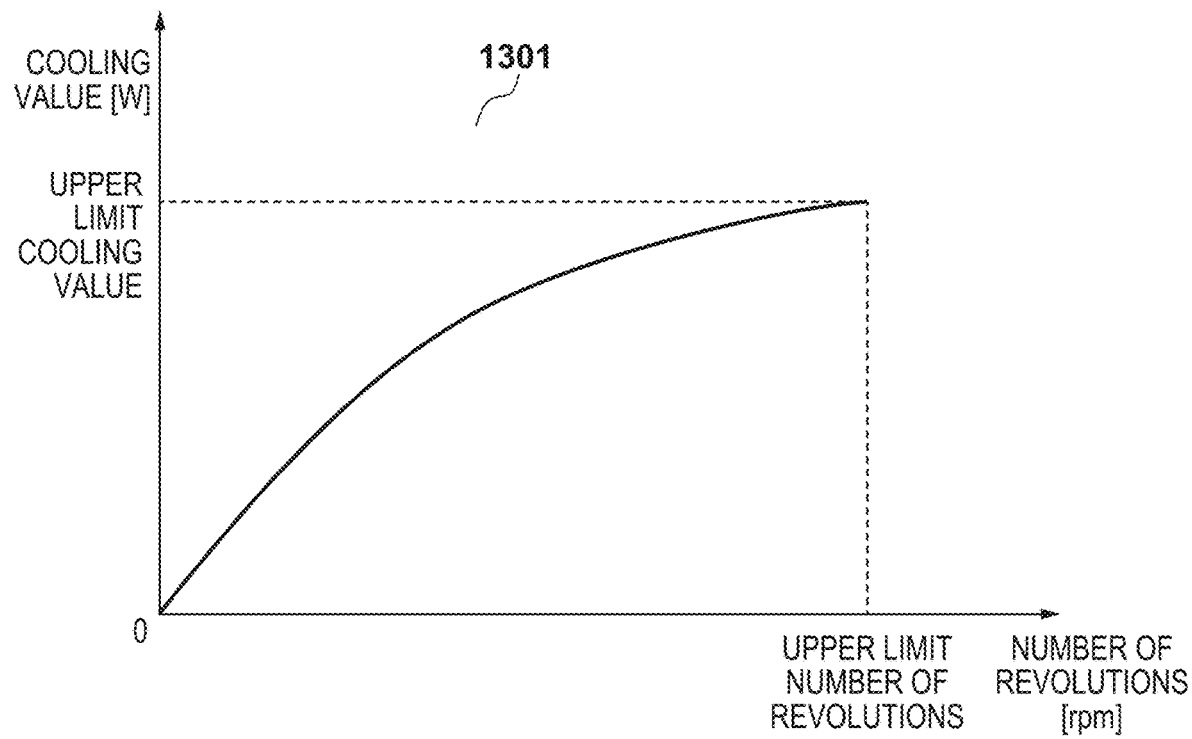
FIG. 9 is a diagram illustrating an operation table for a heat dissipation fan.

As illustrated in FIG. 9, an operation table 1301 for the heat dissipation fan 1047, which takes the horizontal axis as the number of revolutions [rpm] of the heat dissipation fan 1047 and the vertical axis as the cooling value [W], is stored in the memory 1121 of the heat dissipation module 1040.

By referring to the operation table 1301 stored in the memory 1121 and comparing the received operation target value with the vertical axis of the operation table 1301, the CPU 1122 obtains the number of revolutions at which the heat dissipation fan 1047 is to be operated.

In step S1350, the CPU 1122 controls the rotation of the heat dissipation fan 1047 to reach the target number of revolutions determined in step S1340.

The processing from steps S1310 to S1350 is repeated until a control end flag is set for the heat dissipation module 1040 (NO in step S1360), and as a result, the cooling by the heat dissipation module 1040 continues until the modules fall below their operation guaranteed temperatures. It is also possible to control the heat dissipation module 1040 so that the modules fall below the operation guaranteed temperatures even when the connection positions of the modules are changed.

Although not illustrated, interrupt processes such as outputting a control state of the heat dissipation module or changing a control mode can occur during the processing from steps S1310 to S1360 in response to a request from other control.

When the camera body 1010 has been powered off, the control end flag of the heat dissipation module 1040 is set by the CPU 1112.

In step S1360, it is determined whether or not the control end flag of the heat dissipation module 1040 is set; if the flag is set, the process moves to step S1370, where a control end process for the heat dissipation module 1040 is carried out. The heat dissipation module 1040 stops the heat dissipation fan 1047 after operating the fan for a set amount of time at the number of revolutions corresponding to the operation target value which was output last. Once the fan stops rotating, the control of the heat dissipation module 1040 is ended.

Although the present embodiment describes a situation where there is one heat dissipation module 1040, multiple heat dissipation modules may be used depending on the use conditions. In this case, the processing of FIGS. 7 and 8 may be executed for each of the heat dissipation modules.

Heat Dissipation State Display

Next, a method through which the system camera 1000 displays the heat dissipation state of the camera body, the modules, and so on will be described with reference to FIGS. 10 to 12.

Although the system camera 1000 provides a high level of freedom with which the camera can be assembled, various modules are connected depending on the use conditions, and thus there are situations where it is difficult for the user to ascertain the current heat dissipation capacity. Thus in the present embodiment, the temperature information and power consumption information of the camera body and modules constituting the system are displayed in the display unit 1015. The following descriptions assume the configuration of the system camera 1000 illustrated in FIGS. 3 and 6 (with the exception of the media module 1150). Note that the processing illustrated in FIGS. 11 and 12 is realized by the CPU 1112 of the camera body 1010 executing programs stored in the memory 1102.

Figure 10:
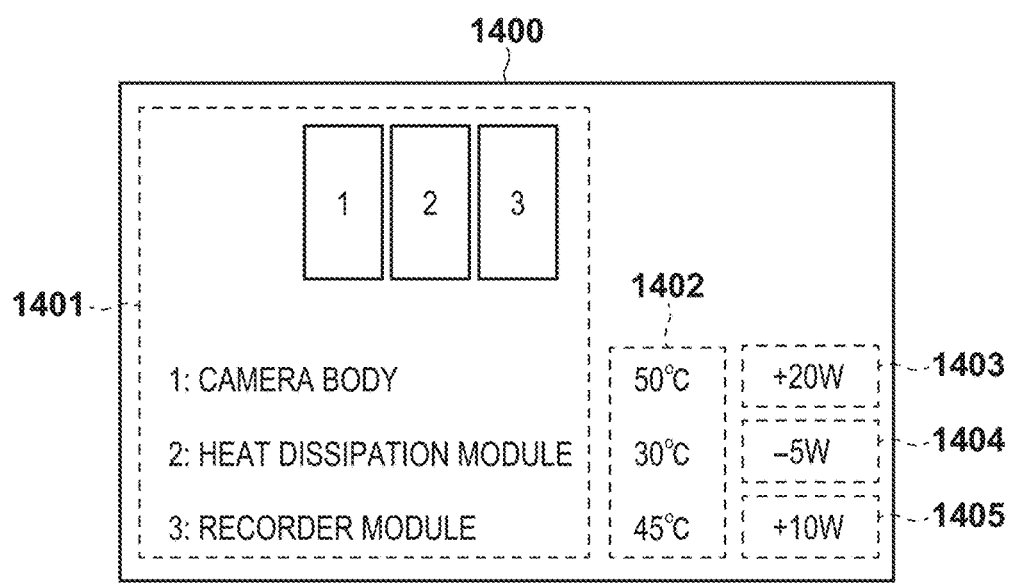
FIG. 10 is a diagram illustrating an example of a GUI of the system camera according to the first embodiment.

FIG. 10 illustrates an example of a GUI 1400 generated from information acquired by the CPU 1112 of the camera body 1010 from the camera body 1010, the heat dissipation module 1040, and the recorder module 1030.

The GUI 1400 includes module type and connection position information 1401 (1 to 3), and temperature information 1402 detected by the temperature detection unit 1117, the temperature detection unit 1127, and the temperature detection unit 1137 (50° C., 30° C., and 45° C.). The GUI 1400 also includes power consumption information 1403 of the camera body 1010 and the modules (+20 W, +10 W) and cooling performance information 1404 of the heat dissipation module 1040 (−5 W).

The user can ascertain the heat dissipation capacity of the system camera 1000, whether or not the modules are attached in a good order, and so on by checking the GUI 1400. For example, in the GUI 1400, the heat dissipation module 1040 is connected next to the camera body 1010, which consumes the most power and which currently has the highest detected temperature, and the user can therefore determine that there is no problem with the connection position. On the other hand, the cooling performance of the heat dissipation module 1040 is poor with respect to the power consumed by the system camera 1000 as a whole, and thus the user can also consider replacing the heat dissipation module 1040 with a higher-output heat dissipation module.

Figure 11:
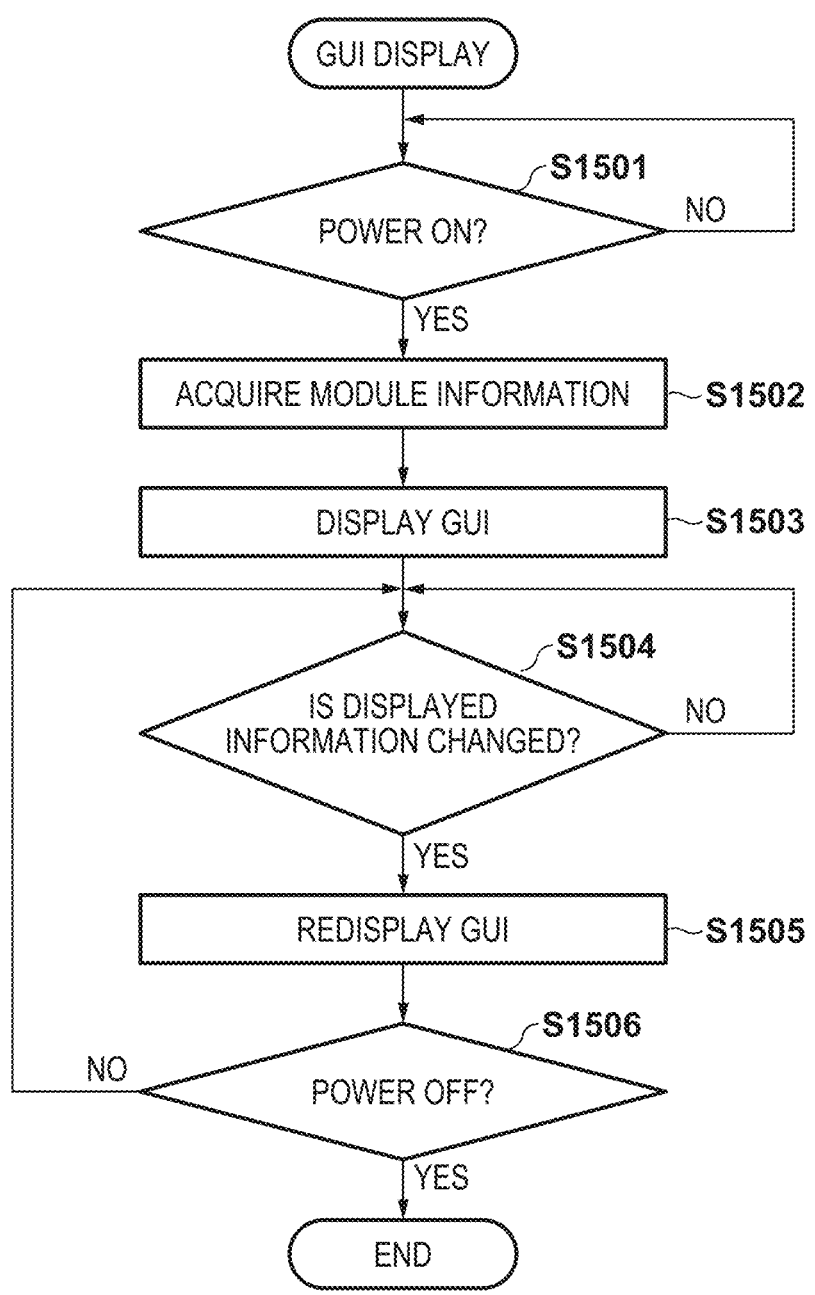
FIG. 11 is a flowchart illustrating a GUI generation/display process for the system camera according to the first embodiment.

FIG. 11 is a flowchart illustrating a process through which the CPU 1112 of the camera body 1010 generates and displays the GUI 1400 in the display unit 1015.

In step S1501, the CPU 1112 stands by until the power is turned on by the user.

In step S1502, once the power is turned on by the user, the CPU 1112 acquires various types of information. The information acquired here is the same as the information in the GUI 1400 illustrated in FIG. 10.

In step S1503, the CPU 1112 configures a GUI screen on the basis of the information acquired in step S1502, and displays that screen.

Then, when the information displayed in step S1503 is changed while the user is shooting using the system camera 1000 (YES in step S1504), the CPU 1112 reconfigures the GUI screen on the basis of the new information (step S1505). Situations in which the information is changed will be described later.

In step S1506, the CPU 1112 repeats the processing from steps S1504 to S1505 until the power is turned off.

Figure 12:
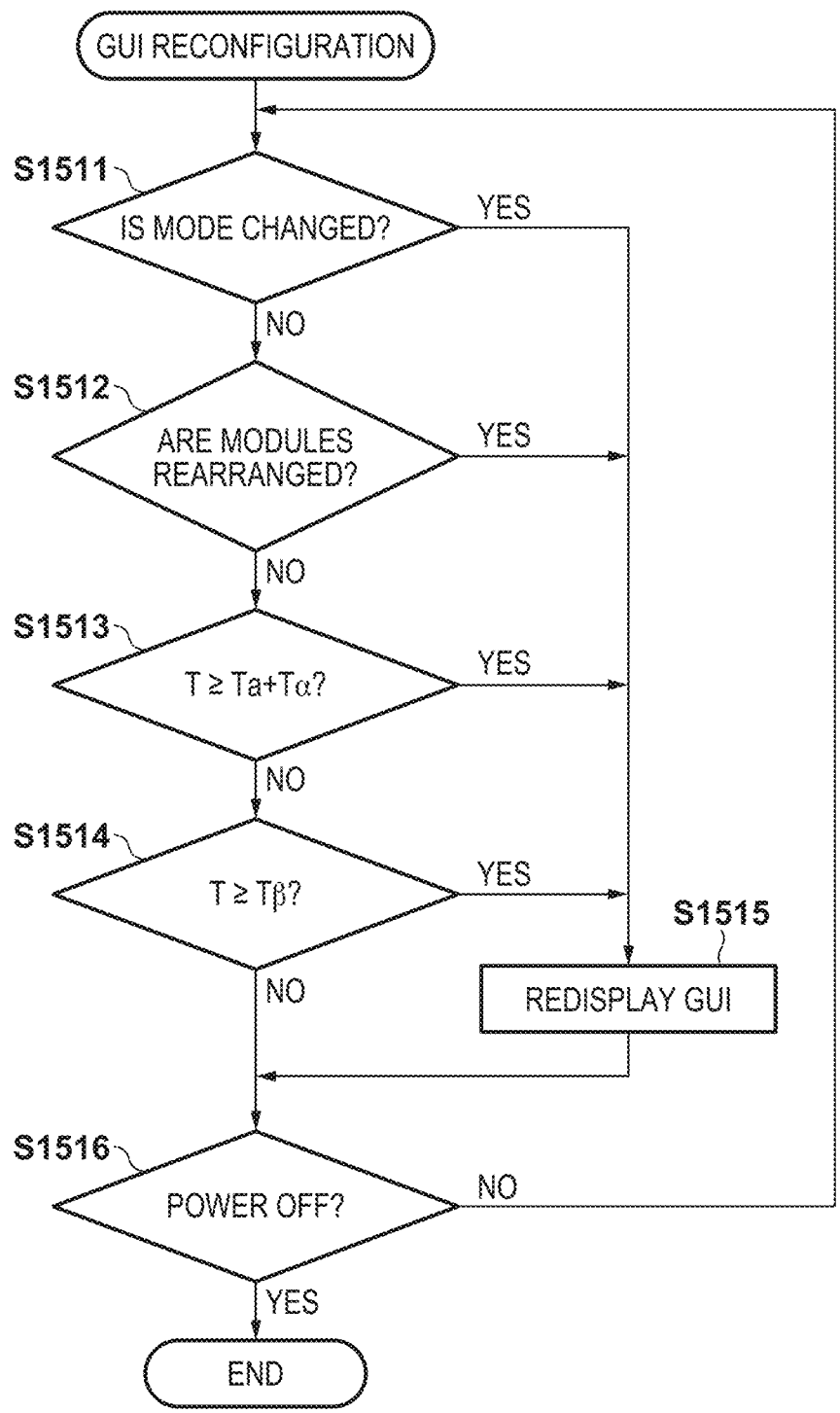
FIG. 12 is a flowchart illustrating a GUI screen reconstructing process for the system camera according to the first embodiment.

FIG. 12 is a flowchart illustrating a process through which the CPU 1112 reconfigures and displays the GUI screen when the information has been changed in step S1504.

The first situation in which the information is updated is when the shooting mode of the system camera 1000 has been changed (step S1511). When the shooting mode is changed, the power consumed by the camera body 1010 and the modules changes as well, and thus the CPU 1112 reconfigures the GUI screen on the basis of the new information (step S1515).

The second situation in which the information is changed is when the modules of the system camera 1000 are rearranged (step S1512). When the modules are rearranged, the information pertaining to the power consumption and connection positions of the modules changes as well, and thus the CPU 1112 reconfigures the GUI screen on the basis of the new information (step S1515).

The third situation in which the information is updated is when the temperature of the system camera 1000 rises during shooting and the temperature information detected by the temperature detection unit 1117, the temperature detection unit 1127, and the temperature detection unit 1137 changes (step S1513). A temperature T detected by the temperature detection unit 1117, the temperature detection unit 1127, and the temperature detection unit 1137 is assumed to rise as time passes immediately after the user has turned the power on.

If the detected temperature T rises above a threshold Ta from a previously-displayed temperature Ta (step S1513), the CPU 1112 reconfigures the GUI screen on the basis of the new information (step S1515). The threshold Ta may differ depending on the type of the module.

Additionally, each module has information of an upper limit temperature $T\beta$, where a margin has been added to the temperature at which operations can be guaranteed, and the CPU 1112 acquires that information. If the temperature T detected by the temperature detection unit 1117, the temperature detection unit 1127, and the temperature detection unit 1137 exceeds the upper limit temperature $T\beta$ (step S1514), the CPU 1112 reconfigures the GUI screen on the basis of the new information (step S1515). The upper limit temperature $T\beta$ differs depending on the type of the module.

The above-described information changes and GUI screen reconfiguration and display continue until the user turns the power off (step S1516).

Furthermore, although not illustrated, the CPU 1112 can reconfigure and display the GUI screen on the basis of the newest information when the user operates the operation unit 1109 at any given timing.

Calculation of Shooting Available Time

A process for calculating and displaying a shooting available time for the system camera 1000 will be described next with reference to FIGS. 13 to 16.

Figure 16:
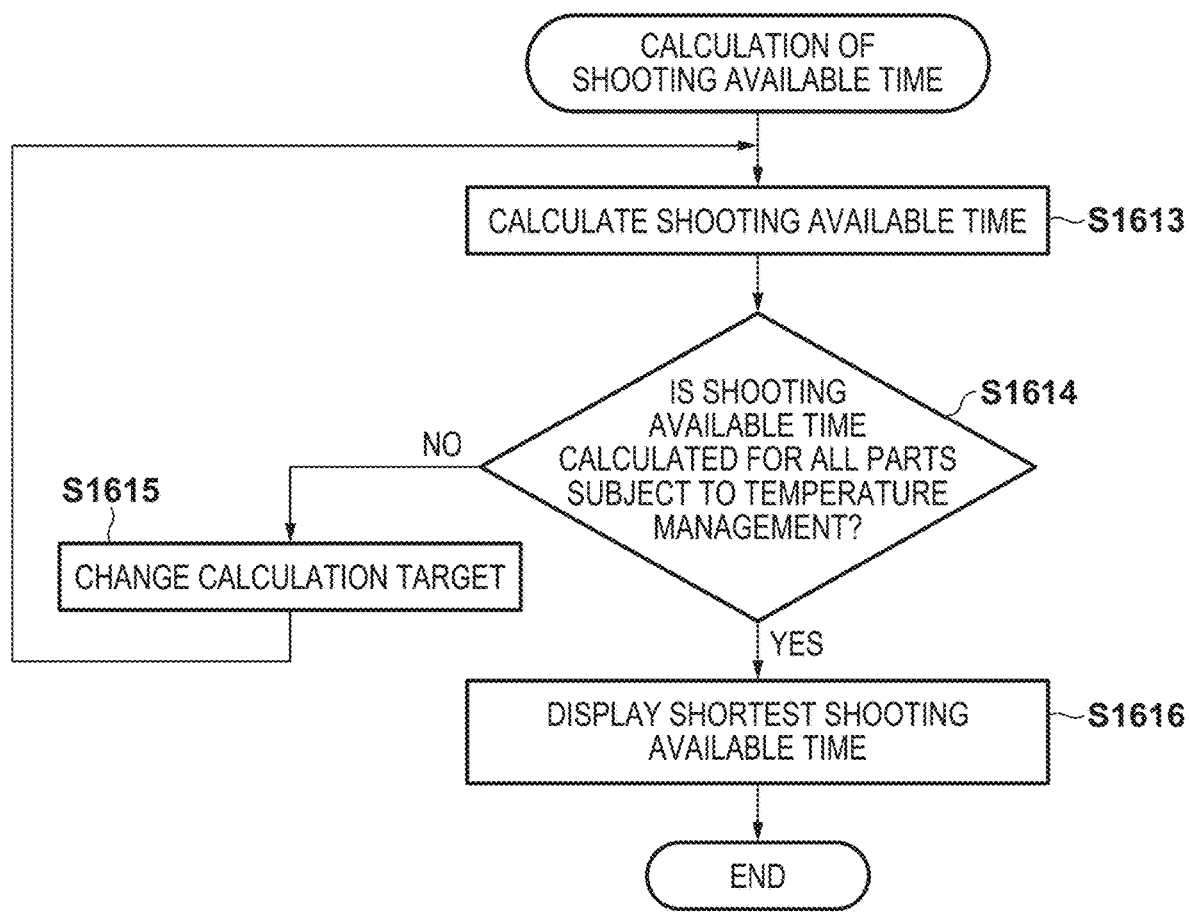
FIG. 16 is a flowchart illustrating a shooting available time calculation process for the system camera according to the first embodiment.

The following descriptions assume the configuration of the system camera 1000 illustrated in FIGS. 3 and 6 (with the exception of the media module 1150). Note that the processing illustrated in FIGS. 13 and 16 is realized by the CPU 1112 of the camera body 1010 executing programs stored in the memory 1102.

Figure 13:
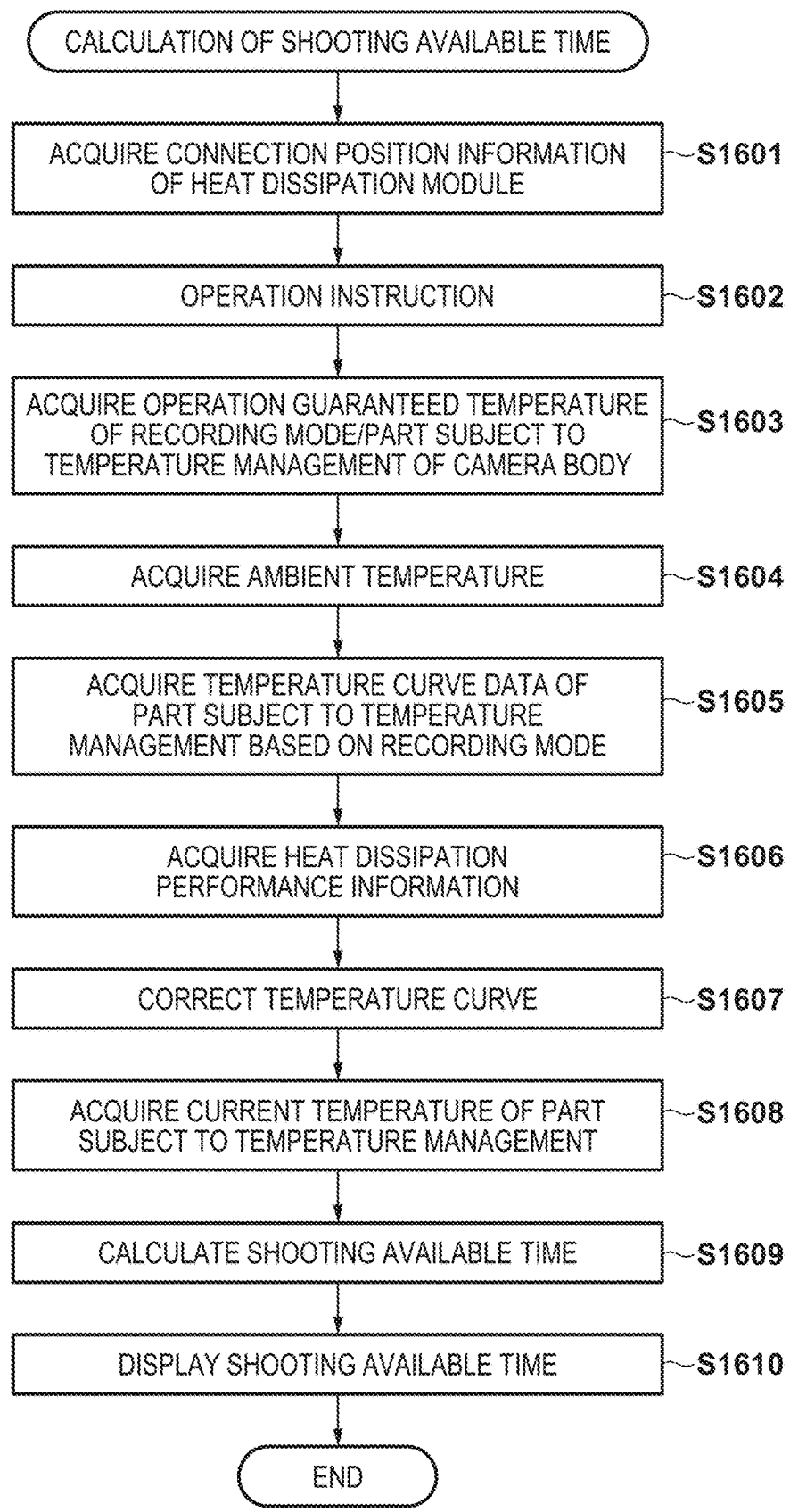
FIG. 13 is a flowchart illustrating a shooting available time calculation process for the system camera according to the first embodiment.

FIG. 13 is a flowchart illustrating a process through which the CPU 1112 of the camera body 1010 calculates the shooting available time.

In step S1601, the CPU 1112 acquires the connection position information of the heat dissipation module 1040.

In step S1602, the CPU 1112 detects that the user has operated the operation unit 1109 in order to display the shooting available time of the camera body 1010.

In step S1603, the CPU 1112 acquires information of the current recording mode of the camera body 1010 and information of the guaranteed temperature for a part subject to temperature management, from the memory 1102 of the camera body 1010. Of the elements, components, and so on in the camera body, modules, and the like, the part for which the temperature is expected to approach the guaranteed temperature in the shortest amount of time during operations is selected as the part subject to temperature management. The following will describe the image capturing unit 1105 of the camera body 1010 as the part subject to temperature management in the system camera 1000.

Figure 14:
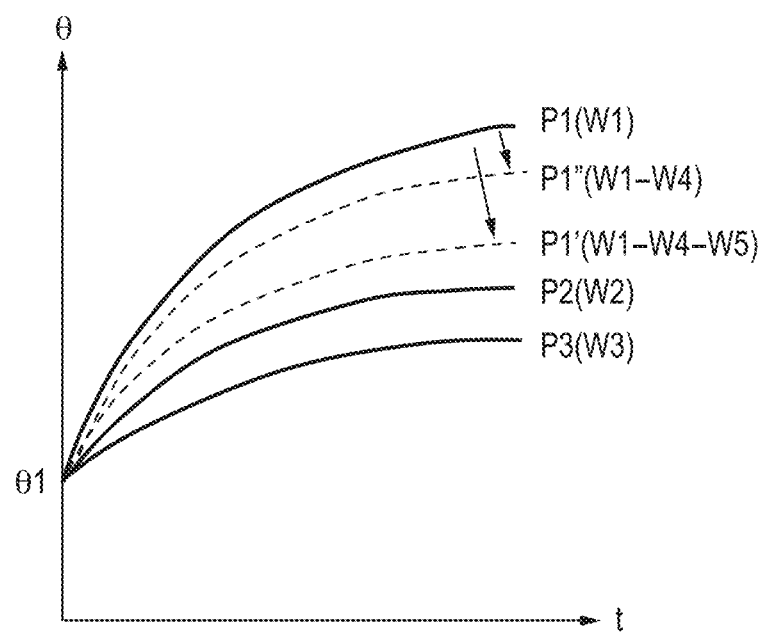
FIG. 14 is a diagram illustrating a data table indicating estimated temperature values for the system camera according to the first embodiment.
Figure 15:
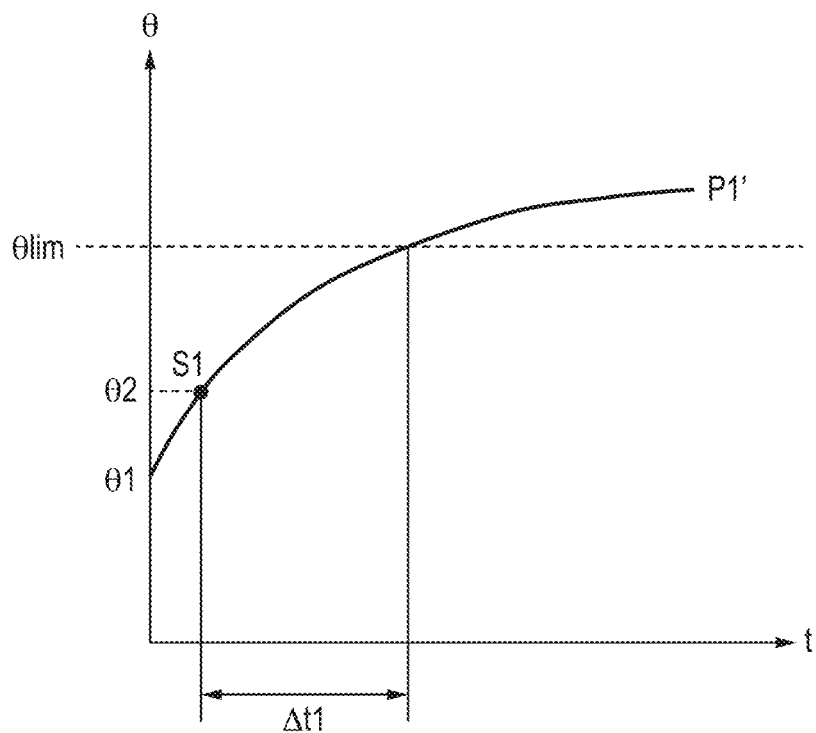
FIG. 15 is a diagram illustrating a data table indicating estimated temperature values for the system camera according to the first embodiment.

In steps S1604 and S1605, the CPU 1112 acquires the ambient temperature from the temperature detection unit 1117 and temperature curve data based on a shooting mode of the image capturing unit 1105 from the memory 1102. The ambient temperature is assumed to be the temperature of the outside air in an area affected by the heat generated within the camera body 1010 as little as possible, e.g., near the inlet 1012. The temperature curve data is a data table indicating predicted values for how the temperature of the image capturing unit 1105 will rise over time in response to power being consumed when recording is started in the current shooting mode. In FIG. 14, the horizontal axis represents time t and the vertical axis represents temperature Θ, with the temperature curve data represented by curves P1, P2, and P3, which correspond to respective power consumptions represented by W1>W2>W3, in that order from the highest.

As can be seen from FIG. 14, the rate (speed) at which the temperature Θ rises with respect to time t increases as the power consumption rises, and data of temperature transitions for each recording mode is stored in the memory 1102. The ambient temperature is assumed to be the same value as the temperature of the image capturing unit 1105 from before the system camera 1000 was started, i.e., in a state where no power is being consumed, and is thus taken as a starting temperature Θ1 of each temperature curve in FIG. 14.

In step S1606, the CPU 1112 acquires the heat dissipation performance information of the camera body 1010 and the heat dissipation performance information of the heat dissipation module 1040 from the memory 1102 of the camera body 1010 and the memory 1121 of the heat dissipation module 1040.

In step S1607, the CPU 1112 corrects the temperature curve data in accordance with the connection position information and heat dissipation performance information acquired in steps S1601 and S1606. In FIG. 14, curves P1' and P1" represent states resulting from correcting the temperature curve data represented by the curve P1. Here, −W4 and −W5 represent correction amounts for the heat dissipation capacity of the camera body 1010 and the heat dissipation capacity of the heat dissipation module 1040, respectively.

When the heat dissipation module 1040 is adjacent to the camera body 1010, the temperature curve P1 in FIG. 14 is corrected by −W4 for the heat dissipation capacity of the camera body 1010 and −W5 for the heat dissipation capacity of the heat dissipation module 1040, thus shifting the curve to the curve P1'. When the heat dissipation module 1040 is not adjacent to the camera body 1010, the heat dissipation module 1040 does not dissipate heat, and the temperature curve P1 in FIG. 14 is corrected only by −W4 for the heat dissipation capacity of the camera body 1010, thus shifting the curve to the curve P1".

In step S1608, the CPU 1112 acquires the current temperature of the image capturing unit 1105 from the temperature detection unit 1117. The current temperature of the image capturing unit 1105 corresponds to the current position in the temperature curve determined in step S1607. For example, assuming that the temperature of the image capturing unit 1105 in the curve P1' of FIG. 15 at that point in time is Θ2, the state of the temperature of the image capturing unit 1105 transitions along the temperature curve, from the position of S1 in the temperature curve, with the passage of time.

In step S1609, the CPU 1112 calculates the amount of time until the image capturing unit 1105 reaches the operation guaranteed temperature. Assuming that the operation guaranteed temperature of the image capturing unit 1105 is Θlim in the curve P1' of FIG. 15, the amount of time until the temperature of the image capturing unit 1105, which is currently in the state indicated by S1, reaches Θlim is Δt1. Δt1 indicates the amount of time for which the image capturing unit 1105 is guaranteed to operate safely with respect to heat, and thus Δt1 corresponds to an operable time for the image capturing unit 1105.

In the present embodiment, the image capturing unit 1105 serves as the part subject to temperature management in the system camera 1000, and thus the shooting available time of the system camera 1000 has the same value as Δt1.

In step S1610, the CPU 1112 displays Δt1 as the shooting available time in the display unit 1015.

A situation where a plurality of parts subject to temperature management are present will be described with reference to FIG. 16.

In step S1613, the CPU 1112 calculates the shooting available time in accordance with the processing from steps S1603 to S1609 in FIG. 13, carried out for a single part subject to temperature management.

In step S1614, the CPU 1112 determines whether the shooting available time has been calculated for all of the parts subject to temperature management; if there is a part subject to temperature management for which the shooting available time has not been calculated, the process moves to step S1615, where the part for calculation is changed and the shooting available time is again calculated in the same manner. When the shooting available time has been calculated for all the parts subject to temperature management, the process moves to step S1616, where the shooting available times for the parts subject to temperature management are compared and the shortest shooting available time is displayed in the display unit 1015. For example, assuming the time until a given part subject to temperature management reaches the operation guaranteed temperature is Δt2 and the time until another part subject to temperature management reaches the operation guaranteed temperature is Δt3, and that Δt2>Δt3, only the time of Δt3 is displayed in the display unit 1015.

Note that depending on the camera, there are also situations where a recording time calculated from the remaining battery power, the storage capacity of recording media, and so on can also be displayed. If the present embodiment is applied in such a camera, a remaining recording time based on the aforementioned operation guaranteed temperature may be displayed at the same time, or the two may be compared and only the one with the shorter recording time may be displayed.

Calculating Optimal Module Arrangement

Processing for calculating a module arrangement at which the system camera 1000 has an optimal heat dissipation state will be described next with reference to FIGS. 17A, 17B and 18.

While various types of modules can be connected as desired in the system camera 1000 by using the common engagement interface, it is difficult for the user to determine whether the current module arrangement is optimal with respect to heat dissipation. Accordingly, in the present embodiment, the heat dissipation state of the current system configuration is evaluated, and a more optimal arrangement is calculated.

The following descriptions assume the configuration of the system camera 1000 illustrated in FIG. 6 (with the exception of the media module 1150). Note that the processing illustrated in FIGS. 17A and 17B are realized by the CPU 1112 of the camera body 1010 executing programs stored in the memory 1102.

Figure 17A:
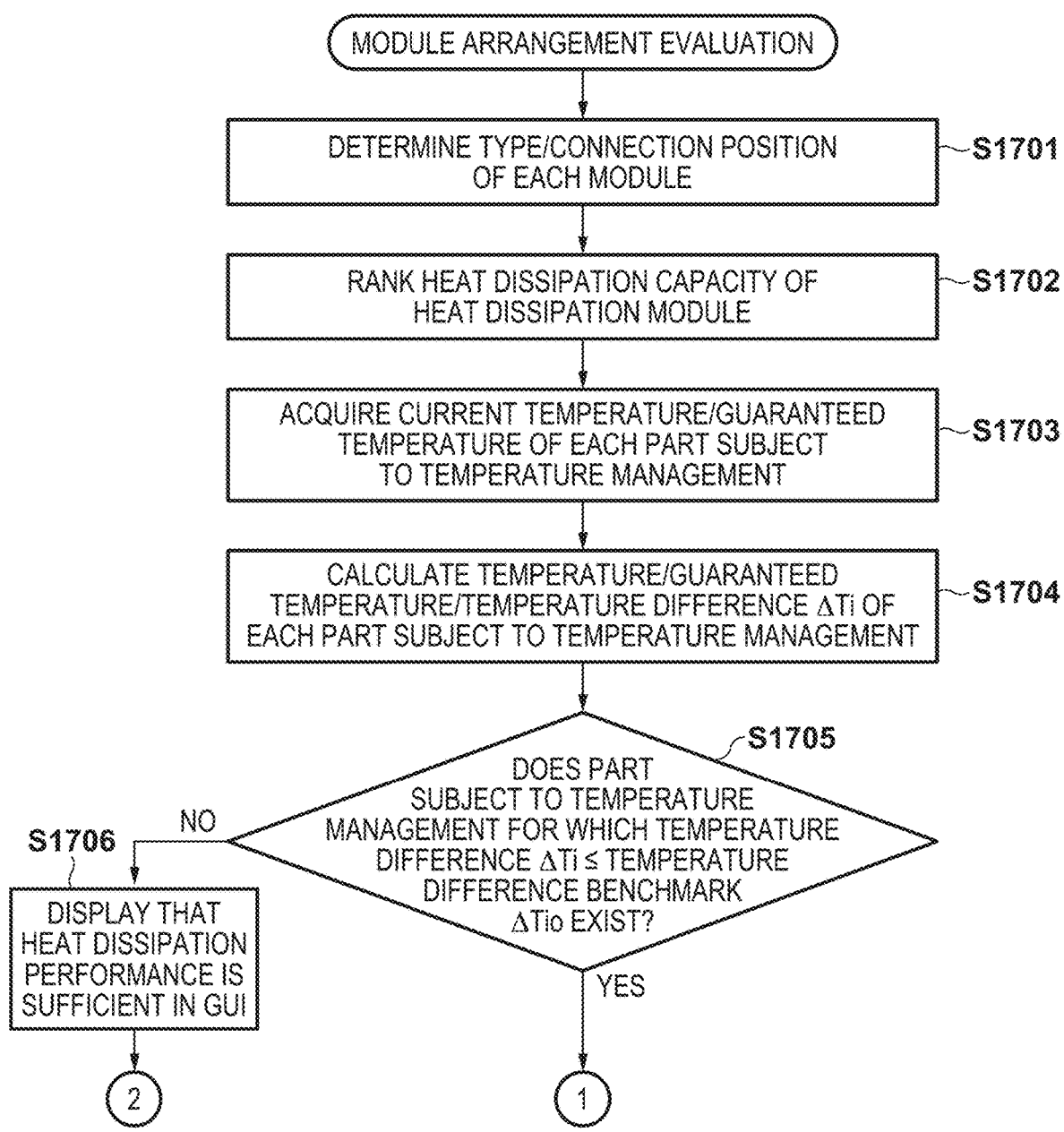
FIGS. 17A and 17B are flowcharts illustrating a module arrangement evaluation process for the system camera according to the first embodiment.
Figure 17B:
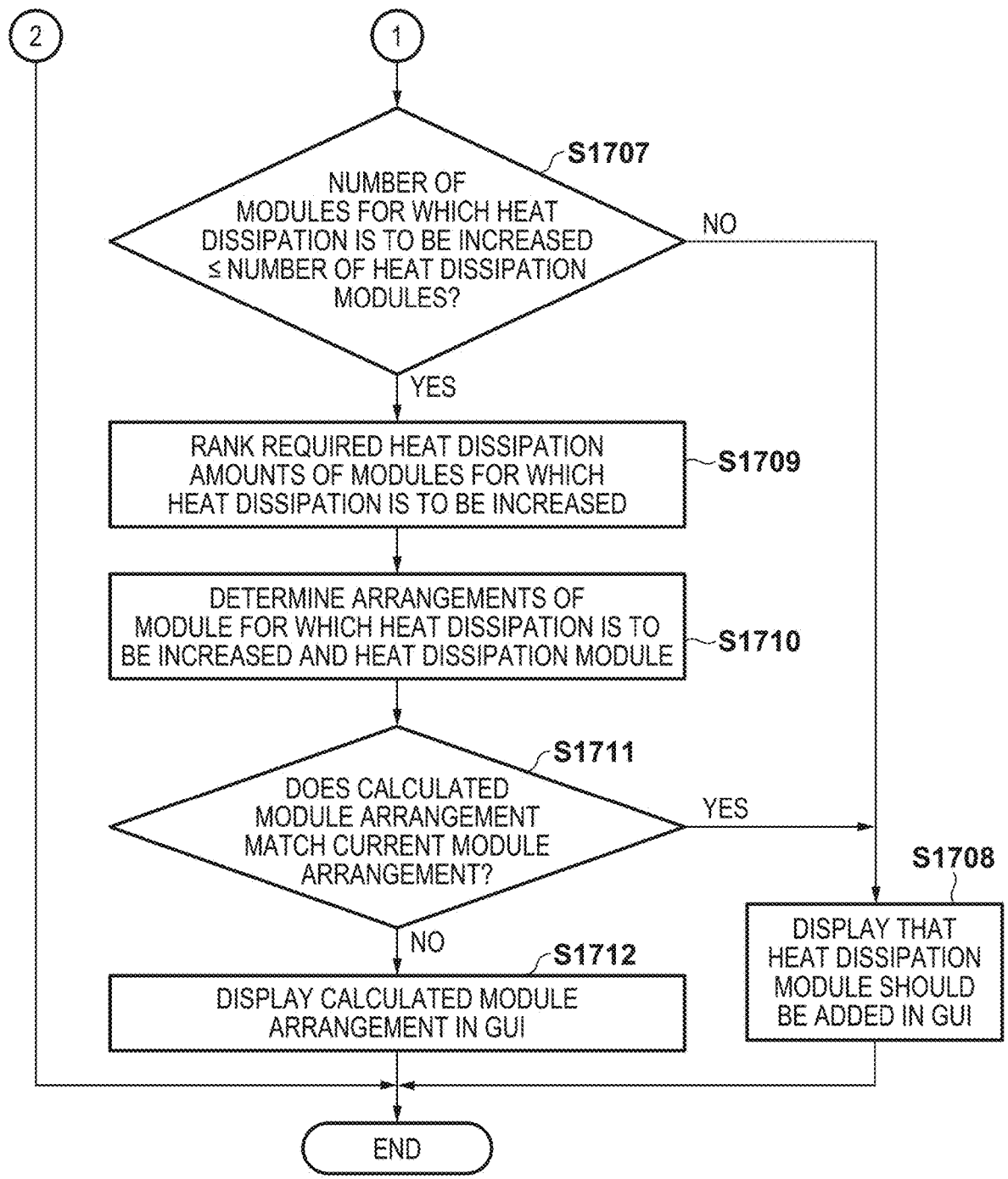

FIGS. 17A and 17B are flowcharts illustrating a process through which the CPU 1112 of the camera body 1010 evaluates the current heat dissipation state and calculates a module arrangement optimal for heat dissipation.

In step S1701, the CPU 1112 determines the type and connection position of each module constituting the system camera 1000.

In step S1702, if a heat dissipation module is included in the current modules, the CPU 1112 determines the heat dissipation capacity of the heat dissipation module, and determines the order of the modules starting with the module having the best heat dissipation capacity.

In step S1703, the CPU 1112 acquires information of the current and guaranteed temperatures of the parts subject to temperature management set in the system camera 1000. Of the elements, components, and so on in the camera, modules, and the like, the part for which the difference between the temperature during operation and the guaranteed temperature is expected to become comparatively low is selected in advance as the part subject to temperature management.

In steps S1704 and S1705, the CPU 1112 calculates a temperature difference $\Delta Ti$ between the current and guaranteed temperature of each part subject to temperature management, and compares that with a temperature difference benchmark $\Delta Tio$. The temperature difference benchmark $\Delta Tio$ is set to a temperature difference from the guaranteed temperature for a case where the part subject to temperature management is at a temperature where that part can operate with sufficient stability. If the temperature difference $\Delta Ti$ for a given part subject to temperature management is lower than the temperature difference benchmark $\Delta Tio$, that a part subject to temperature management has not exceeded the guaranteed temperature but also has no leeway in terms of the temperature, and can therefore be determined to be in a state where more heat dissipation is required.

In step S1705, if it is determined that the temperature difference $\Delta Ti >$ the temperature difference benchmark $\Delta Tio$ for all the parts subject to temperature management, the CPU 1112 determines that the heat dissipation capacity is sufficient with the current module arrangement, displays a GUI to that effect in the display unit 1015 (step S1706), and ends the processing. However, if there is a part subject to temperature management for which the temperature difference $\Delta Ti \leq$ the temperature difference benchmark $\Delta Tio$, the number of modules containing that part subject to temperature management is calculated as modules for which heat dissipation is to be increased, and that number is compared with the number of heat dissipation modules currently attached (step S1707).

In step S1707, if the number of modules for which heat dissipation is to be increased is greater than the number of heat dissipation modules, the CPU 1112 determines that there is an insufficient number of heat dissipation modules with the current module arrangement, and the process moves to step S1708. In step S1708, the CPU 1112 displays a GUI prompting the user to add a heat dissipation module in the display unit 1015, and then ends the process. Additionally, if the number of modules for which heat dissipation is to be increased is less than or equal to the number of heat dissipation modules, it is determined that there is a sufficient number of heat dissipation modules, and a module arrangement with better-optimized heat dissipation is then calculated.

In step S1709, the CPU 1112 ranks the modules for which heat dissipation is to be increased, determined in step S1707, with respect to the required heat dissipation amounts, on the basis of the temperature difference $\Delta Ti$ of the part subject to temperature management in each of those modules. Specifically, the amount of heat dissipation required by a module for which heat dissipation is to be increased is determined to be higher as the temperature difference $\Delta Ti$ drops, and the order is determined in accordance therewith. At this time, if there are multiple parts subject to temperature management in the module for which heat dissipation is to be increased, the part with the lowest temperature difference $\Delta Ti$ is employed.

In step S1710, the CPU 1112 determines the module arrangement so that the order of the modules for which heat dissipation is to be increased, from the module requiring the highest amount of heat dissipation, corresponds to the order of the heat dissipation modules calculated in step S1702, from the module having the highest heat dissipation capacity. At this time, the module for which heat dissipation is to be increased is arranged adjacent to the heat dissipation module.

In step S1711, the CPU 1112 compares the current module arrangement determined in step S1701 with the module arrangement newly calculated in step S1710, with the process moving to step S1708 if the arrangements match and to step S1712 if the arrangements do not match.

In step S1708, the CPU 1112 determines that it is not desirable to increase the heat dissipation by changing the current module arrangement, displays a GUI prompting the user to add a heat dissipation module in the display unit 1015, and ends the process.

In step S1712, the CPU 1112 displays, in the display unit 1015, the module arrangement calculated in step S1710 to prompt the user to rearrange the modules, and then ends the process.

Figure 18:
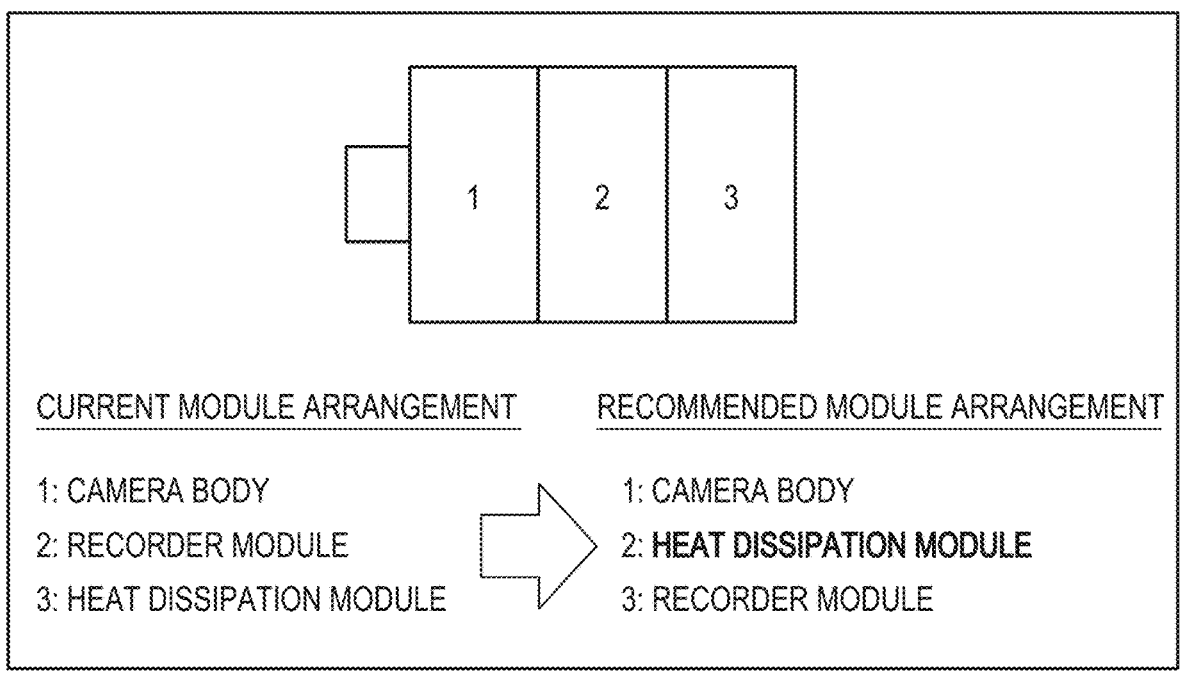
FIG. 18 is a diagram illustrating an example of a GUI which prompts a module to be switched in the process of FIGS. 17A and 17B.

FIG. 18 illustrates an example of the GUI prompting the user to rearrange the modules in step S1712. The current module arrangement and a module arrangement with optimized heat dissipation are displayed in the GUI, and information prompting the attachment position of the heat dissipation module 1040 to be changed is displayed. Specifically, it is assumed that the heat dissipation of the camera body 1010 is insufficient with the current module arrangement, and the user is therefore prompted to switch the heat dissipation module 1040 to a position adjacent to the camera body 1010.

Although the present embodiment describes an example in which the temperature difference benchmark ΔTio has a value set in advance, a configuration may be employed in which the user can change this to a desired value.

Heat Transfer Surface Contact Detection

Next, a process through which the contact state of heat transfer surfaces between the camera body and a module, or between modules, is detected will be described with reference to FIG. 19.

The system camera 1000 includes heat transfer surfaces that are common for each of the modules, and heat can be dissipated effectively by transferring heat from a module that acts as a heat source to a module having heat dissipation functionality. To dissipate heat sufficiently, it is important to keep a good state of contact of the heat transfer surfaces between the camera body and a module, or between modules, but if a foreign object enters between the heat transfer surfaces, the heat transfer surfaces themselves become soiled, or the like, the contact may become insufficient. Accordingly, in the present embodiment, the state of contact of heat transfer surfaces between the camera body and a module, or between modules, is detected, and a notification is made if necessary.

The following descriptions assume the configuration of the system camera 1000 illustrated in FIG. 6 (with the exception of the media module 1150). Note that the processing illustrated in FIG. 19 is realized by the CPU 1112 of the camera body 1010 executing programs stored in the memory 1102.

Figure 19:
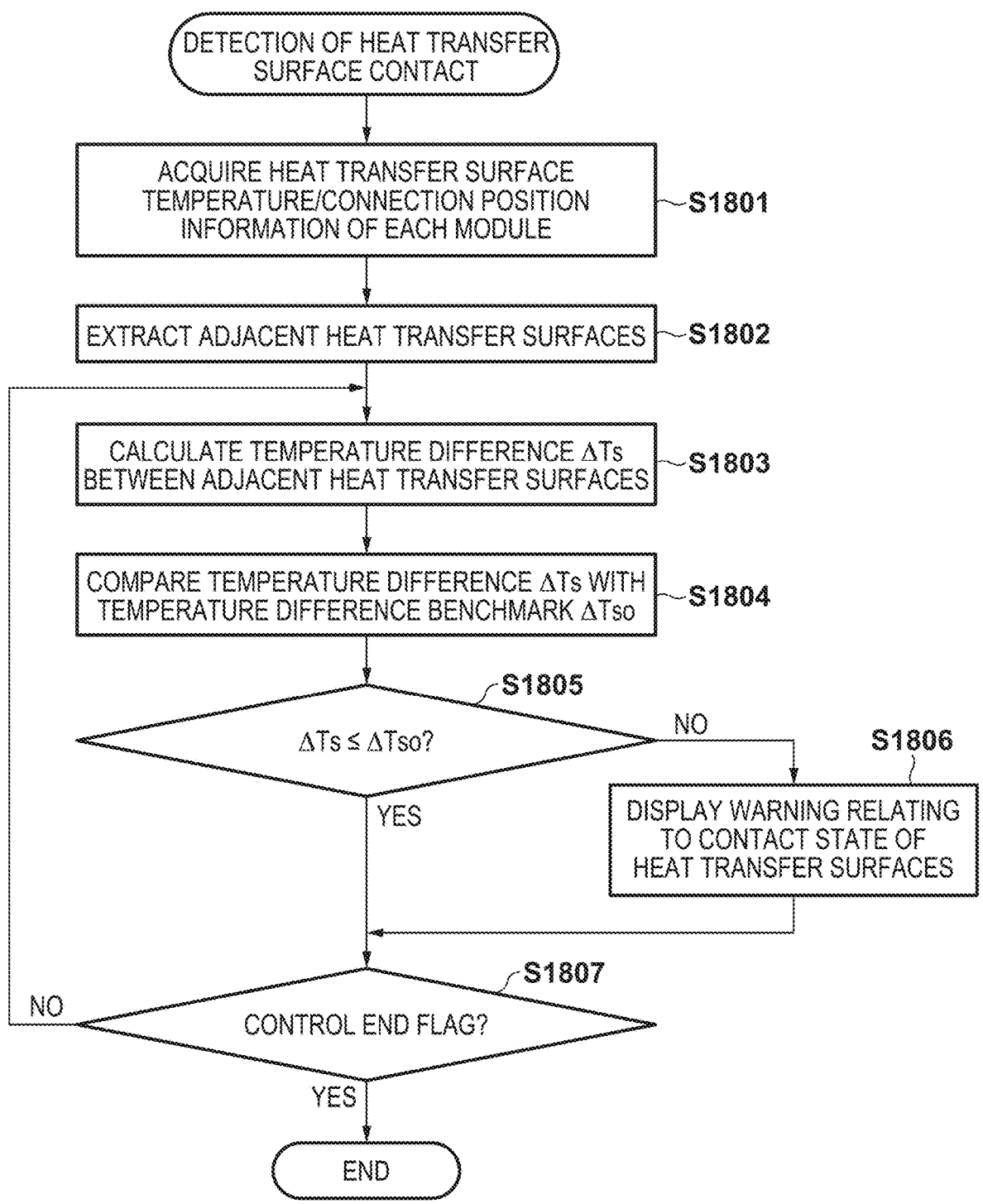
FIG. 19 is a flowchart illustrating a heat transfer surface contact detection process for the system camera according to the first embodiment.

FIG. 19 is a flowchart illustrating a process through which the CPU 1112 of the camera body 1010 detects the state of contact of heat transfer surfaces between the camera body and a module, or between modules.

In step S1801, the CPU 1112 acquires a heat transfer surface temperature and the connection position information of the camera body and the modules. The "heat transfer surface" corresponds to a contact surface provided in the camera body and the modules for exchanging heat between the camera body and a module, or between modules. For example, the heat transfer portion 1014 provided on the rear surface of the camera body 1010, the first heat receiving surface 1041 and the second heat receiving surface 1042 provided on the front and rear surfaces of the heat dissipation module 1040, and the like correspond to heat transfer surfaces.

In step S1802, the CPU 1112 extracts a combination of adjacent heat transfer surfaces on the basis of the connection position information acquired in step S1801.

In step S1803, the CPU 1112 calculates a temperature difference ΔTs between the heat transfer surfaces for each combination of adjacent heat transfer surfaces, from the heat transfer surface temperatures acquired in step S1801.

In step S1804, the CPU 1112 compares the temperature difference ΔTs between the heat transfer surfaces with a temperature difference benchmark ΔTso stored in advance in the memory 1102. The temperature difference benchmark ΔTso is set to a temperature difference value that arises when the thermal conductivity between the heat transfer surfaces is sufficient.

In step S1805, if the CPU 1112 determines that the temperature difference ΔTs is greater than the temperature difference benchmark ΔTso on the basis of the result of the comparison made in step S1804, the process moves to step S1806. If the temperature difference ΔTs is greater than the expected temperature difference benchmark ΔTso, it is assumed that the thermal conductivity between the heat transfer surfaces is being inhibited. As such, in step S1806, the CPU 1112 displays, in the display unit 1015, a warning indicating that an abnormality may have arisen in the contact between the heat transfer surfaces, and prompts the user to confirm the state of the heat transfer surfaces. On the other hand, if the temperature difference ΔTs is less than or equal to the temperature difference benchmark ΔTso in step S1805, the thermal conductivity between the heat transfer surfaces is determined to be sufficient, and the process moves to step S1807.

In step S1807, the CPU 1112 determines whether or not a control end flag is set; if the control end flag is set, the process returns to step S1803, where the calculation of the temperature difference ΔTs and the comparison with the temperature difference benchmark ΔTso are repeated. If the control end flag is set, the process ends. The control end flag is set when the system camera 1000 is no longer being used and the power has been turned off, for example.

Method for Confirming Exhaust State of Forced Cooling Device

Next, a process for confirming the exhaust state of the forced cooling device in the system camera 1000 will be described with reference to FIGS. 20 to 25.

In the system camera 1000 according to the present embodiment, various types of modules can be connected as desired by using the common engagement interface, and thus system configurations aside from that illustrated are also possible, in accordance with the user's purpose. For example, while the heat dissipation module 1040 illustrated in FIGS. 2A and 2B includes the inlet 1043 in the −X direction side surface of the heat dissipation module 1040 and the outlet 1044 in the +X direction side surface of the heat dissipation module 1040, it is conceivable that, depending on the shooting situation, having the user's face close to the outlet 1044 will affect the shooting. A heat dissipation module in which the outlet 1044 is arranged on the top surface in the +Y direction may be connected to avoid this situation, for example. Thus according to the system camera 1000, the positions of the inlet/outlet can be changed in accordance with a variety of shooting situations by connecting a heat dissipation module.

Incidentally, with the system camera 1000, advanced shooting, and heat dissipation measures involved therewith, can also be realized by combining various types of modules, heat dissipation modules, and so on. However, combining multiple modules results in inlets and outlets being arranged in several locations, which makes it difficult to predict where exhausts will be located when heat dissipation fans run during shooting; it is also conceivable that unanticipated exhausting will affect the shooting as well. Additionally, because the modules can be combined as desired and the positions of the inlets, outlets, and so on change with each combination, it is desirable that the user be able to confirm the conditions of exhaust from the outlets, operating noise from the heat dissipation fans, and so on in advance.

Figure 23:
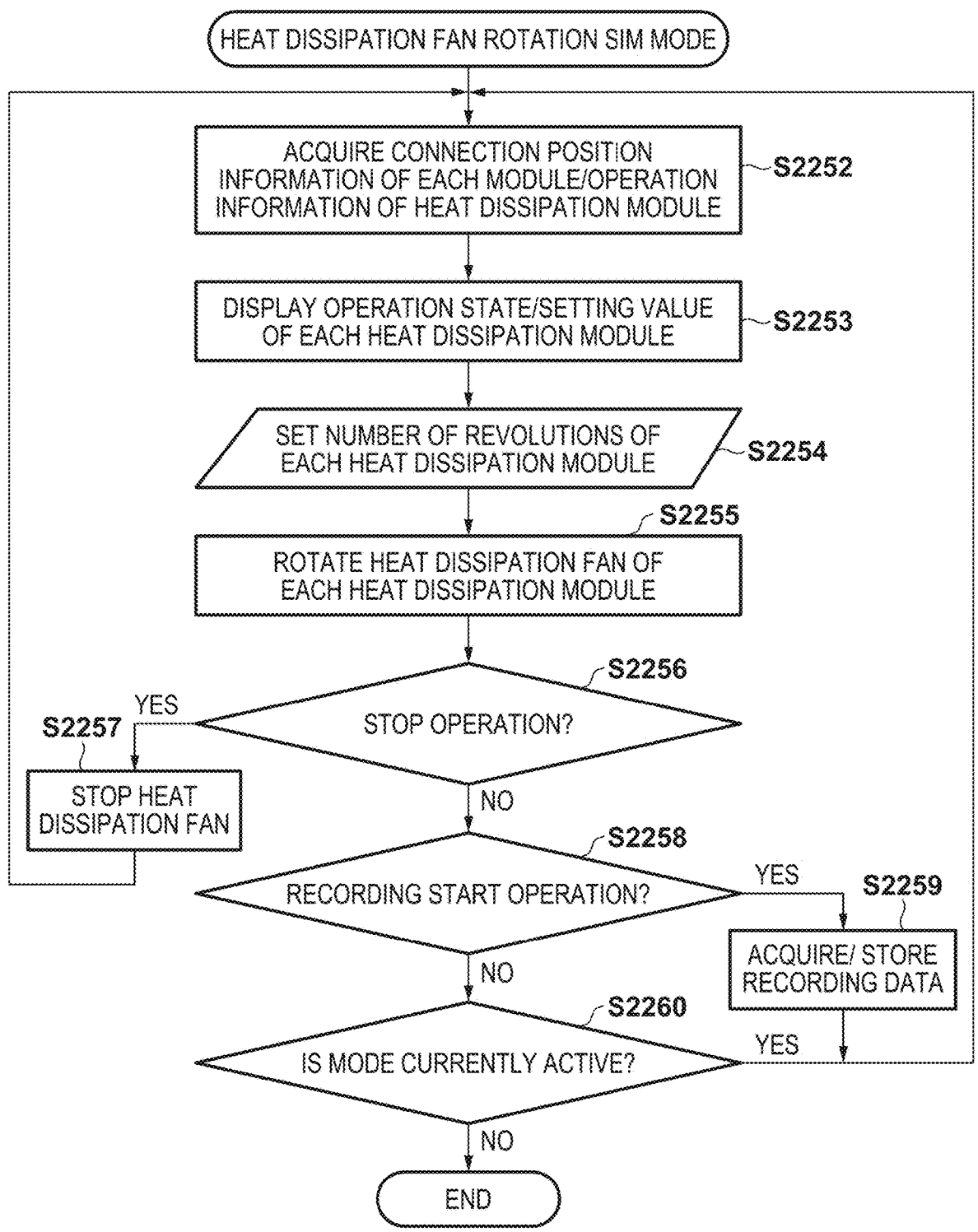
FIG. 23 is a flowchart illustrating processing in the heat dissipation fan rotation SIM mode for the system camera according to the second embodiment.
Figure 25:
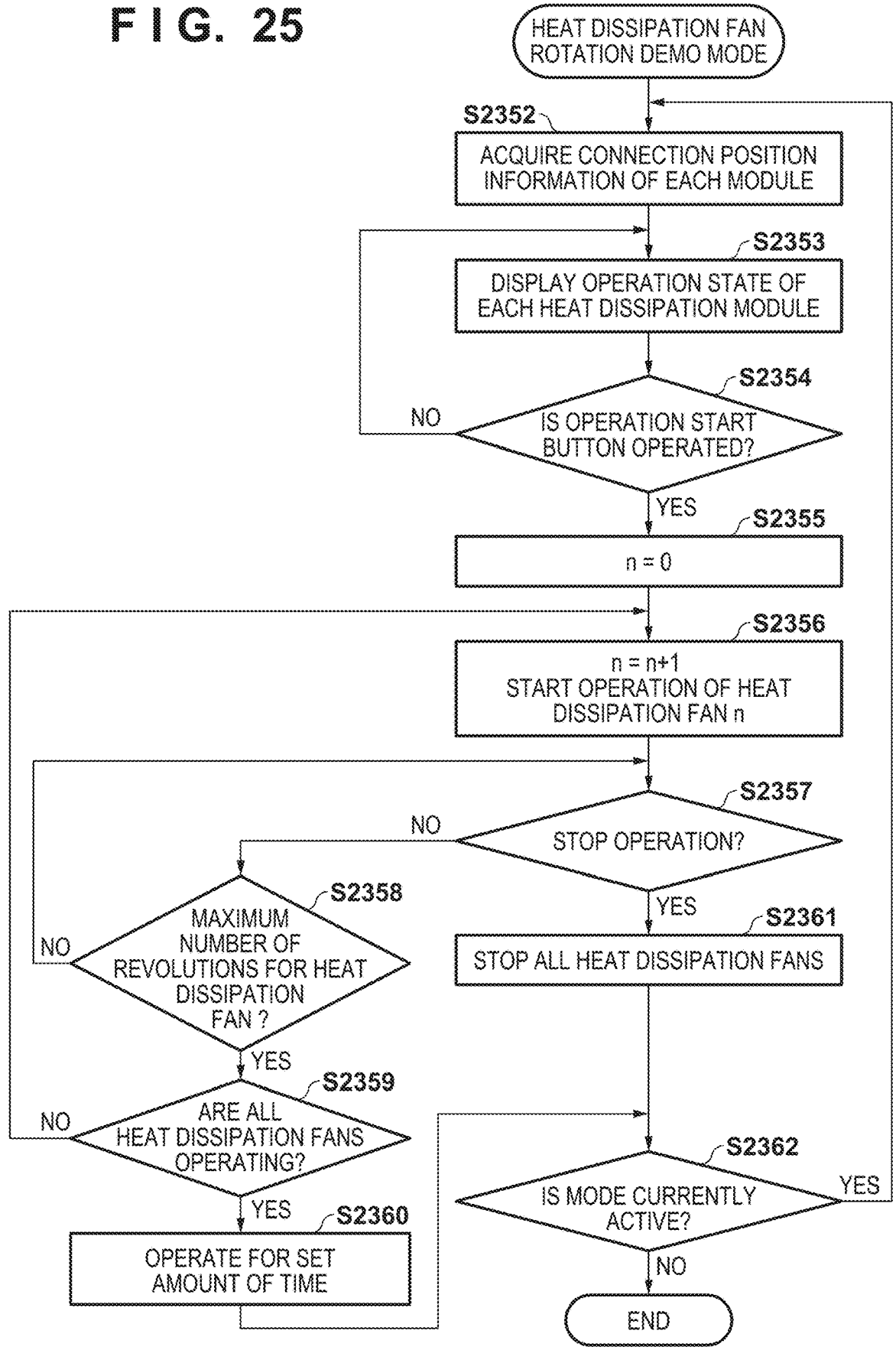
FIG. 25 is a flowchart illustrating processing in the heat dissipation fan rotation demo mode for the system camera according to the second embodiment.

The present embodiment describes measures taken in response to these issues. The following descriptions assume a configuration in which a plurality of heat dissipation modules have been attached in the system camera 1000 illustrated in FIG. 6 (with the exception of the media module 1150). Note that the processing illustrated in FIGS. 23 and 25 is realized by the CPU 1112 of the camera body 1010 executing programs stored in the memory 1102.

Figure 20:
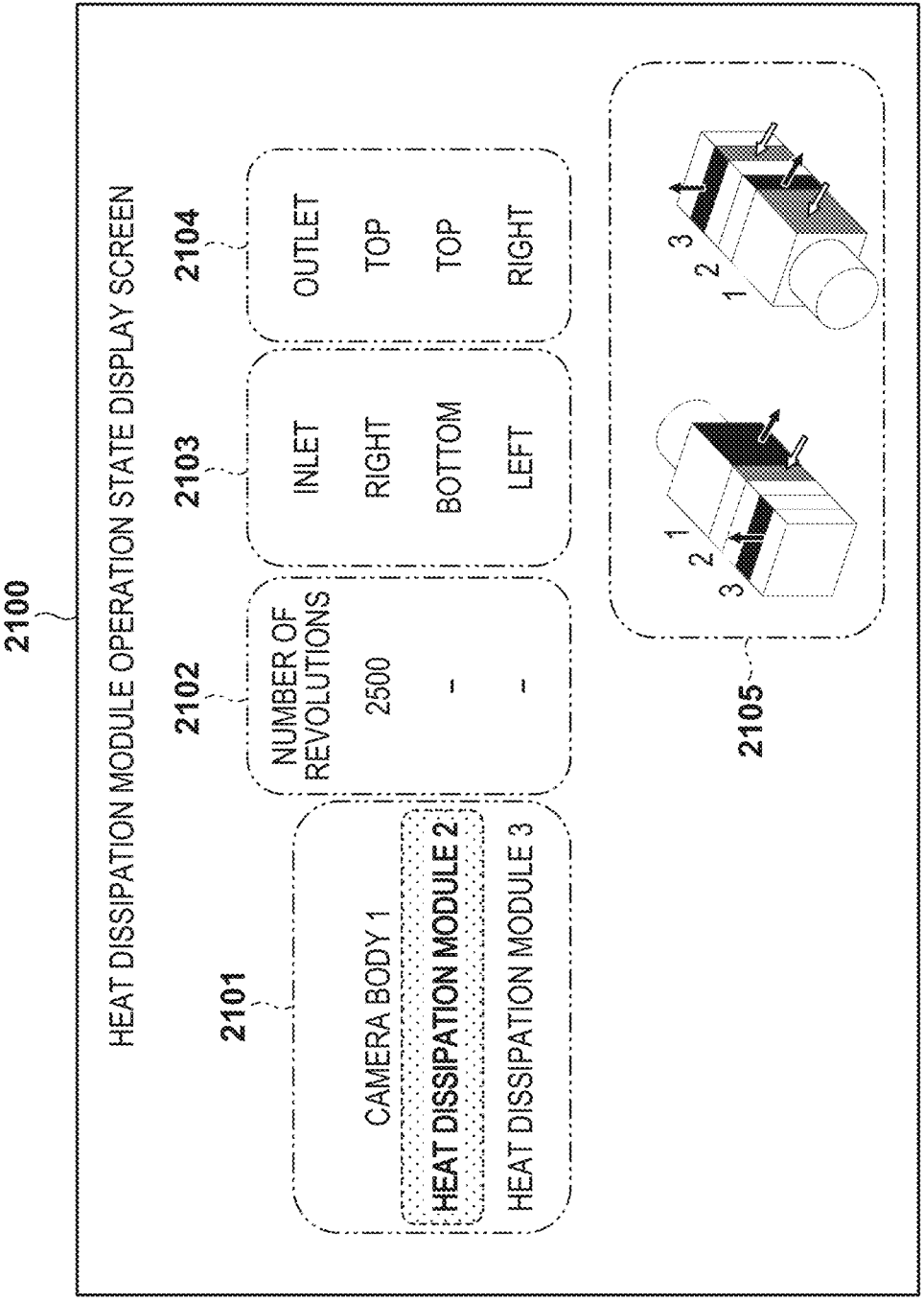
FIG. 20 is a diagram illustrating an example of a GUI of a system camera according to a second embodiment.

FIG. 20 illustrates an example of a screen 2100, in the display unit 1015, which displays the operation states of a plurality of heat dissipation modules attached to the system camera 1000. In FIG. 20, the heat dissipation modules in the system camera 1000 are displayed in order, from the camera body 1010, in a module display area 2101. Although identification numbers are assigned in order from the camera body 1010 in the present embodiment, numbers need not be used; anything that enables the modules to be identified, such as letters or the like, may be employed. The same applies to the descriptions below. Furthermore, the camera body 1010 also includes a heat dissipation fan, and the camera body 1010 is therefore displayed in the same manner as a heat dissipation module. The following descriptions assume that the camera body 1010 and the heat dissipation modules both include the heat dissipation performance information.

The current number of revolutions of the heat dissipation fan in each heat dissipation module is displayed in a number of revolutions display part 2102. The positions of inlets and outlets in the heat dissipation modules, as seen from the user, are displayed in an inlet display part 2103 and an outlet display part 2104, in a simplified manner for the inlet and outlet in each heat dissipation module. Rather than the number of revolutions of the heat dissipation fan, the operation state may be displayed in the number of revolutions display part 2102 in stages, in accordance with the heat dissipation control of the system camera 1000. For example, a display indicating a high number of revolutions or a low number of revolutions may be made, or only whether the heat dissipation fan is operating/not operating may be displayed.

The modules constituting the system camera 1000, and the positions of the inlets and outlets of the heat dissipation modules, are displayed in a simplified manner in an overall display part 2105. The directions of intake and exhaust are also indicated by the directions of the arrows. Note that a heat dissipation module 2 is displayed with emphasis in FIG. 20. This indicates that although the heat dissipation fans of the heat dissipation module 2 and a heat dissipation module 3 are stopped, the heat dissipation module 2 is about to start operating. By displaying a heat dissipation module that is about to start operating with emphasis in this manner, an advance notification can be made to the user, and the influence on shooting can be reduced. A variety of methods are conceivable for the emphasized display, such as flashing, changing colors, and so on.

Figure 21:
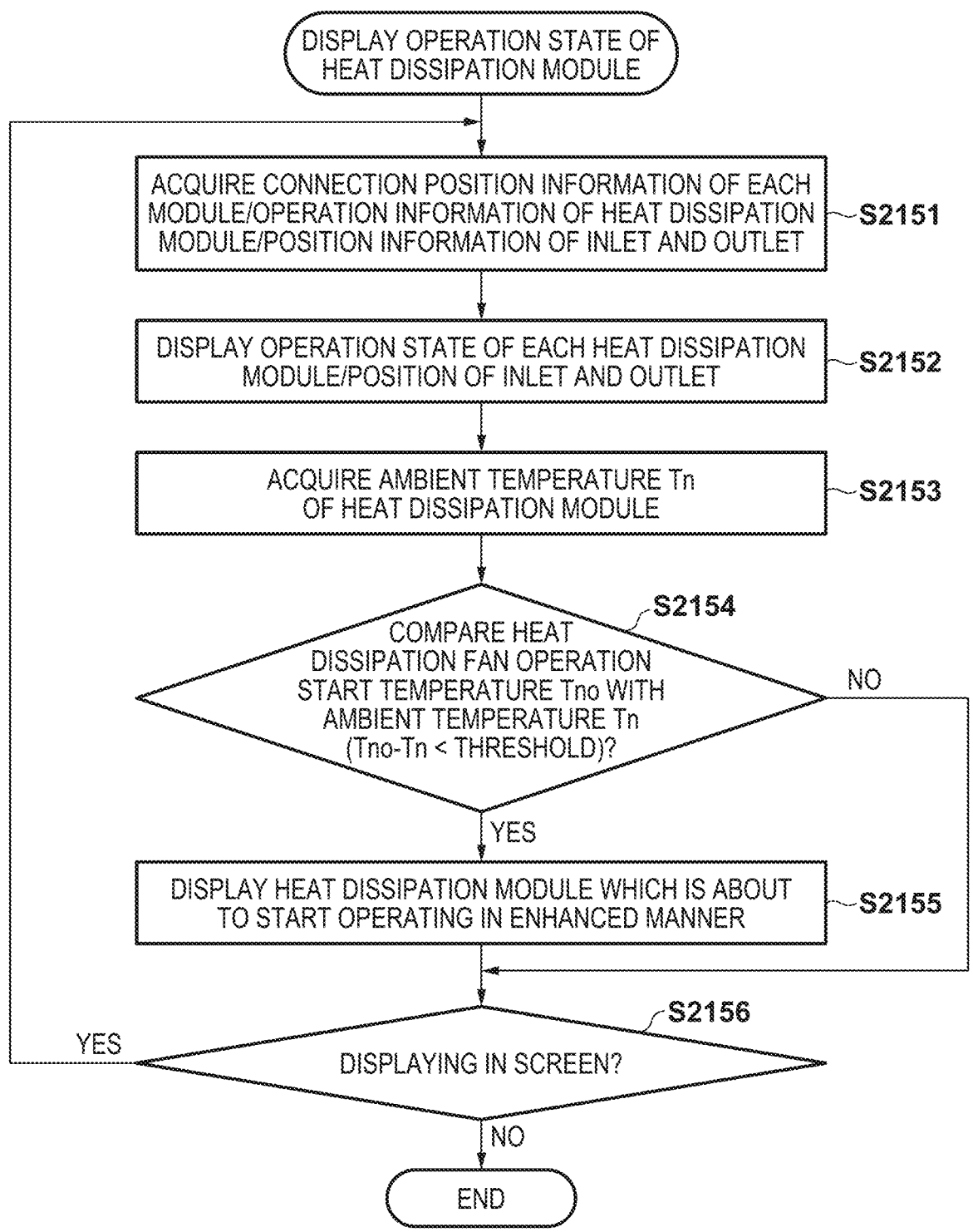
FIG. 21 is a flowchart illustrating a heat dissipation module operation state display process for the system camera according to the second embodiment.

FIG. 21 is a flowchart illustrating a process for displaying the screen 2100 illustrated in FIG. 20.

In step S2151, the CPU 1112 acquires the connection position information of each module, heat dissipation fan operation information of each heat dissipation module, and inlet/outlet position information of each heat dissipation module. Note that the inlet/outlet position information of each heat dissipation module is stored in memory of the heat dissipation module in advance.

In step S2152, the CPU 1112 displays the heat dissipation fan operation state and inlet/outlet positions of each heat dissipation module.

In step S2153, the CPU 1112 acquires a surrounding temperature Tn from the temperature detection unit of each of the camera body 1010 and the connected modules.

In step S2154, the CPU 1112 compares a pre-set heat dissipation fan operation start temperature Tno with the surrounding temperature Tn. If Tno−Tn is less than a set threshold, the process moves to step S2155, where the CPU 1112 displays the heat dissipation module which is about to start operating in an enhanced manner in the module display area 2101.

In step S2156, the CPU 1112 determines whether or not the screen display is currently in progress; if the display is in progress, the process returns to step S2151, and if the display is not in progress, the process ends.

Figure 22:
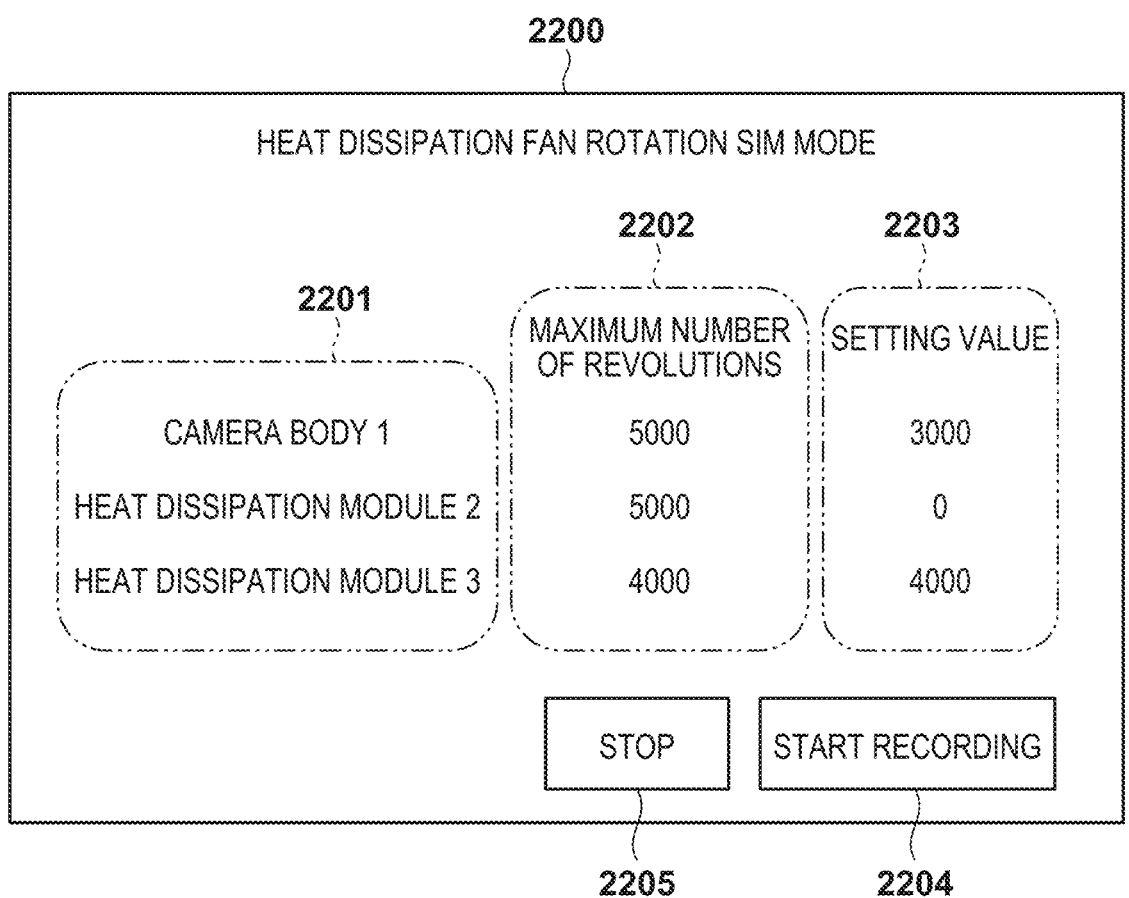
FIG. 22 is a diagram illustrating an example of a GUI of the system camera in a heat dissipation fan rotation SIM mode according to the second embodiment.

Another embodiment will be described next. FIG. 22 illustrates an example of a display screen 2200 for a heat dissipation fan rotation SIM mode.

In the heat dissipation fan rotation SIM (simulation) mode, the user can actually rotate the heat dissipation fan in each heat dissipation module to confirm the operation states, and can furthermore record and confirm the operating noise. The heat dissipation modules connected to the system camera 1000 are displayed in order, from the camera body 1010, in the module display area 2101 of the heat dissipation fan rotation SIM mode screen 2200. The maximum number of revolutions of each heat dissipation fan is displayed in a maximum number of revolutions display part 2202. The user can set a desired number of revolutions, up to the maximum number of revolutions, for the heat dissipation module, and the setting value set by the user is displayed in a setting value display part 2203. Rather than the number of revolutions of the heat dissipation fan being displayed, the operation state may be displayed in the maximum number of revolutions display part 2202 or the setting value display part 2203 in stages, in accordance with the heat dissipation fan control of the system camera 1000. For example, a display indicating high number of revolutions or low number of revolutions may be made, or only whether the heat dissipation fan is operating/not operating may be displayed, or both may be displayed. The setting value is input from the operation unit 1109, and the present embodiment assumes that the input is made through a touch panel operation. However, the operation is not limited to the touch panel being operated, and another device may be operated instead. Each heat dissipation fan rotates according to the setting value. Accordingly, the user can confirm operating noise produced by the heat dissipation fans rotating, the state of air being exhausted, and so on in situations where a plurality of heat dissipation modules have been connected.

In the heat dissipation fan rotation SIM mode, data of the operating noise in the set state can furthermore be recorded into the recording medium 1113 by operating a recording start button 2204. The operating noise data is only audio data, and is therefore stored separate from normal shot data. By storing the operating noise data separate from the shot data, the user can easily select the data file when checking the operating noise. Note that the rotation of each heat dissipation fan is stopped when a stop button 2205 is operated while the heat dissipation fan is rotating.

FIG. 23 is a flowchart illustrating processing in the heat dissipation fan rotation SIM mode.

In step S2252, the CPU 1112 acquires the connection position information and heat dissipation fan operation information of the heat dissipation module.

In step S2253, the CPU 1112 displays the maximum number of revolutions and setting value of each heat dissipation module.

In step S2254, the CPU 1112 accepts the input of the setting value for the fan number of revolutions of the heat dissipation module, and causes the heat dissipation fan to rotate on the basis of the input setting value in step S2255.

In step S2256, if the stop button has been operated, the process moves to step S2257, where the CPU 1112 stops the operation of the heat dissipation fan in each heat dissipation module; the process then returns to step S2252. If the stop button has not been operated in step S2256, the process moves to step S2258, where the CPU 1112 determines whether the recording start button 2204 has been operated. In step S2258, if the recording start button 2204 has been operated, the process moves to step S2259, where the CPU 1112 acquires/stores recording data; the process then returns to step S2252.

If the recording start button 2204 has not been operated in step S2258, the process moves to step S2260, where the CPU 1112 determines whether or not the heat dissipation fan rotation SIM mode is currently active; if the mode is active, the process returns to step S2352, whereas if the mode is not active, the process ends.

Figure 24:
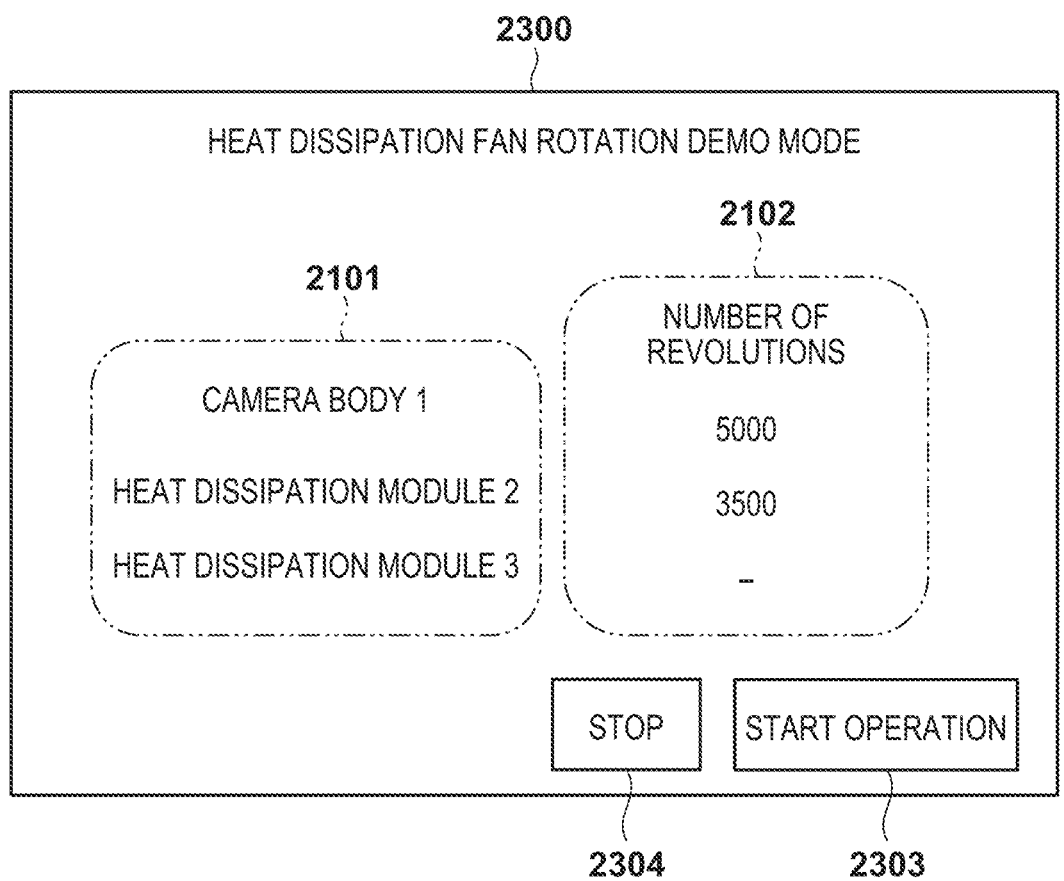
FIG. 24 is a diagram illustrating an example of a GUI of the system camera in a heat dissipation fan rotation demo mode according to the second embodiment.

Another embodiment will be described next. FIG. 24 illustrates an example of a screen 2300 during a heat dissipation fan rotation demo mode, in a state where the mode is currently active. The heat dissipation fan rotation demo mode is a mode in which the heat dissipation fan of each heat dissipation module starts operating automatically, from the side closest to the camera body 1010, with all the heat dissipation fans ultimately operating. The heat dissipation fan rotation demo mode makes it possible for the user to confirm the operating noise, exhaust state, and so on of each heat dissipation module.

The heat dissipation modules attached to the system camera 1000 are displayed in order, from the camera body 1010, in the module display area 2101 of the heat dissipation fan rotation demo mode screen 2300. The current number of revolutions of the heat dissipation fan in each module is displayed in the number of revolutions display part 2102.

In the heat dissipation fan rotation demo mode, the demo mode is activated in response to the user operating an operation start button 2303. When the operation start button 2303 is operated, the heat dissipation modules begin operating according to the display order, with all of the heat dissipation fans ultimately rotating. All of the heat dissipation fans stop in response to a stop button 2304 being operated. The operation may be stopped automatically after a set amount of time has passed. With respect to the number of revolutions of each heat dissipation fan, the number of revolutions may be increased in stages, several stages at a time, or only the maximum number of revolutions may be used, in accordance with the method for controlling the heat dissipation fans in the system camera 1000.

FIG. 25 is a flowchart illustrating processing in the heat dissipation fan rotation demo mode.

In steps S2352 and S2353, the CPU 1112 acquires the connection position information of each heat dissipation module, and displays the current number of revolutions of each heat dissipation module.

When, in step S2354, the operation start button 2303 is operated, the CPU 1112 starts the operation of the camera body 1010 in steps S2355 and S2356.

In step S2357, if the stop button is not operated, the process moves to step S2358, where the CPU 1112 determines whether or not the number of revolutions of the camera body 1010 is the maximum number of revolutions. If the number of revolutions is not the maximum number of revolutions, the process returns to step S2357; if, however, the number of revolutions is the maximum number of revolutions, the process moves to step S2359, where it is determined whether or not all the heat dissipation fans are operating. If not all of the heat dissipation fans are operating, the process moves to step S2356, where the CPU 1112 starts the operation of the next heat dissipation fan. However, if all of the heat dissipation fans are operating, the process moves to step S2360, where the CPU 1112 causes the heat dissipation fans to rotate for a set amount of time.

In step S2362, the CPU 1112 determines whether or not the fan rotation demo mode is currently active; if the mode is active, the process returns to step S2353, whereas if the mode is not active, the process ends.

Meanwhile, if the stop button has been operated in step S2357, the process moves to step S2361, where the CPU 1112 stops the operation of all the heat dissipation fans. Although the present embodiment describes starting the operation of the heat dissipation fans in order, many different variations are conceivable, such as stopping the rotation of the other heat dissipation fans when one of the heat dissipation fans is operating and then operating all of the heat dissipation fans simultaneously at the end. Additionally, a user operation may be used as a trigger for switching from the operation of one heat dissipation fan to the operation of the next heat dissipation fan. This makes it possible to operate the heat dissipation fans at the timings desired by the user.

As described thus far, according to the system camera 1000, control for optimizing heat dissipation can be carried out, information pertaining to the heat dissipation state can be displayed, and operations can be confirmed, by using the heat dissipation performance information, connection position information, and so on of the camera body, the modules, and the like.

Although the present embodiment describes an example in which the camera body 1010 acquires/calculates necessary information and then controls various types of operations and the display, the configuration is not limited thereto, and another module connected to the camera body 1010 may acquire/calculate the information and carry out the various types of control. Additionally, the configuration may be such that the information acquisition/calculation, operation control, display control, and so on are processed in a distributed manner, by the camera body and respective modules separately, or in combinations.

Second Embodiment

A second embodiment will be described next.

The second embodiment will describe a configuration and control of the system camera 1000 for preventing a drop in heat dissipation performance.

Preventing Intake of Heated Exhaust Air

In the system camera 1000, the inlets and outlets of the modules may be positioned close to each other depending on the combinations of the modules connected to each other. In such a case, there is a risk that the heat dissipation performance of the system camera 1000 will drop as a result of hot exhaust emitted from the outlet of one module being taken into the inlet of another module.

Accordingly, the present embodiment will describe a configuration and control of the system camera 1000 for preventing this type of drop in heat dissipation performance.

Figure 27:
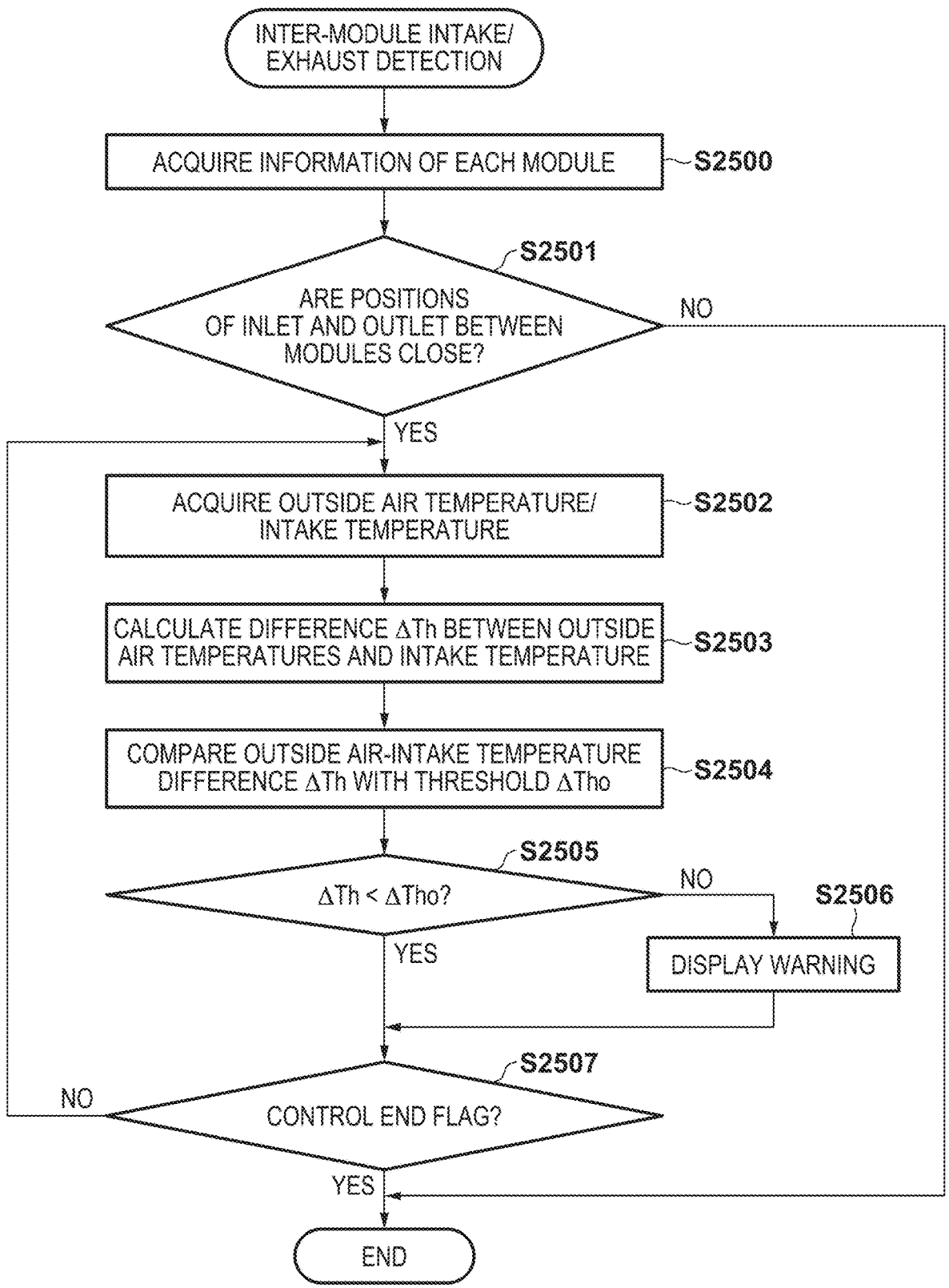
FIG. 27 is a flowchart illustrating an inter-module intake/exhaust detection process for the system camera according to the second embodiment.

The following descriptions assume the configuration of the system camera 1000 illustrated in FIG. 6 (with the exception of the media module 1150). Note that the processing illustrated in FIGS. 27 and 28 is realized by the CPU 1112 of the camera body 1010 executing programs stored in the memory 1102.

Figure 26:
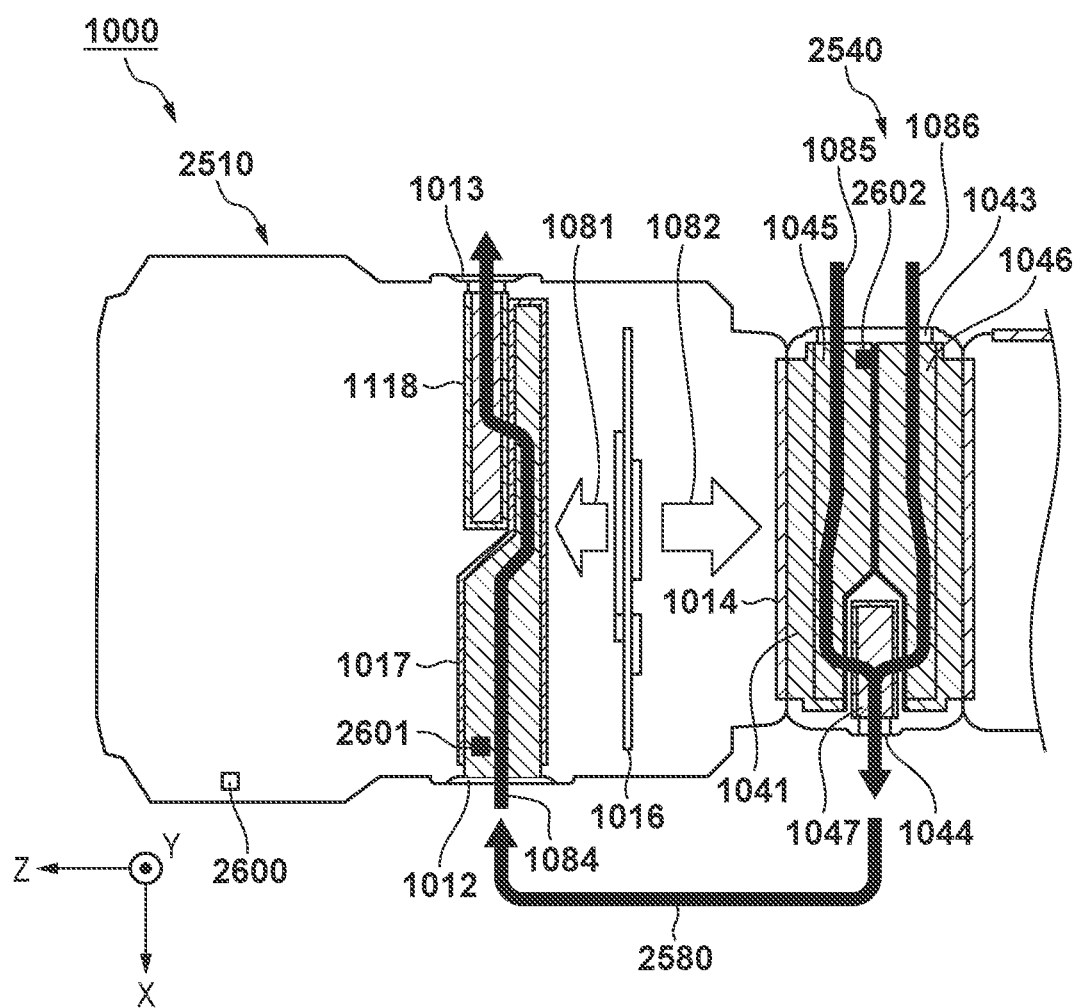
FIG. 26 is an overall cross-sectional view of the system camera according to the second embodiment.

FIG. 26 is an overall cross-sectional view of the system camera 1000 according to the second embodiment, corresponding to FIG. 5. FIG. 26 illustrates a cross-section obtained by sectioning the system camera 1000 along a horizontal plane passing through the shooting optical axis, as seen from the +Y direction, and omits the lens unit 1020 and a module connected to the rear surface of a heat dissipation module 2540. Note that components that are the same as those in the first embodiment will be given identical reference numerals, and descriptions thereof will be omitted.

The difference from the first embodiment is that a camera body 2510 is provided with an outside air temperature detection unit 2600 and a first intake temperature detection unit 2601, and the heat dissipation module 2540 is provided with a second intake temperature detection unit 2602. The outside air temperature detection unit 2600 is arranged in the camera body 2510 in a position sufficiently distanced from heat sources, such as ICs arranged in the signal processing circuit 1016. The outside air temperature detection unit 2600 thus is not affected by heat sources in the camera body 2510, and can therefore detect the temperature of the outside air. The first intake temperature detection unit 2601 and the second intake temperature detection unit 2602 are arranged near the inlets of the camera body 2510 and the heat dissipation module 2540, respectively, and can therefore detect the respective intake temperatures thereof. Note that the outside air temperature detection unit 2600 need not be provided in the camera body 2510, and may instead be provided in another module constituting the system camera 1000, such as the heat dissipation module 2540 or the recorder module 1030.

An example in which the heat dissipation performance of the system camera 1000 drops as a result of hot exhaust emitted from the outlet of one module being taken into the inlet of another module will be described with reference to FIG. 26.

In the heat dissipation module 2540, air taken in from the inlet 1043 and heated in the duct 1045 and the duct 1046 is exhausted from the outlet 1044 (the airflow 1085 and the airflow 1086). Meanwhile, the rotation of the heat dissipation fan 1118 produces negative pressure near the inlet 1012 of the camera body 2510. Accordingly, there is a risk that some of the hot exhaust from the outlet 1044 will be taken into the duct 1017 of the camera body 2510 from the inlet 1012 (an airflow 2580 and the airflow 1084). In such a case, the heat dissipation performance of the camera body 2510 will drop compared to a situation where the intake temperature and the outside air temperature are the same. Likewise, the heat dissipation performance of the heat dissipation module 2540 will drop when the heat dissipation module 2540 takes in exhaust from the camera body 2510.

Accordingly, in the present embodiment, hot exhaust exhausted from one of the modules being taken into another of the modules is detected.

FIG. 27 is a flowchart illustrating a process for detecting hot exhaust exhausted from one of the modules being taken into another of the modules.

In step S2500, the CPU 1112 acquires information of each connected module in the system camera 1000. The information of each module contains position information of the inlets and outlets provided in each module.

In step S2501, the CPU 1112 determines whether or not there is a combination in which the positions of an outlet and an inlet in two different modules are closer than a predetermined range, on the basis of the position information acquired in step S2500. If the result of the determination is that the positions of an outlet and an inlet in two different modules are not closer than the threshold, it is determined that there is no risk of the modules constituting the system camera 1000 taking in hot exhaust from another module, and the process is ended. However, if the positions of an outlet and an inlet in two different modules are closer than the threshold, the process moves to step S2502.

In step S2502, the CPU 1112 acquires the outside air temperature, as well as the intake temperatures of the modules for which the positions of the outlet and the inlet are close. For example, with the system camera 1000 illustrated in FIG. 26, the outside air temperature is detected by the outside air temperature detection unit 2600, and the intake temperatures of the camera body 2510 and the heat dissipation module 2540 are acquired by the first and second intake temperature detection units 2601 and 2602, respectively.

In step S2503, the CPU 1112 calculates a temperature difference ΔTh between the intake temperatures of the modules and the outside air temperature acquired in step S2502 (an outside air–intake temperature difference).

In step S2504, the CPU 1112 compares the outside air–intake temperature difference ΔTh with a threshold ΔTho stored in the memory 1102 in advance. If the comparison indicates that the outside air–intake temperature difference ΔTh is lower than the threshold ΔTho, it is determined that the corresponding module will not take in hot exhaust, and the process moves to step S2507. However, if the outside air–intake temperature difference ΔTh is greater than or equal to the threshold ΔTho, the process moves to step S2506, where the CPU 1112 displays a warning in the display unit 1015. The warning is, for example, a prompt to change the connection positions of the modules, a prompt to change the exhaust direction, a prompt to move the inlet or outlet away from an obstruction, or the like. By operating the system camera 1000 in accordance with the instructions in the warning, the user can prevent the heat dissipation performance of the system camera 1000 from dropping.

In step S2507, the CPU 1112 determines whether or not a control end flag is set; if the control end flag is not set, the process returns to step S2502, whereas if the control end flag is set, the process ends. The control end flag is set, for example, when the system camera 1000 is no longer being used and the power has been turned off, when the modules have been rearranged, and so on.

Although the present embodiment describes processing where a drop in the heat dissipation performance is prevented by displaying a warning in the display unit 1015 after detecting the intake of hot exhaust, a drop in the heat dissipation performance can also be prevented by controlling the heat dissipation fans as indicated in FIG. 28.

FIG. 28 is a flowchart illustrating a process for changing the control of the heat dissipation fans when it is detected that hot exhaust exhausted from one of the modules is being taken into another of the modules. The only difference from FIG. 27 is the process of step S2606, and thus processes that are the same as those in FIG. 27 will be given the same step numbers, and descriptions thereof will be omitted.

In the present embodiment, if the outside air–intake temperature difference ΔTh is greater than or equal to the threshold ΔTho in step S2505, the process moves to step S2606, where the method for controlling the fan of the corresponding module is changed. "Changing the method for controlling the fan" means, for example, increasing the number of revolutions of the fan, changing the rotation direction of the fan, or the like. With the former change, the exhaust flow rate and flow speed is increased to forcefully push the hot exhaust far away, which prevents the hot exhaust from being taken into another module. On the other hand, with the latter, the same effect can be achieved by changing the exhaust direction. As a result, the stated drop in the heat dissipation performance can be prevented regardless of which method is used.

Although the present embodiment describes an example in which the camera body 1010 acquires/calculates necessary information and then controls various types of operations and the display, the configuration may be such that another module connected to the camera body 1010 acquires/calculates the information and carries out the various types of control in the same manner as in the first embodiment. Also, as in the first embodiment, a configuration is also possible in which the information acquisition/calculation, operation control, display control, and so on are processed in a distributed manner, by the camera body and respective modules separately, or in combinations.

Third Embodiment

A third embodiment will be described next.

The third embodiment will describe a method for achieving the desired heat dissipation performance with the heat dissipation module consuming the least amount of power, regardless of the connected modules.

Control of Heat Dissipation Module Having Multiple Heat Dissipation Devices

Heat sources such as ICs arranged on the circuit boards of an image capture apparatus do not produce uniform amounts of heat, resulting in a temperature distribution across the boards. To effectively dissipate heat from particularly hot heat sources on a circuit board, heat dissipation devices are provided for the main heat sources, and by supplying outputs corresponding to the amounts of heat produced by those heat sources to the heat dissipation devices, the heat from the heat sources can be sufficiently dissipated without supplying greater outputs than necessary to the heat dissipation devices.

On the other hand, when various modules are connected to a heat dissipation module, as in the system camera 1000, the positions of and amounts of heat produced by the heat sources will vary. Thus to achieve sufficient heat dissipation performance for the connected modules, it is necessary to supply outputs which are based on the heat source producing the highest amount of heat to the heat dissipation devices included in the heat dissipation module. As such, the heat dissipation module will have an excessive heat dissipation performance, depending on the connected module, and will therefore consume an unnecessarily high amount of power. Furthermore, in heat dissipation modules using heat dissipation fans, increasing the output, i.e., increasing the number of revolutions, causes a corresponding increase in the noise level.

Accordingly, in the present embodiment, control is carried out for achieving the desired heat dissipation performance with the heat dissipation module consuming the least amount of power, regardless of the modules connected to the camera body 1010.

Figure 29:
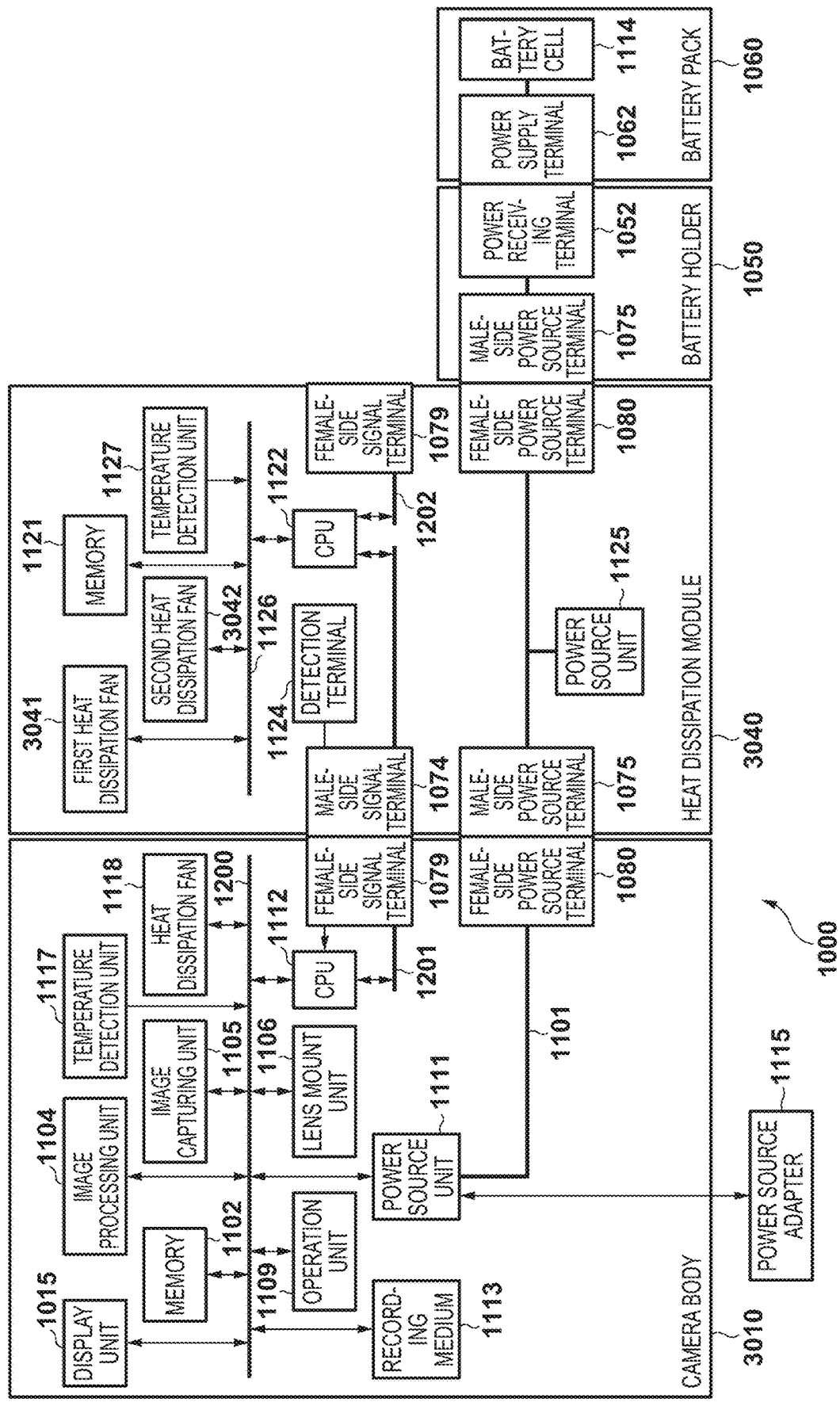
FIG. 29 is a block diagram illustrating the electrical configuration of a system camera according to a third embodiment.
Figure 30A:
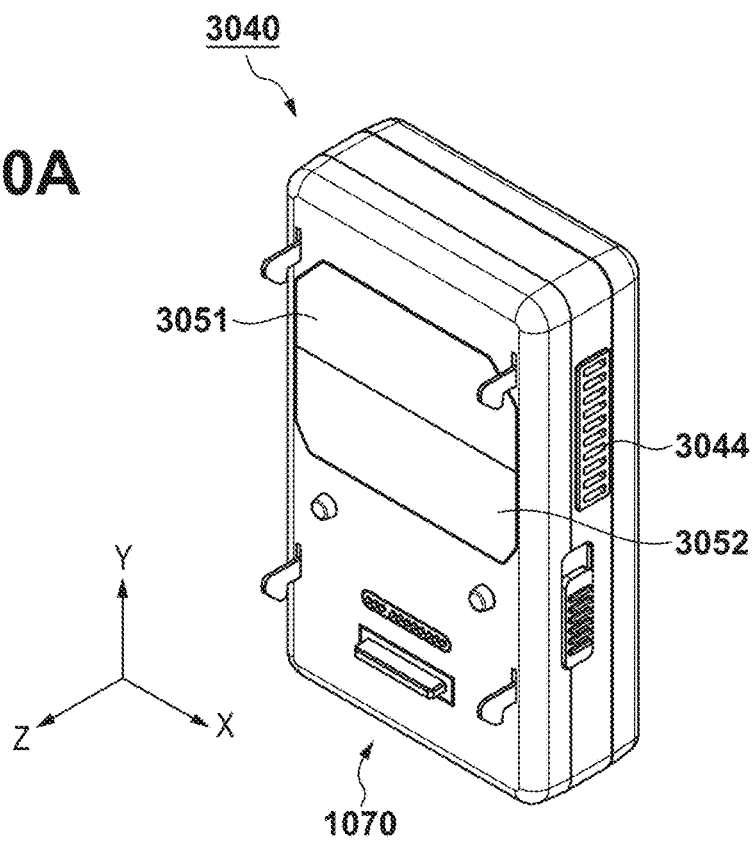
FIG. 30A is a perspective view illustrating a heat dissipation module according to the third embodiment, seen from the front.
Figure 30B:
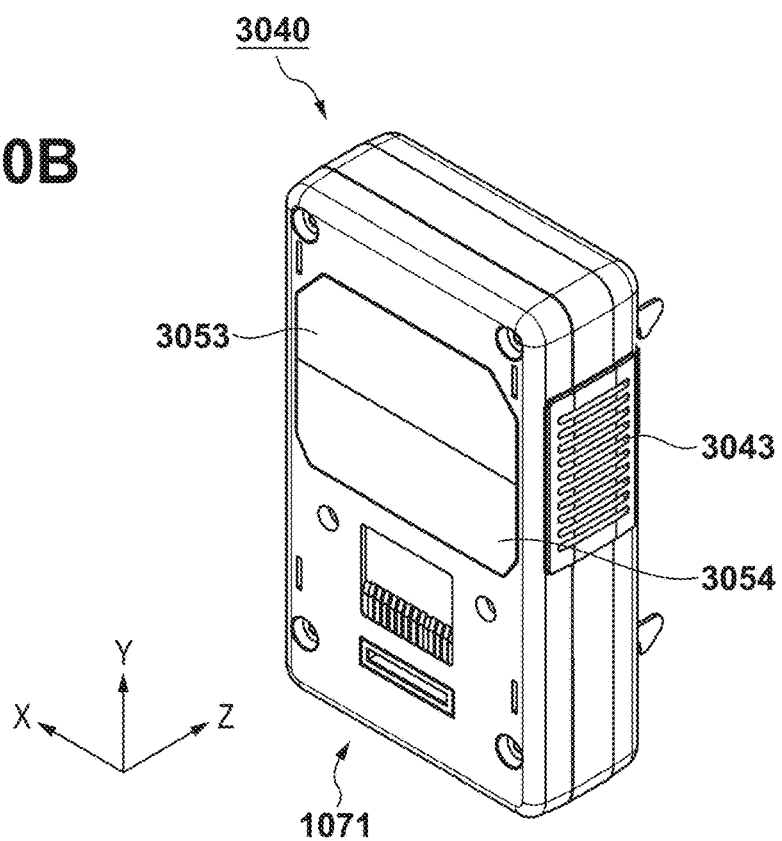
FIG. 30B is a perspective view illustrating a heat dissipation module according to the third embodiment, seen from the rear.

FIG. 29 is a block diagram illustrating the electrical configuration of the system camera 1000 according to the present embodiment. FIGS. 30A and 30B are perspective views of a heat dissipation module 3040 according to the third embodiment, seen from the front and rear, respectively. In the following, components that are the same as those in the first embodiment will be given identical reference numerals, and descriptions thereof will be omitted.

Figure 31:
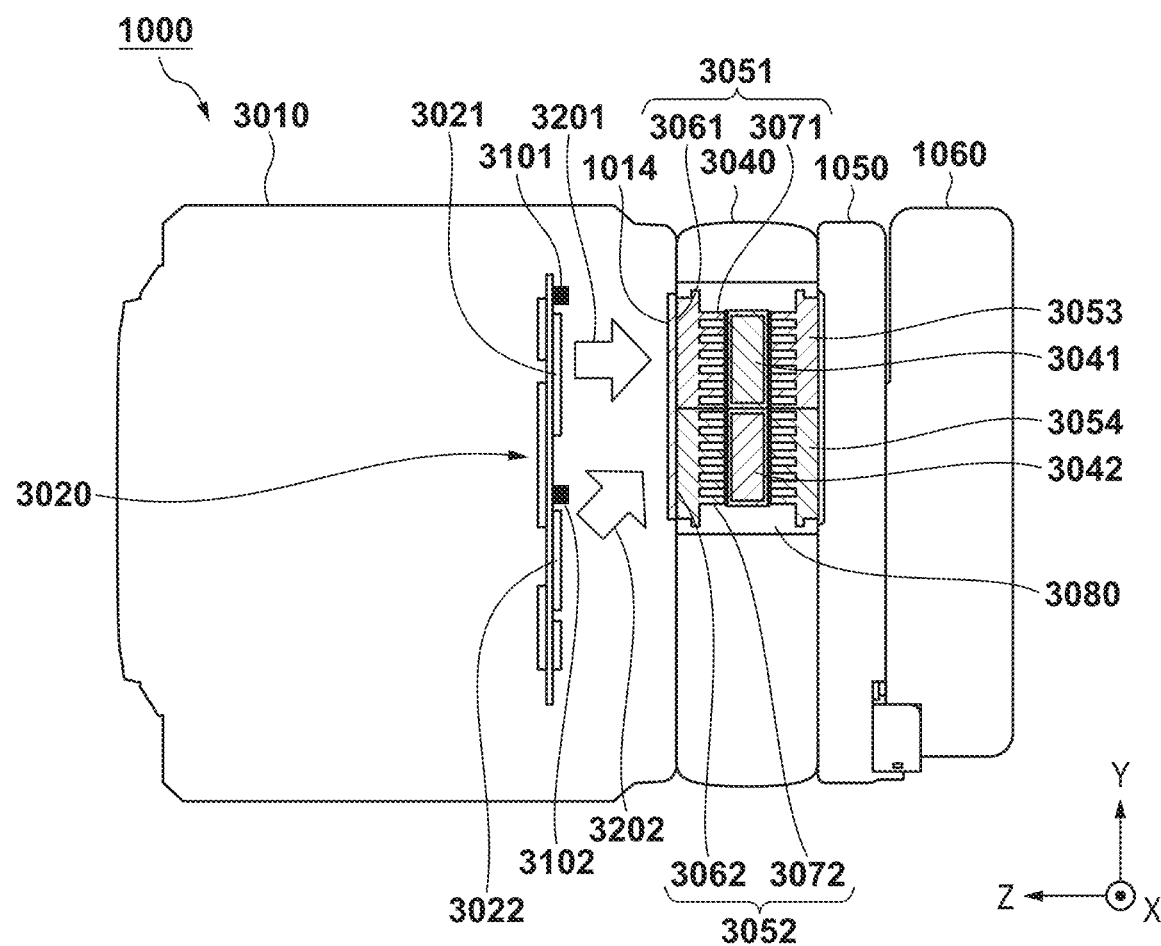
FIG. 31 is an overall cross-sectional view of the system camera according to the third embodiment.

In FIGS. 30A and 30B, the heat dissipation module 3040 includes the male interface 1070 and the female interface 1071 on its front and rear surfaces, respectively. Thus like the heat dissipation module 1040 of the first embodiment, other modules can be connected to the front and rear surfaces. Furthermore, as illustrated in FIG. 30A, a front surface first heat receiving portion 3051 and a front surface second heat receiving portion 3052, which are divided in the Y direction (vertically), are provided on the front surface of the heat dissipation module 3040. The first and second heat receiving portions 3051 and 3052 have a first heat receiving surface 3061 and a second heat receiving surface 3062 on the outer sides, as indicated in FIG. 31, and heat sinks 3071 and 3072 which can diffuse heat are provided within a duct 3080 of the heat dissipation module 3040. Likewise, as illustrated in FIG. 30B, a rear surface first heat receiving portion 3053 and a rear surface second heat receiving portion 3054, which are divided in the Y direction (vertically), are provided on the rear surface of the heat dissipation module 3040. The configurations of the rear surface heat receiving portions are the same as those of the front surface heat receiving portions. Note that the duct 3080 forms a channel within the heat dissipation module 3040 that connects an inlet 3043 with an outlet 3044.

FIG. 31 is an overall cross-sectional view of the system camera 1000 in which the heat dissipation module 3040 according to the present embodiment is connected. FIG. 31 illustrates a cross-section obtained by sectioning the system camera 1000 along a vertical plane passing through the shooting optical axis, as seen from the −Y direction (the right side).

A camera body 3010 is connected to the front surface of the heat dissipation module 3040, and the battery holder 1050 and battery pack 1060 are connected to the rear surface of the heat dissipation module 3040.

A first heat source 3021 and a second heat source 3022, which are the main heat sources (heat generation portions), are arranged on a control board 3020 of the camera body 3010. Furthermore, the camera body 3010 is provided with a first temperature detection unit 3101 and a second temperature detection unit 3102, which can detect temperatures corresponding to the first heat source 3021 and the second heat source 3022, respectively. A first heat dissipation fan 3041 and a second heat dissipation fan 3042 are provided in positions corresponding to the heat sinks 3071 and 3072 within the duct 3080 of the heat dissipation module 3040.

A heat dissipation path in the front surface of the heat dissipation module 3040 will be described next using FIG. 31. Note that aside from the heat receiving portions being the rear surface first heat receiving portion 3053 and the rear surface second heat receiving portion 3054, the rear surface is the same as the front surface, and thus will not be described.

Heat generated by the first heat source 3021 and the second heat source 3022 is transmitted to the heat transfer portion 1014 through a first heat dissipation path 3201 and a second heat dissipation path 3202. As a result, the heat transferred from the paths 3201 and 3202 is transferred to the first heat receiving surface 3061 and the second heat receiving surface 3062, which have the front surface first heat receiving portion 3051 and the front surface second heat receiving portion 3052, and is diffused to the duct 3080 through the heat sinks 3071 and 3072. The operation of the first heat dissipation fan 3041 and the second heat dissipation fan 3042 takes air into the duct 3080, and the flow of the air which has been taken in removes heat from the front surface first heat receiving portion 3051 and the front surface second heat receiving portion 3052. The air heated in the duct 3080 is then exhausted to the exterior from the outlet 3044. Of course, the heat dissipation performance of the heat receiving portions depends on the outputs (i.e., the number of revolutions) of the first heat dissipation fan 3041 and the second heat dissipation fan 3042 provided corresponding to those portions. As such, supplying an output to each heat dissipation fan in accordance with the positions of and amounts of heat produced by multiple heat sources makes it possible to dissipate the heat of the multiple heat sources without having the heat dissipation devices consume a greater amount of power than necessary. Although heat dissipation fans are used as heat dissipation devices here, the configuration is not limited thereto, and may instead use Peltier devices, a combination of Peltier devices and heat dissipation fans, or the like, for example. Furthermore, it is not necessary to provide separate heat sinks for each heat receiving portion, and a heat sink may be configured to span multiple heat receiving portions.

In the present embodiment, to achieve the desired heat dissipation performance with the heat dissipation modules consuming the minimum amount of power possible regardless of the modules which are connected, position and temperature information of the heat sources is acquired, and the multiple heat dissipation devices provided in the heat dissipation module are controlled independently on the basis of that information.

Figure 32:
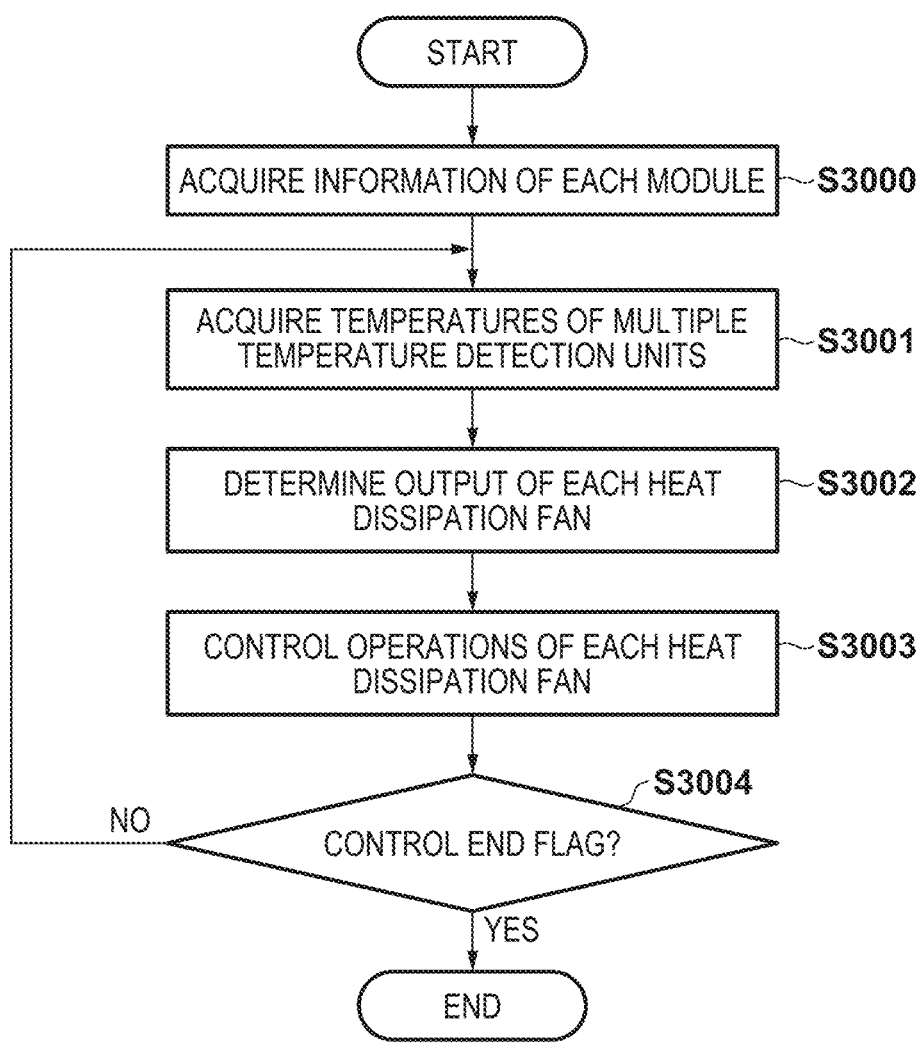
FIG. 32 is a flowchart illustrating the control of operations of the heat dissipation module according to the third embodiment.

A process through which the system camera 1000 according to the present embodiment controls the heat dissipation devices will be described next with reference to FIG. 32. Note that the processing illustrated in FIG. 32 is realized by the CPU 1112 of the camera body 1010 executing programs stored in the memory 1102.

In step S3000, the CPU 1112 acquires information of each module connected to the camera body 1010. The information of each module contains position information of the multiple heat dissipation fans 3041 and 3042 in the heat dissipation module 3040.

In step S3001, the CPU 1112 acquires temperatures detected by the multiple temperature detection units 3101 and 3102 in the camera body 3010.

In step S3002, the CPU 1112 determines the magnitude of the output for each heat dissipation device on the basis of the acquired positions of the heat dissipation fans and the temperatures detected by the temperature detection units in steps S3000 and S3001. The heat dissipation devices are heat dissipation fans, Peltier devices, or a configuration that combines the two. Additionally, the CPU need not be the CPU 1112 of the camera body 3010, and may instead be the CPU 1122 of the heat dissipation module 3040, for example. In the determination of the output of each heat dissipation device in step S3002, the output of the heat dissipation device that is closer to the temperature detection unit showing a higher temperature among the temperatures detected in step S3001 may be set comparatively higher, for example. Alternatively, a configuration in which the module for which heat is to be dissipated holds proper operation temperature information for the heat source corresponding to each temperature detection unit may be used, and the CPU may determine the output of each heat dissipation device individually so as to be closer to the proper operation temperature.

In step S3003, the CPU 1112 controls the output of each heat dissipation device to match the output determined in step S3002.

In step S3004, the CPU 1112 determines whether or not a control end flag is set; if the control end flag is not set, the process returns to step S3001, whereas if the control end flag is set, the process ends. The control end flag is set when the system camera 1000 is no longer being used and the power has been turned off, when the modules have been rearranged, and so on.

Note that in FIGS. 30A and 30B, the number of temperature detection units and heat dissipation devices is not limited to two, and more than two may be provided instead. Furthermore, the configuration may be such that temperature detection units are provided not only for the front surface modules, but also for the rear surface modules.

Fourth Embodiment

A fourth embodiment will be described next.

Like the third embodiment, the fourth embodiment will describe a method for achieving the desired heat dissipation performance with the heat dissipation module consuming the least amount of power, regardless of the connected modules.

Flow Amount Adjustment by Flow Amount Control Unit

Figure 33:
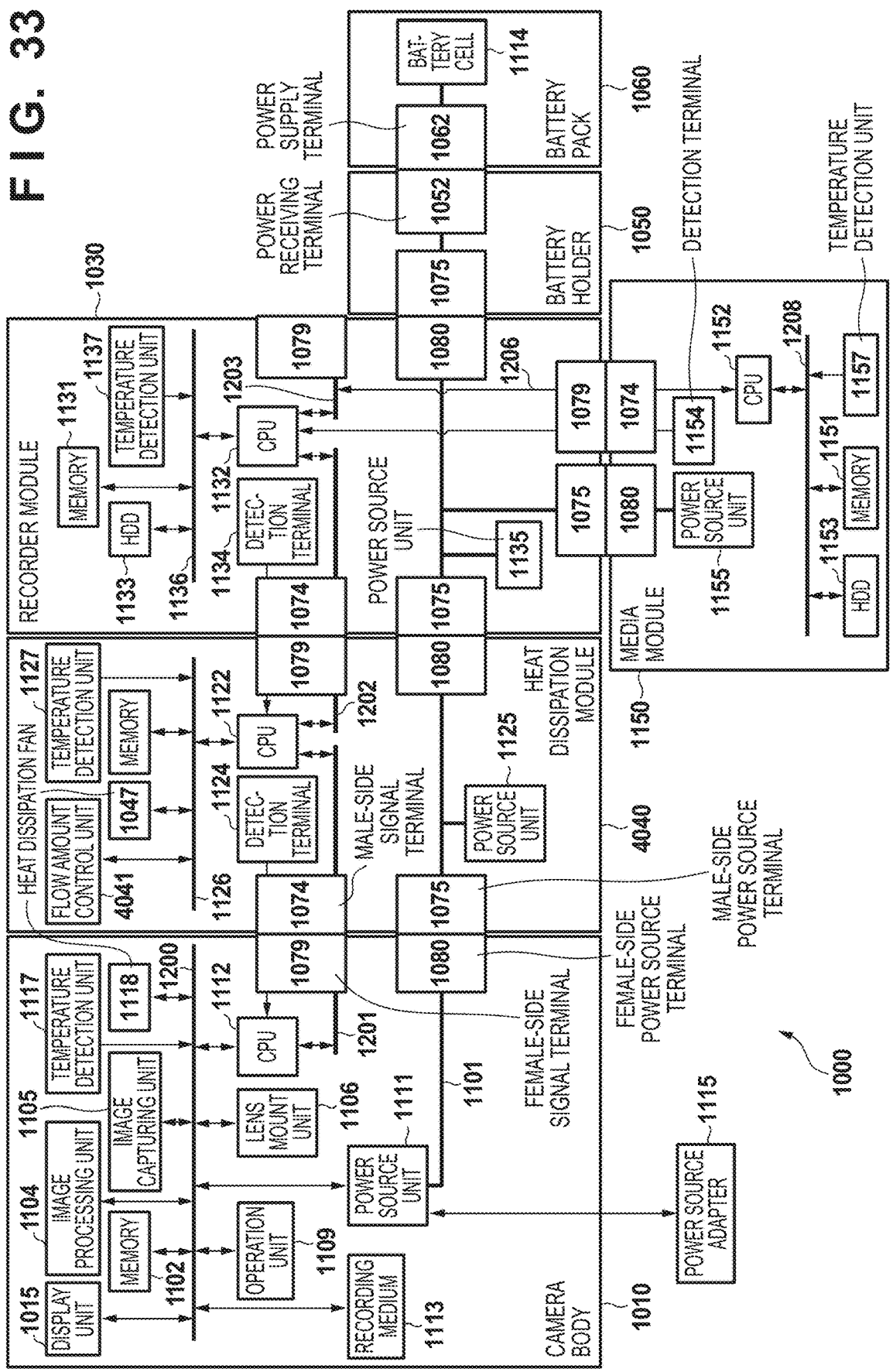
FIG. 33 is a block diagram illustrating the electrical configuration of a system camera according to a fourth embodiment.
Figure 34:
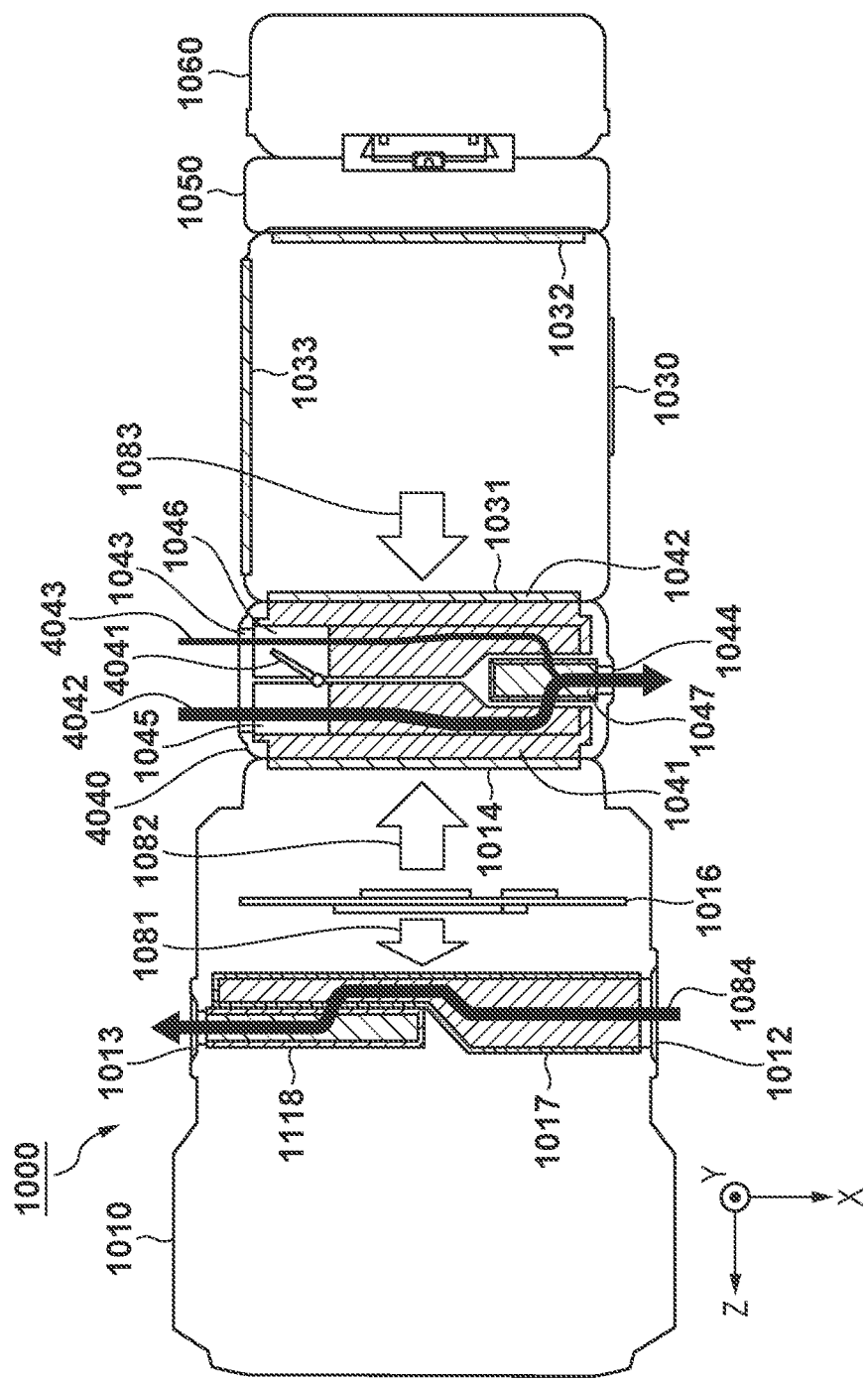
FIG. 34 is an overall cross-sectional view of the system camera according to the fourth embodiment.

FIG. 33 illustrates an example of a block diagram of the system camera 1000 according to the present embodiment. FIG. 34 is an overall cross-sectional view of the system camera 1000 according to the present embodiment, seen from above. Components that are the same as those in the first embodiment will be given identical reference numerals, and descriptions thereof will be omitted.

A heat dissipation module 4040 according to the present embodiment includes a flow amount control unit 4041 that can adjust a flow amount ratio between internal airflows 4042 and 4043. The present embodiment assumes that the flow amount control unit 4041 has a function for adjusting the flow amount ratio between the airflows 4042 and 4043 by changing the angle of a louver member indicated in FIG. 34 to variably control the cross-sectional area of the paths of the airflow 4042 and the airflow 4043, but any equivalent flow amount adjustment function may be used. Additionally, it is desirable that the flow amount control unit 4041 be provided on the intake side of the heat dissipation module 4040 (near the inlet).

Figure 35:
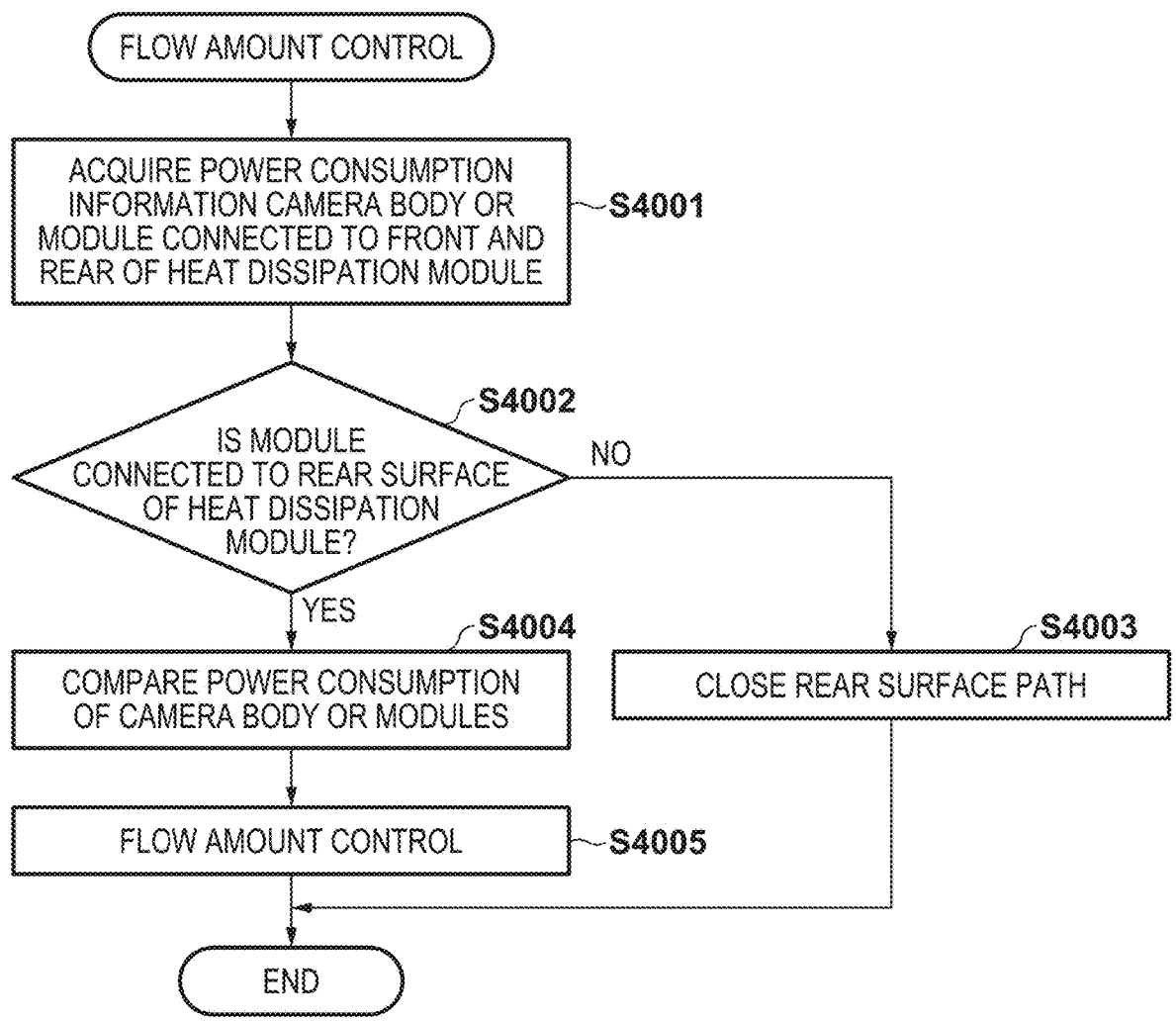
FIG. 35 is a flowchart illustrating a flow amount control process of a heat dissipation module according to the fourth embodiment.

FIG. 35 is a flowchart illustrating the flow amount control process of a heat dissipation module 4040 according to the present embodiment. Note that the processing illustrated in FIG. 35 is realized by the CPU 1122 of the heat dissipation module 4040 executing programs stored in the memory 1121.

In step S4001, the CPU 1122 acquires the power consumption information of the camera body 1010 or modules connected to the front and rear surfaces of the heat dissipation module 4040.

In step S4002, the CPU 1122 determines whether or not a module is connected to the rear surface of the heat dissipation module 4040. Note that if the power consumption information of the module on the rear surface is not acquired in step S4001, it may be determined that no module is connected to the rear surface. If a module is connected to the rear surface of the heat dissipation module 4040, the process moves to step S4004, whereas if a module is not connected, the process moves to step S4003.

In step S4003, the CPU 1122 controls the flow amount control unit 4041 to close the path so that air does not flow into the airflow 4043 on the rear surface of the heat dissipation module 4040, and then ends the process. As a result, if no module is attached to the rear surface of the heat dissipation module 4040, all of the outside air that is taken in can be conveyed to the airflow 4042 on the front surface side, which makes it possible to efficiently dissipate the heat from heat sources in the camera body 1010 or a module connected to the front surface.

In step S4004, the CPU 1122 compares the power consumption of the camera body 1010 or modules connected to the front and rear surfaces of the heat dissipation module 4040.

In step S4005, the CPU 1122 controls the flow amount control unit 4041 to achieve an optimal flow amount ratio between the airflows 4042 and 4043 on the front and rear surfaces, on the basis of the power consumptions compared in step S4004.

As described above, efficient heat dissipation can be achieved by controlling the flow amount ratio between the airflows 4042 and 4043 in the heat dissipation module 4040 in accordance with the combinations, power consumption, and so on of the camera body 1010 and various types of modules in the system camera 1000.

Although the present embodiment describes the CPU 1122 of the heat dissipation module 4040 controlling the flow amount control unit 4041 using the power consumption information of the camera body or modules on the front and rear surfaces of the heat dissipation module, this control may be carried out by the CPU 1112 of the camera body 1010 as well.

Fifth Embodiment

A fifth embodiment will be described next.

The fifth embodiment will describe a method for evaluating the heat dissipation capacity of the current system configuration of the system camera 1000, and limiting the operation modes of the camera body 1010 as necessary.

Figure 36:
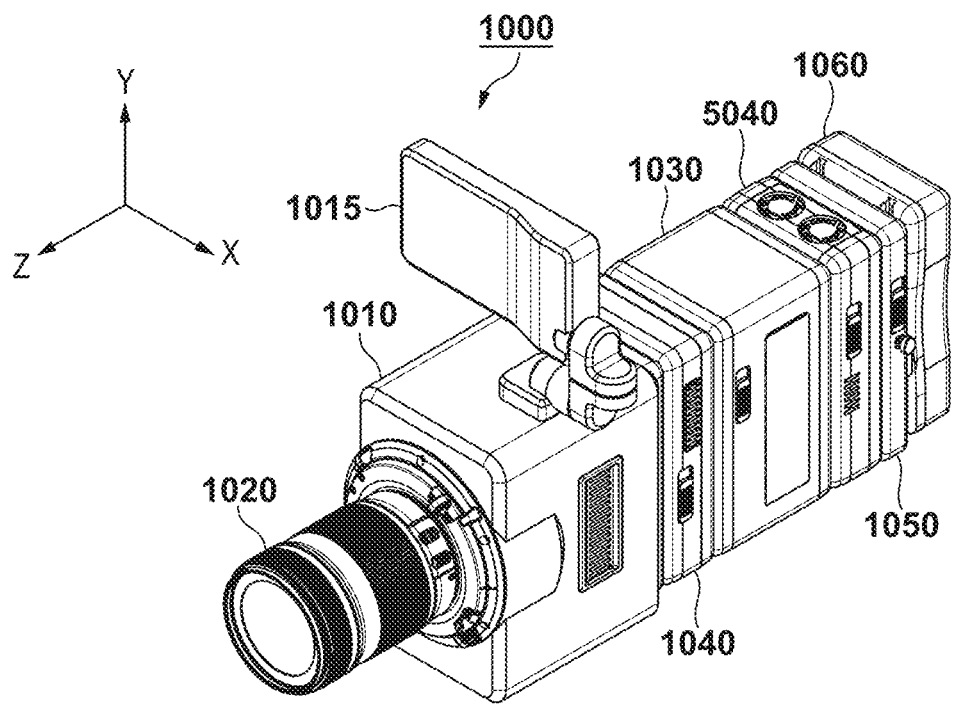
FIG. 36 is a perspective view of a system camera according to a fifth embodiment, seen from the front.
Figure 37:
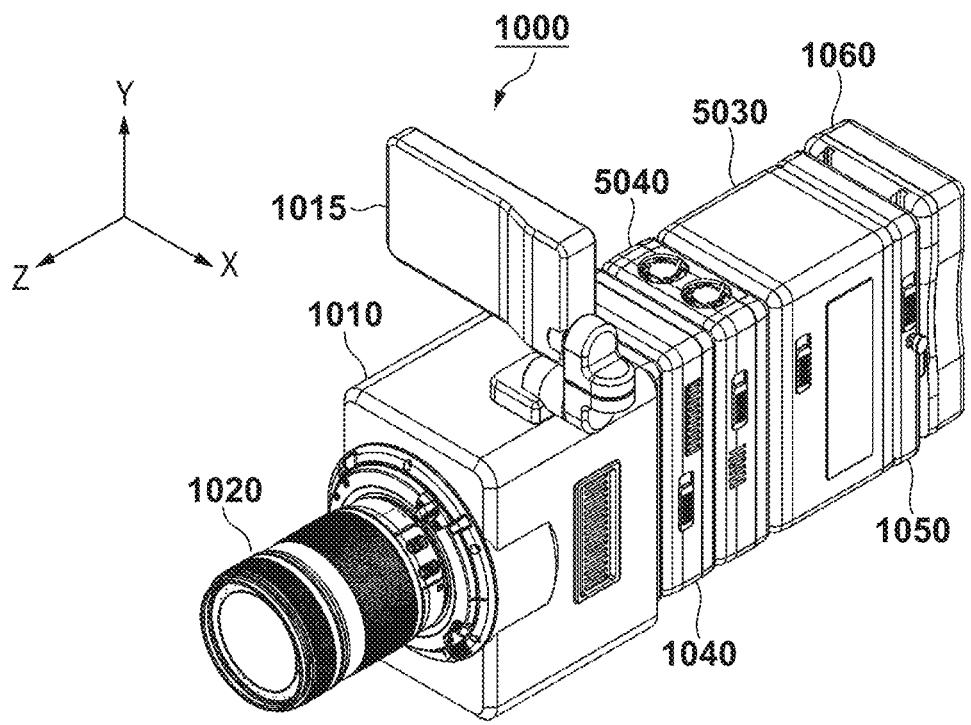
FIG. 37 is a perspective view of a system camera according to the fifth embodiment, seen from the front.

FIG. 36 is a perspective view of the system camera 1000, seen from the front, in a situation where a heat dissipation module 5040 has been added to the rear surface of the recorder module 1030 in the system camera 1000 illustrated in FIGS. 1A and 1B. FIG. 37 is a perspective view of the system camera 1000, seen from the front, in a situation where the heat dissipation module 5040 has been added to the front surface of the recorder module 1030 in the system camera 1000 illustrated in FIGS. 1A and 1B. Components that are the same as those in the first embodiment will be given identical reference numerals, and descriptions thereof will be omitted.

In the system camera 1000 illustrated in FIGS. 1A and 1B, it is conceivable that, depending on the use conditions, the heat dissipation capacity will be insufficient using the heat dissipation module 1040 alone, when an increased amount of power is consumed for shooting at high resolutions, high speeds, or the like.

Additionally, although the heat dissipation capacity can be increased by adding a separate heat dissipation module 5040 to the rear surface of the recorder module 1030 as illustrated in FIG. 36, if the heat dissipation module 5040 is connected to the front surface of the recorder module 1030 as illustrated in FIG. 37, it may not be possible to efficiently dissipate heat from the rear surface of the recorder module 1030, i.e., from the second heat transfer portion 1032. The same applies when the heat dissipation module 1040 is not connected.

Accordingly, in the present embodiment, the heat dissipation capacity of the current system configuration of the system camera 1000 is evaluated, and the operation modes of the camera body 1010 are limited as necessary.

Figure 38:
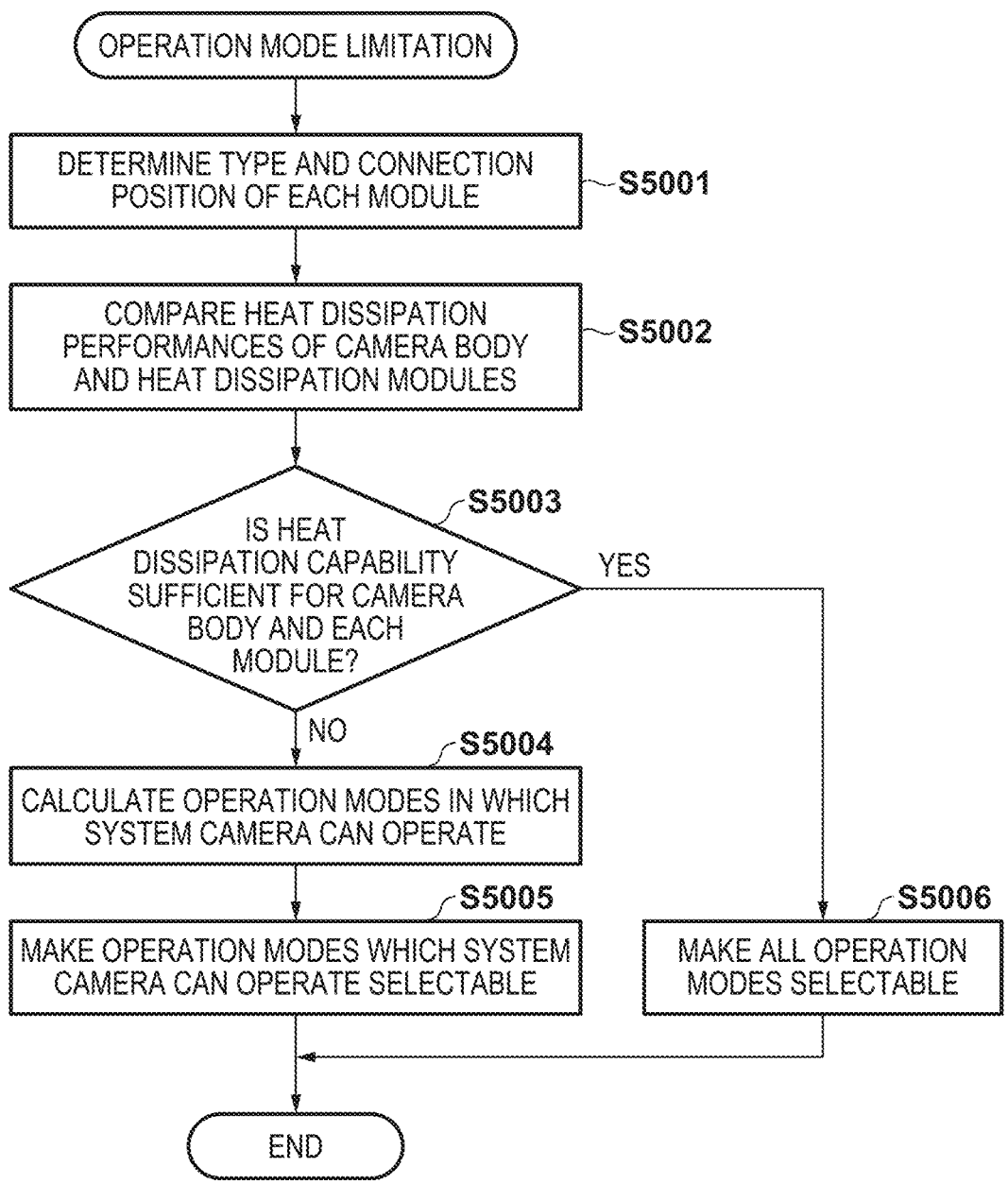
FIG. 38 is a flowchart illustrating processing for limiting an operation mode of the system camera according to the fifth embodiment.

FIG. 38 is a flowchart illustrating processing for limiting the operation modes of the camera body 1010 according to the fifth embodiment. Note that the processing illustrated in FIG. 38 is realized by the CPU 1112 of the camera body 1010 executing programs stored in the memory 1102.

In step S5001, the CPU 1112 acquires the types, number, and connection position information of each module connected to the camera body 1010.

In step S5002, the CPU 1112 compares the heat dissipation performances of the camera body 1010 and the heat dissipation modules.

In step S5003, the CPU 1112 determines whether or not the heat dissipation capacity is sufficient for the camera body 1010 and the modules on the basis of the heat dissipation performances obtained in step S5002; if the heat dissipation capacity is sufficient, the process moves to step S5006, and if the heat dissipation capacity is insufficient, the process moves to step S5004.

In step S5006, the CPU 1112 makes all operation modes selectable, and the process ends.

In steps S5004 and S5005, the CPU 1112 calculates the operation modes in which the system camera can operate, makes only the operation modes in which the system camera can operate, as calculated in step S5004, selectable, and then ends the process.

As described thus far, by limiting the operation modes of the camera body 1010 in accordance with the connection positions, types, number, and so on of heat dissipation modules, images can be acquired correctly without causing overheating, malfunctions, and so on.

The "operation modes" in the present embodiment include not only the basic recording rate, but also the recording destination, output, shooting time, and so on.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-038763, filed Mar. 4, 2019 which is hereby incorporated by reference herein in its entirety.

What is claimed is:

1. An image capture apparatus to which a module having a predetermined function can be attached, the image capture apparatus comprising:
a connecting unit configured to attach the module;
a communication unit configured to communicate with the module; and
a control unit,
wherein the module includes a heat dissipation module,
wherein the communication unit acquires information pertaining to a heat dissipation performance of the module, and
wherein the control unit displays, on a display unit, a shooting available time of a system including the image capture apparatus and the module, the shooting available time being obtained based on at least (i) the information pertaining to the heat dissipation performance of the module and (ii) position information of the module.

2. The apparatus according to claim 1, further comprising an interface configured to exchange power with the module.

3. The apparatus according to claim 1, wherein the communication unit includes an interface capable of transmitting image data having a resolution greater than or equal to 4K.

4. The apparatus according to claim 1, wherein the communication unit includes an interface capable of transmitting image data having a framerate greater than or equal to 60P.

5. The apparatus according to claim 1, wherein the heat dissipation module includes a heat dissipation unit that takes in and exhausts air.

6. The apparatus according to claim 1, wherein the control unit (a) obtains an operation target value of the heat dissipation module from temperature information of the module and the position information of the module, the position information pertaining to attachment of the module to the image capture apparatus, and (b) controls operation of the heat dissipation module.

7. The apparatus according to claim 1, wherein the heat dissipation module includes a plurality of heat dissipation units that take in and exhaust air, and
wherein the control unit controls the plurality of heat dissipation units on the basis of (a) a difference between an intake temperature and an outside air temperature for each heat dissipation unit, and (b) position information of inlets and outlets of the plurality of heat dissipation units.

8. The apparatus according to claim 1, wherein the heat dissipation module includes a plurality of heat dissipation units corresponding to a plurality of heat generation portions in the image capture apparatus,
wherein the image capture apparatus further includes a plurality of temperature detection units corresponding to the plurality of heat generation portions, and
wherein the control unit controls the plurality of heat dissipation units on the basis of (a) temperatures detected by the plurality of temperature detection units and (b) position information pertaining to an attachment position of the module.

9. The apparatus according to claim 1, wherein the heat dissipation module includes (a) a heat dissipation unit that takes in and exhausts air, and (b) a plurality of heat transfer units having different heat dissipation paths, and wherein the heat dissipation unit includes (a) a different flow path for each heat transfer unit, and (b) a flow amount adjustment unit configured to adjust a flow amount in the flow paths.

10. The apparatus according to claim 1, wherein the heat dissipation module includes a fan for which the number of revolutions can be set, and
wherein the image capture apparatus further includes a recording unit configured to cause the fan to rotate at the set number of revolutions and to record operating noise of the fan.

11. The apparatus according to claim 1, wherein the display unit is configured to display the information pertaining to the heat dissipation performance of the module.

12. The apparatus according to claim 11, wherein the control unit generates information to be displayed on the display unit on the basis of the information pertaining to the heat dissipation performance of the module.

13. The apparatus according to claim 11, wherein a second module can be attached to the heat dissipation module, and
wherein the control unit (a) determines the appropriateness of the position where the heat dissipation module is attached on the basis of (i) the heat dissipation capacity of the heat dissipation module and (ii) temperature information and position information of the image capture apparatus and/or the second module, and (b) displays a result of the determination on the display unit.

14. The apparatus according to claim 1, further comprising an image capture unit,
wherein the shooting available time is obtained on the further basis of an operation mode of the image capture unit.

15. The apparatus according to claim 11, wherein the control unit displays a temperature difference between heat transfer units of adjacent modules.

16. The apparatus according to claim 11, wherein the heat dissipation module includes a plurality of heat dissipation units that take in and exhaust air, and
wherein the control unit (a) acquires (i) a difference between an intake temperature and an outside air temperature for each heat dissipation unit, and (ii) position information of inlets and outlets of the plurality of heat dissipation units, and (b) displays the positions of the inlets and outlets of the plurality of heat dissipation units.

17. The apparatus according to claim 11, wherein the heat dissipation module includes a fan, and
wherein the control unit displays, on the display unit, (a) positions of an inlet and an outlet of the fan in each heat dissipation module, and (b) the number of revolutions of each fan.

18. An image capture apparatus to which a module having a predetermined function can be attached, the image capture apparatus comprising:
a connecting unit configured to attach the module;
a communication unit configured to communicate with the module; and
a control unit,
wherein the communication unit acquires information pertaining to a heat dissipation performance of the module, and
wherein the control unit (a) obtains heat dissipation capacity of a system including the image capture apparatus and the module, on the basis of at least (i) the information pertaining to the heat dissipation performance of the module and (ii) position information of the module, and (b) limits operation of the image capture apparatus in accordance with the heat dissipation capacity.

19. A method of controlling an image capture apparatus, the image capture apparatus including (a) a connecting unit to which a module having a predetermined function can be attached, and (b) a communication unit configured to communicate with the module, wherein the module includes a heat dissipation performance of the module, the method comprising:

acquiring information pertaining to the heat dissipation module; and displaying, on a display unit, a shooting available time of a system including the image capture apparatus and the module, the shooting available time being obtained based on at least (i) the information pertaining to the heat dissipation performance of the module and (ii) position information of the module.

20. A non-transitory computer-readable storage medium storing a program that causes a computer to execute a method of controlling an image capture apparatus, the image capture apparatus including (a) a connecting unit to which a module having a predetermined function can be attached, and (b) a communication unit configured to communicate with the module, the method comprising:

acquiring information pertaining to the heat dissipation performance of the module; and displaying, on a display unit, a shooting available time of a system including the image capture apparatus and the module, the shooting available time being obtained based on at least (i) the information pertaining to the heat dissipation performance of the module and (ii) position information of the module.

21. The apparatus according to claim 18, wherein the position information of the module pertains to an attachment position, in the system including the image capture apparatus and the module, of the module.

22. A method of controlling an image capture apparatus, the image capture apparatus comprising (a) a connecting unit to which a module having a predetermined function can be attached, and (b) a communication unit configured to communicate with the module, the method comprising:

acquiring information pertaining to a heat dissipation performance of the module;

obtaining heat dissipation capacity of a system including the image capture apparatus and the module, on the basis of at least (i) the information pertaining to the heat dissipation performance of the module and (ii) position information of the module; and limiting operation of the image capture apparatus in accordance with the heat dissipation capacity.

23. A non-transitory computer-readable storage medium storing a program that causes a computer to execute a method of controlling an image capture apparatus, the image capture apparatus comprising (a) a connecting unit to which a module having a predetermined function can be attached, and (b) a communication unit configured to communicate with the module, the method comprising:

acquiring information pertaining to a heat dissipation performance of the module;

obtaining heat dissipation capacity of a system including the image capture apparatus and the module, on the basis of at least (i) the information pertaining to the heat dissipation performance of the module and (ii) position information of the module; and limiting operation of the image capture apparatus in accordance with the heat dissipation capacity.

* * * * *